(12) United States Patent
Matsushima et al.

(10) Patent No.: US 11,930,654 B2
(45) Date of Patent: Mar. 12, 2024

(54) ORGANIC LIGHT-EMITTING ELEMENT

(71) Applicant: KYULUX, INC., Fukuoka (JP)

(72) Inventors: Toshinori Matsushima, Fukuoka (JP); Chihaya Adachi, Fukuoka (JP); Chuanjiang Qin, Fukuoka (JP); Sangarange Don Atula Sandanayaka, Fukuoka (JP); Fatima Bencheikh, Fukuoka (JP); Takeshi Komino, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 0 days.

(21) Appl. No.: 18/177,516

(22) Filed: Mar. 2, 2023

(65) Prior Publication Data
US 2023/0225147 A1 Jul. 13, 2023

Related U.S. Application Data

(63) Continuation of application No. 16/628,125, filed as application No. PCT/JP2018/025757 on Jul. 6, 2018, now abandoned.

(30) Foreign Application Priority Data

Jul. 6, 2017 (JP) .................. 2017-133129
Mar. 9, 2018 (JP) .................. 2018-043525

(51) Int. Cl.
*H10K 50/135* (2023.01)
*H10K 50/17* (2023.01)
*H10K 85/30* (2023.01)
*H10K 102/00* (2023.01)

(52) U.S. Cl.
CPC ........... *H10K 50/135* (2023.02); *H10K 50/17* (2023.02); *H10K 50/171* (2023.02); *H10K 85/30* (2023.02); *H10K 2102/351* (2023.02)

(58) Field of Classification Search
CPC ......... H10K 85/50; H10K 50/16; H10K 50/15
See application file for complete search history.

(56) References Cited

U.S. PATENT DOCUMENTS

| | | | |
|---|---|---|---|
| 533,575 | A | 2/1895 | Wilkens |
| 2,444,570 | A | 8/1946 | Lawrence et al. |
| 2,717,597 | A | 12/1952 | Hein, Jr. |
| 9,153,788 | B2 | 10/2015 | Adachi |
| 9,502,668 | B2 | 11/2016 | Adachi |

(Continued)

FOREIGN PATENT DOCUMENTS

| | | |
|---|---|---|
| CN | 104795505 A | 7/2015 |
| CN | 105679807 A | 6/2016 |

(Continued)

OTHER PUBLICATIONS

Gong, et al., Highly efficient quantum dot near-infrared light-emitting diodes, Nature Photonics, 10:253-257 (2016).

(Continued)

*Primary Examiner* — Alia Sabur
(74) *Attorney, Agent, or Firm* — BROWDY AND NEIMARK, PLLC

(57) ABSTRACT

An organic light-emitting device having a perovskite layer having a thickness of 50 nm or more has a low drive voltage and a high power efficiency, and can suppress interelectrode short-circuiting and current leakage.

16 Claims, 18 Drawing Sheets

(56) References Cited

U.S. PATENT DOCUMENTS

| | | | |
|---|---|---|---|
| 9,634,262 B2 | 4/2017 | Adachi | |
| 9,660,198 B2 | 5/2017 | Nakagawa et al. | |
| 9,793,492 B2 | 10/2017 | Sagara | |
| 9,818,955 B2 | 11/2017 | Hironori | |
| 9,985,215 B2 | 5/2018 | Adachi | |
| 10,032,995 B2 | 7/2018 | Adachi | |
| 10,454,038 B2 | 10/2019 | Nakagawa | |
| 2003/0152801 A1 | 8/2003 | Liao | |
| 2009/0284141 A1 | 11/2009 | Sakanoue et al. | |
| 2015/0141642 A1 | 5/2015 | Adachi | |
| 2015/0239880 A1 | 8/2015 | Adachi | |
| 2015/0357582 A1 | 12/2015 | Hirata | |
| 2017/0125747 A1 | 5/2017 | Lee et al. | |
| 2017/0294607 A1* | 10/2017 | Kim | H10K 85/351 |
| 2018/0233688 A1 | 8/2018 | Chen | |
| 2019/0058135 A1* | 2/2019 | Ma | H10K 30/10 |
| 2021/0305529 A1* | 9/2021 | Lee | H10K 50/16 |

FOREIGN PATENT DOCUMENTS

| | | | |
|---|---|---|---|
| CN | 105870349 A | | 8/2016 |
| CN | 106920856 A | | 7/2017 |
| CN | 108336244 A | | 7/2018 |
| JP | 2013-116975 A1 | | 6/2013 |
| JP | 2013-256490 A1 | | 12/2013 |
| JP | 2014/253121 A | | 12/2013 |
| JP | 2014-9224 A | | 1/2014 |
| JP | 2014-9352 A | | 1/2014 |
| JP | 2014-82377 A | | 5/2014 |
| JP | 2014082377 A | | 5/2014 |
| JP | 2014082377 A | * | 5/2014 |
| JP | 2015-129240 A | | 7/2015 |
| JP | 2017-57197 A | | 3/2017 |
| JP | 2017-516317 A | | 6/2017 |
| JP | 2018-120846 A | | 8/2018 |
| KR | 10-2003-0066370 A | | 8/2003 |
| KR | 10-2010-0114749 A | | 10/2010 |
| WO | 2013/011954 A1 | | 1/2013 |
| WO | 2013/011955 A1 | | 1/2013 |
| WO | 2013/081088 A1 | | 6/2013 |
| WO | 2013/133359 A1 | | 9/2013 |
| WO | 2013/154064 A1 | | 10/2013 |
| WO | 2013/161437 A1 | | 10/2013 |
| WO | 2014/034535 A1 | | 3/2014 |
| WO | 2014/115743 A1 | | 7/2014 |
| WO | 2014/122895 A1 | | 8/2014 |
| WO | 2014/126200 A1 | | 8/2014 |
| WO | 2014-133121 A1 | | 9/2014 |
| WO | 2014/136758 A1 | | 9/2014 |
| WO | 2014/136860 A1 | | 9/2014 |
| WO | 2014/168101 A1 | | 10/2014 |
| WO | 2014/189122 A1 | | 11/2014 |
| WO | 2014/196585 A1 | | 12/2014 |
| WO | 2014/203840 A1 | | 12/2014 |
| WO | 2015/002213 A1 | | 1/2015 |
| WO | 2015/008580 A1 | | 1/2015 |
| WO | 2015/016200 A1 | | 2/2015 |
| WO | 2015/019725 A1 | | 2/2015 |
| WO | 2015/072470 A1 | | 5/2015 |
| WO | 2015/072537 A1 | | 5/2015 |
| WO | 2015/080182 A1 | | 6/2015 |
| WO | 2015/080183 A1 | | 6/2015 |
| WO | 2015/108049 A1 | | 7/2015 |
| WO | 2015/129714 A1 | | 9/2015 |
| WO | 2015/129715 A1 | | 9/2015 |
| WO | 2015/133501 A1 | | 9/2015 |
| WO | 2015/136880 A1 | | 9/2015 |
| WO | 2015/137136 A1 | | 9/2015 |
| WO | 2015/137202 A1 | | 9/2015 |
| WO | 2015/137244 A1 | | 9/2015 |
| WO | 2015/146541 A1 | | 10/2015 |
| WO | 2015/159541 A1 | | 10/2015 |
| WO | 2015/166006 A1 | | 11/2015 |

OTHER PUBLICATIONS

Japanese Office action dated Jan. 17, 2023, from corresponding Japanese Patent Application No. 2019-527990.
Japanese and English version of International Preliminary Report on Patentability of Chapter I, i.e., International Search Opinion dated Jan. 7, 2020 with English translation.
International Search Report and Search Opinion dated.
C. W. Tang et al., "Organic electroluminescent diodes", Appl. Phys. Lett. 51, 913 (1987).
Shigeki Naka et al., "Carrier transport properties of organic materials for EL device operation", Synth. Met. 111-112, 331 (2000).
George G. Malliaras et al., "Nondispersive electron transport in Cite Alq3", Appl. Phys. Lett. 79, 2582 (2001).
Liu (Liu, M., Johnston, M. & Snaith, H. Efficient planar heterojunction perovskite solar cells by vapour deposition. Nature 501, 395-398 (2013). https://doi.org/10.1038/nature12509) (Year: 2013).
Office Action dated Oct. 11, 2021 issued in the corresponding Chinese patent application No. 201880044580.0 with its English Machine Translation.
Office Action dated Mar. 8, 2022 issued in the corresponding Japanese patent application No. 2019-527990 with its English Machine Translation.
Chinese office action dated Jul. 15, 2022, with English machine translation in corresponding Chinese patent application No. 201880044580.0.
Office Action dated Aug. 25, 2022 issued in the corresponding Korean patent application No. 10-2019-7038992 with its English Machine Translation.
Office Action dated September 20, 2022 issued in the corresponding Japanese patent application No. 2019-527990 with its English Machine Translation
Chinese office action dated Mar. 2, 2023, issued in corresponding Chinese Patent Application No. 201880044580.0 with English machine translation.
Office Action dated Jan. 4, 2024 issued in the corresponding Korean patent application No. 10-2023-7014961 with its English Machine Translation.

* cited by examiner

[FIG. 1]
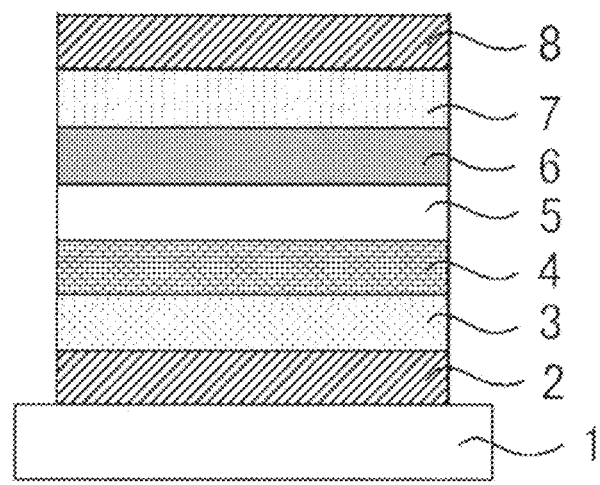
[FIG. 2]
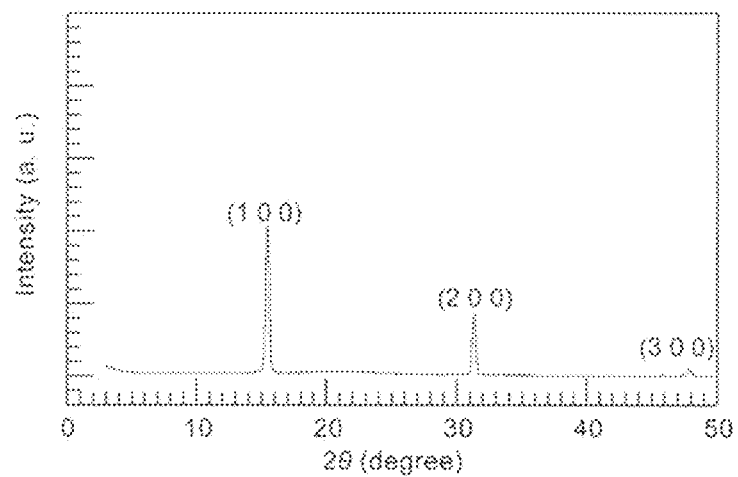

[FIG. 3]
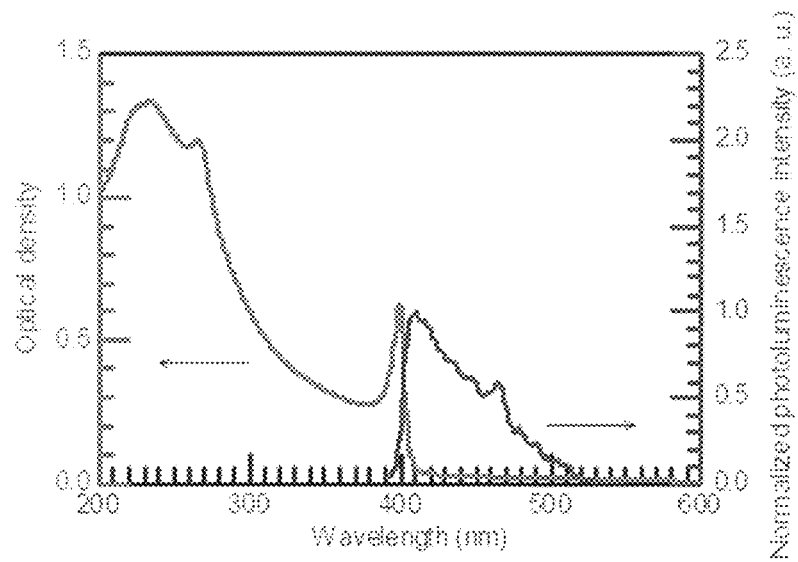
[FIG. 4]
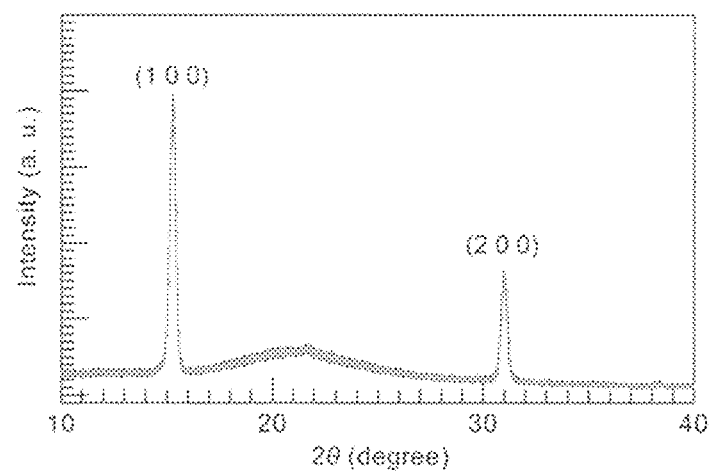

[FIG. 5]
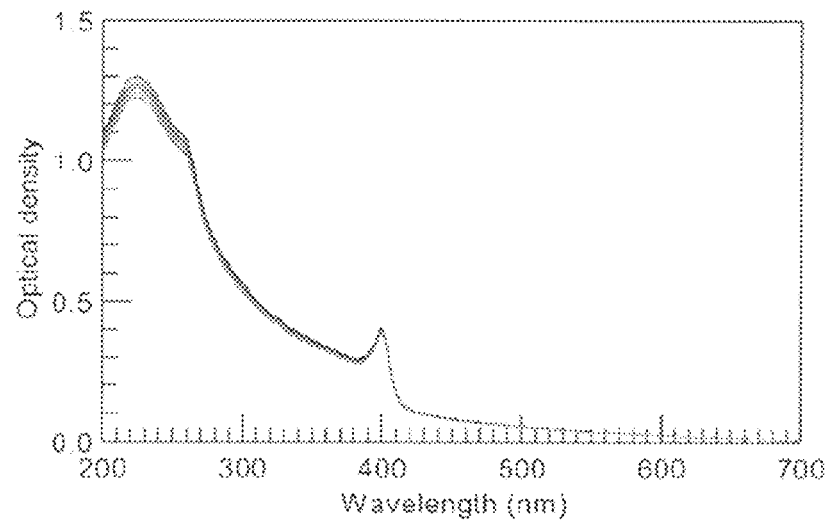
[Fig. 6A] HOLE TRANSPORT DEVICE
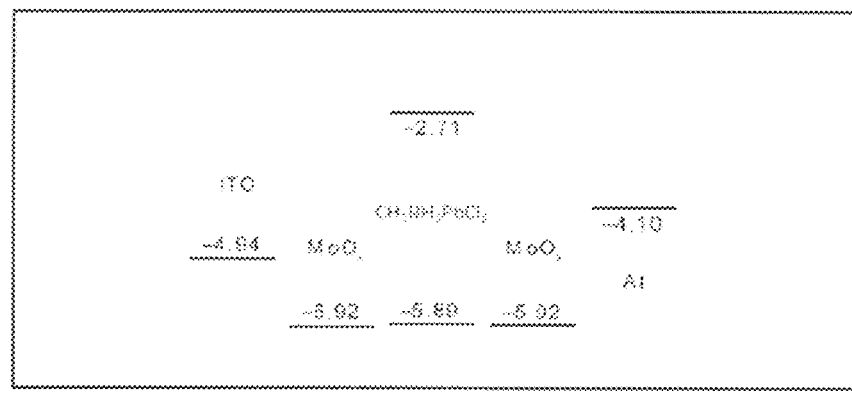
[Fig. 6B] ELECTRON TRANSPORT DEVICE
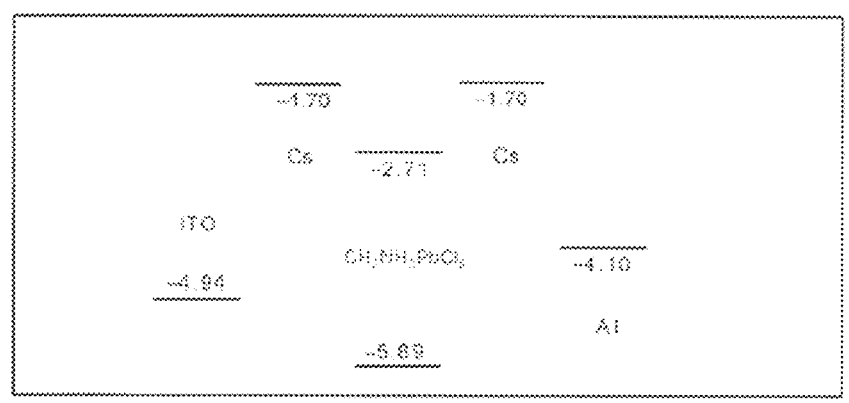

[FIG. 7]
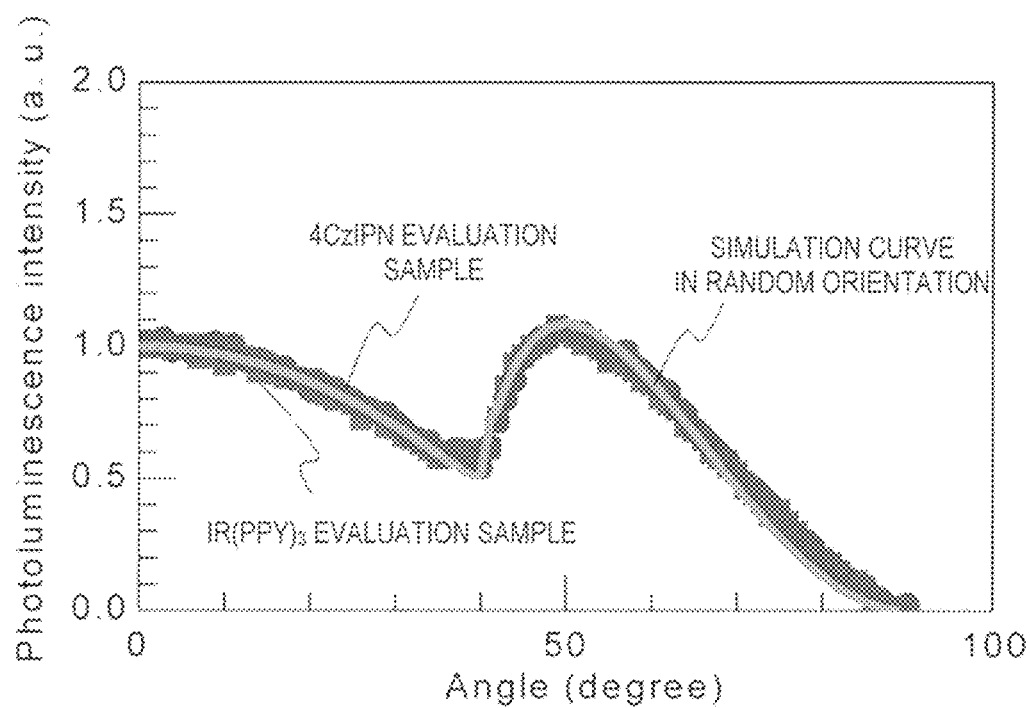
[FIG. 8]
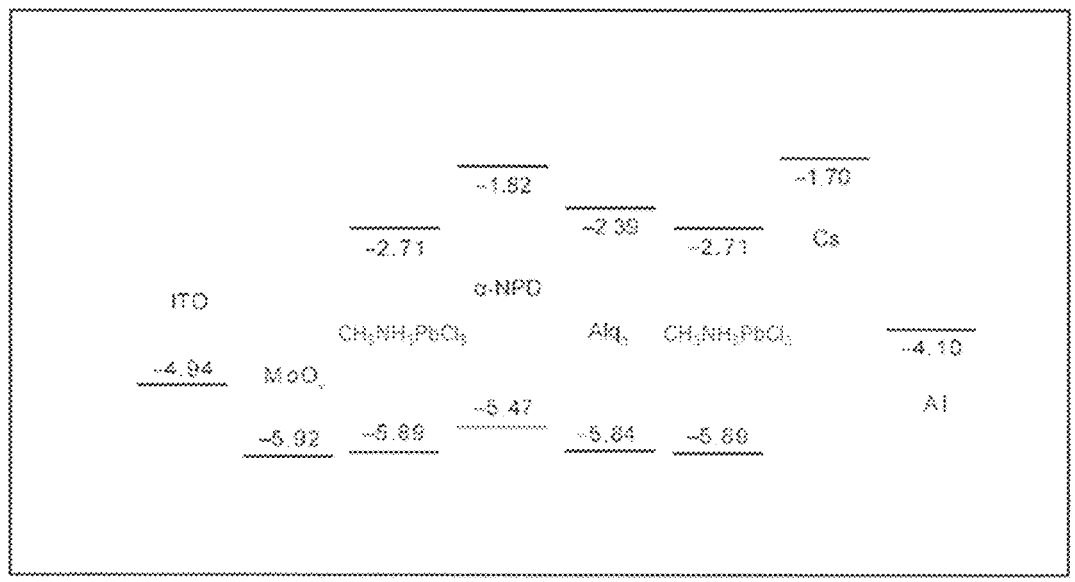

[FIG. 9]
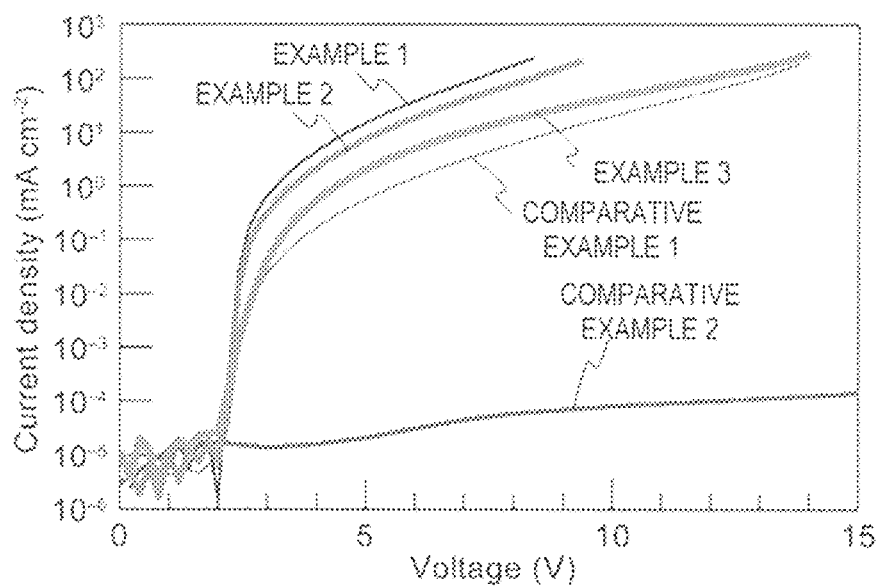
[FIG. 10]
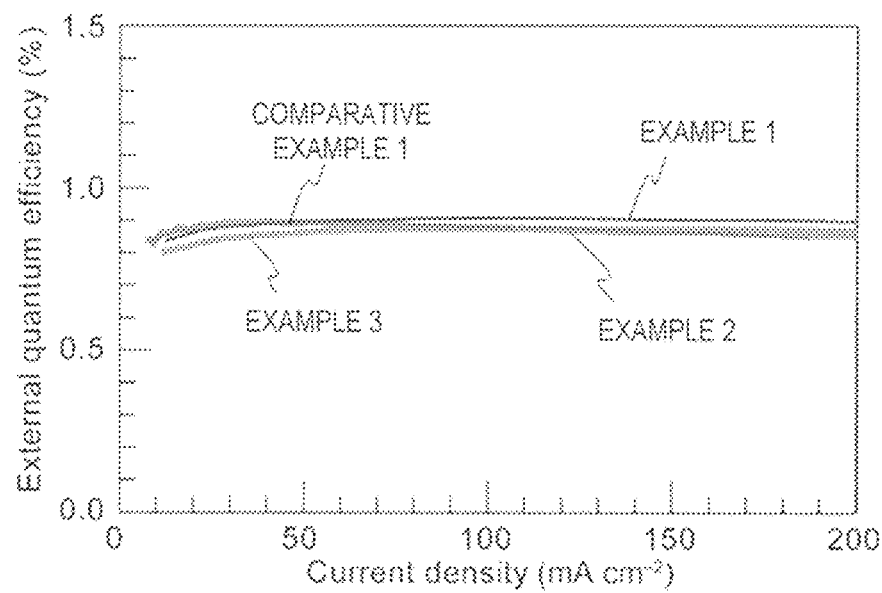

[FIG. 11]
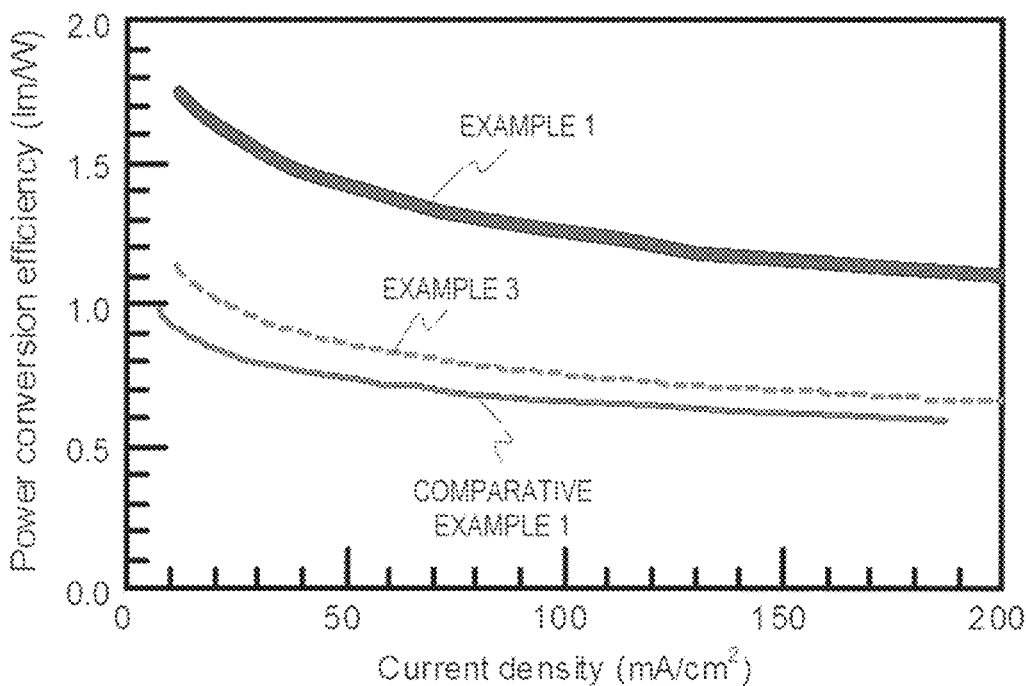
[FIG. 12]
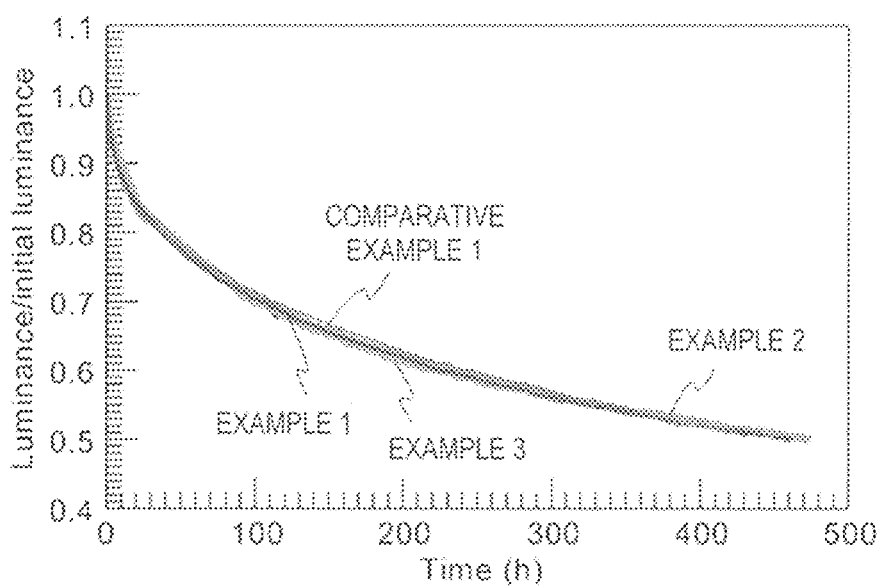

[FIG. 13]
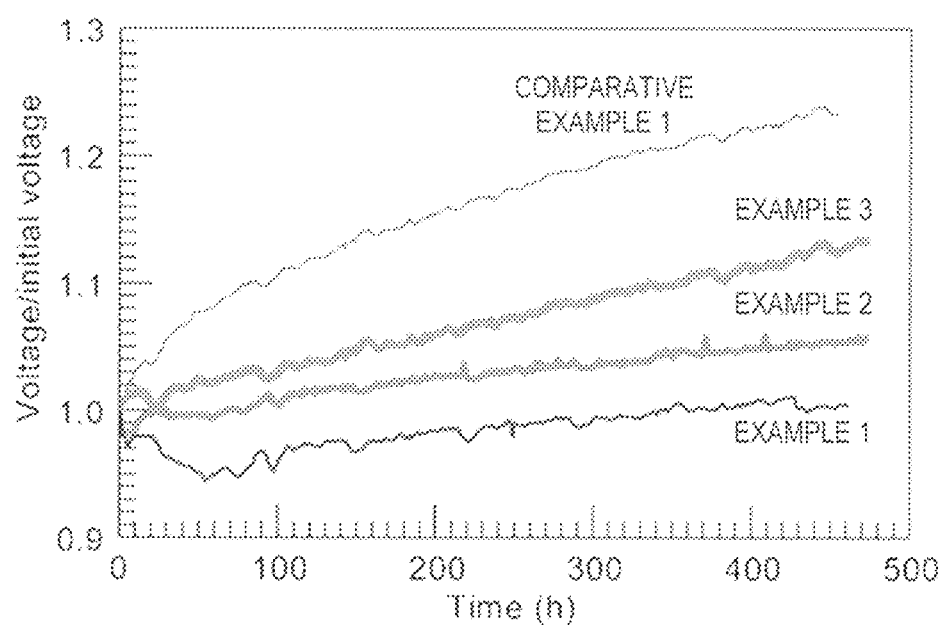

[Fig. 14A]
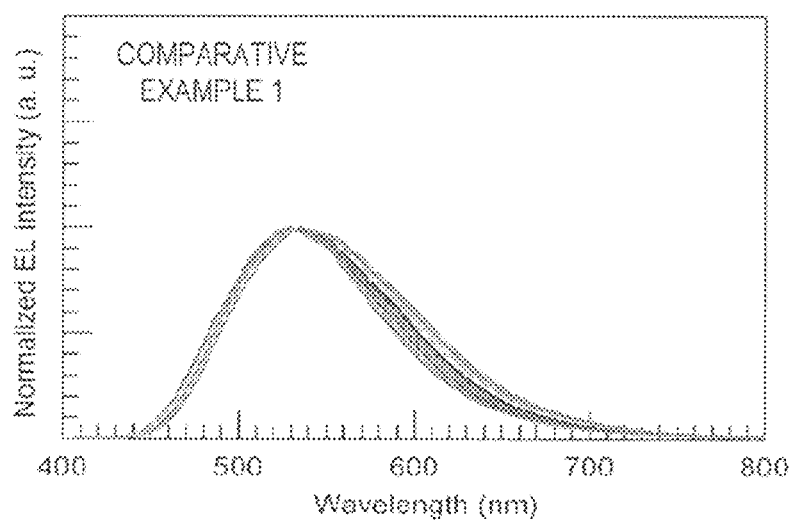
[Fig. 14B]
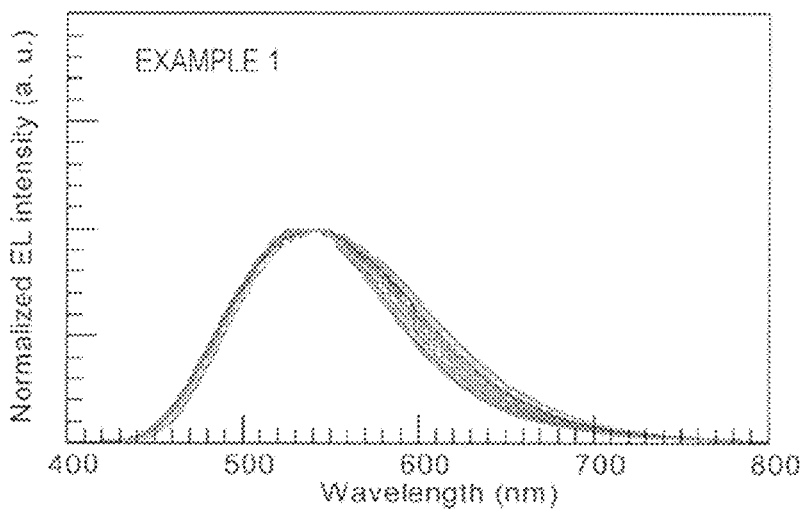
[Fig. 14C]
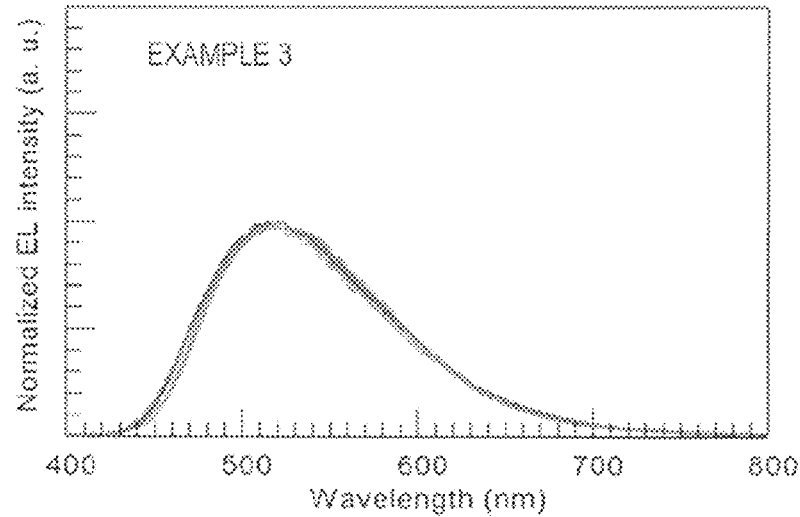

[FIG. 15]
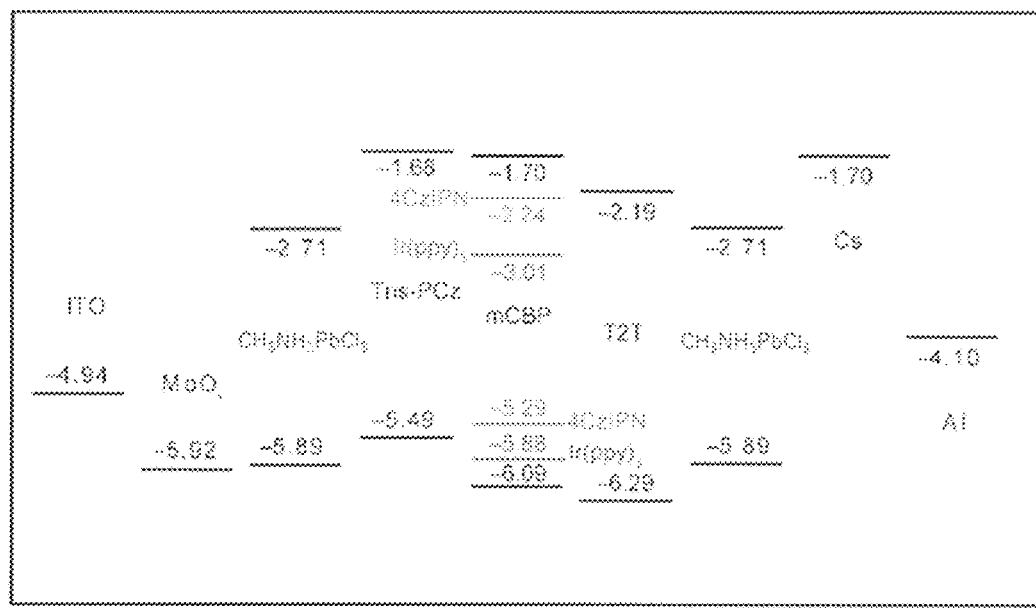
[FIG. 16]
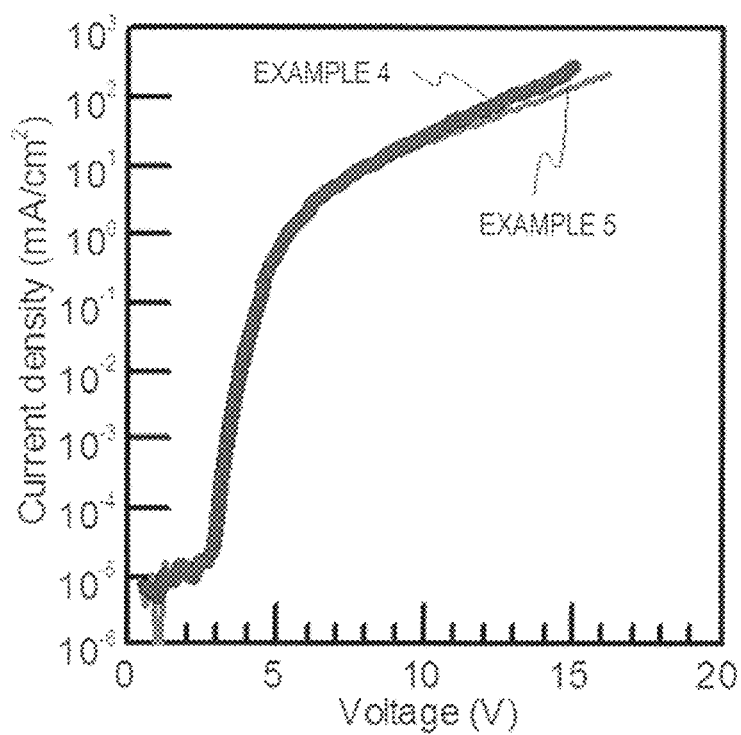

[FIG. 17]
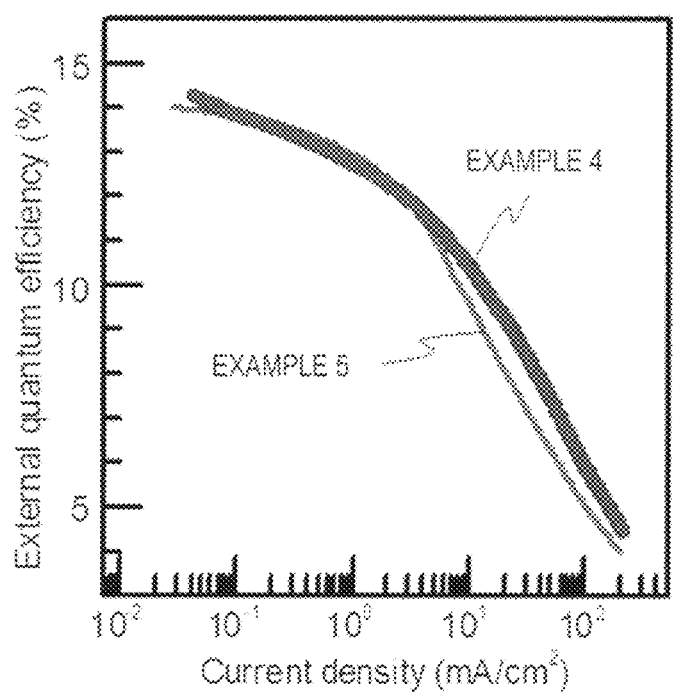

[Fig. 18A]
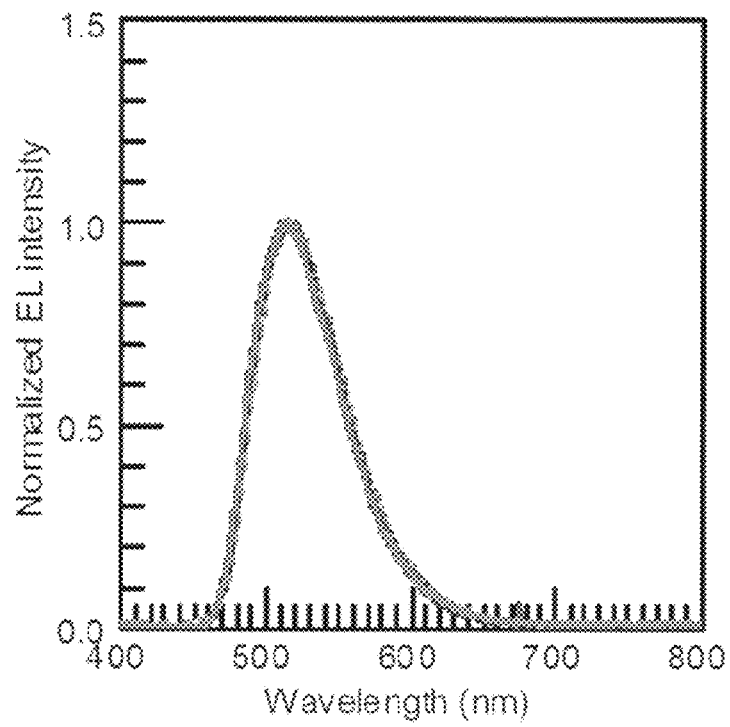
[Fig. 18B]
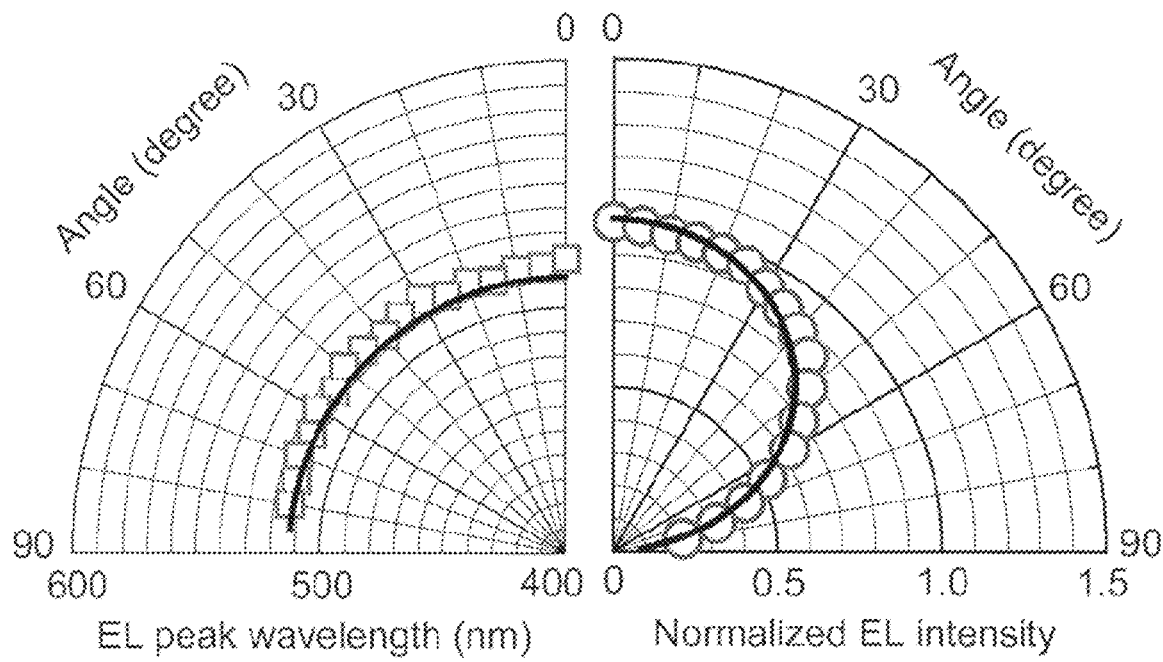

[Fig. 19A]
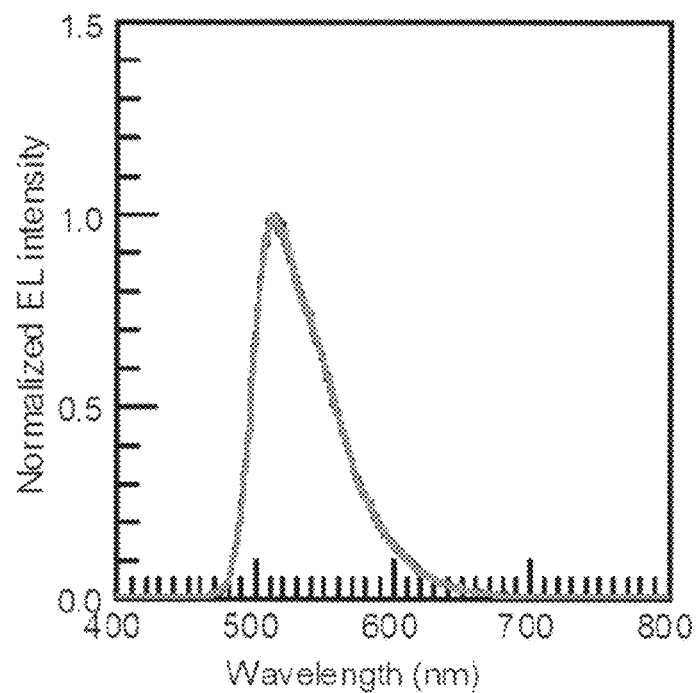
[Fig. 19B]
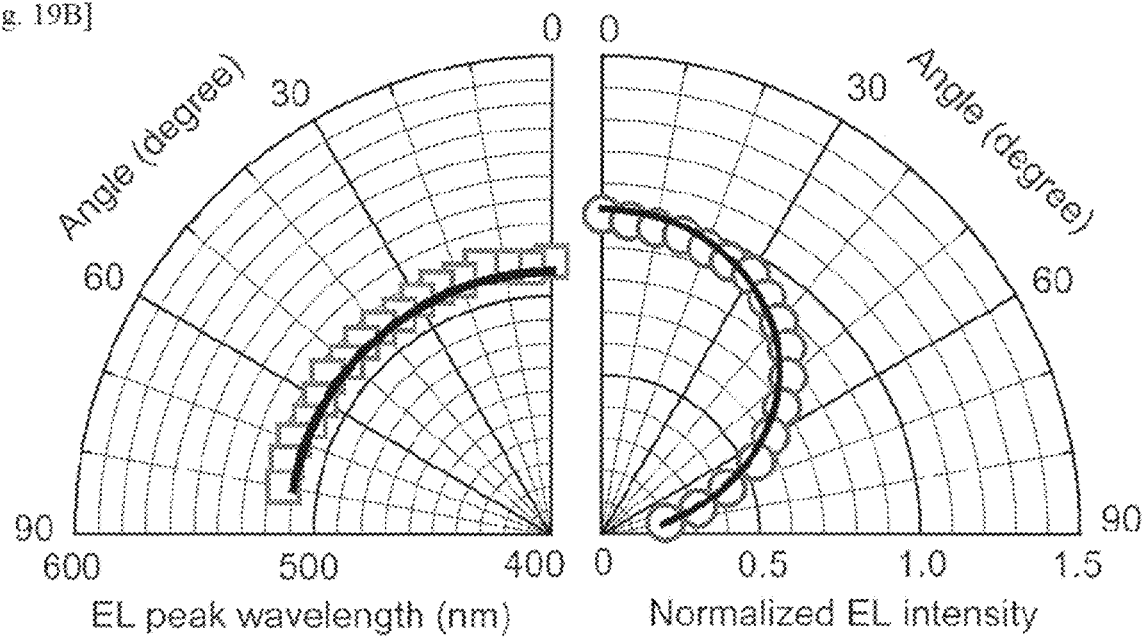

[FIG. 20]
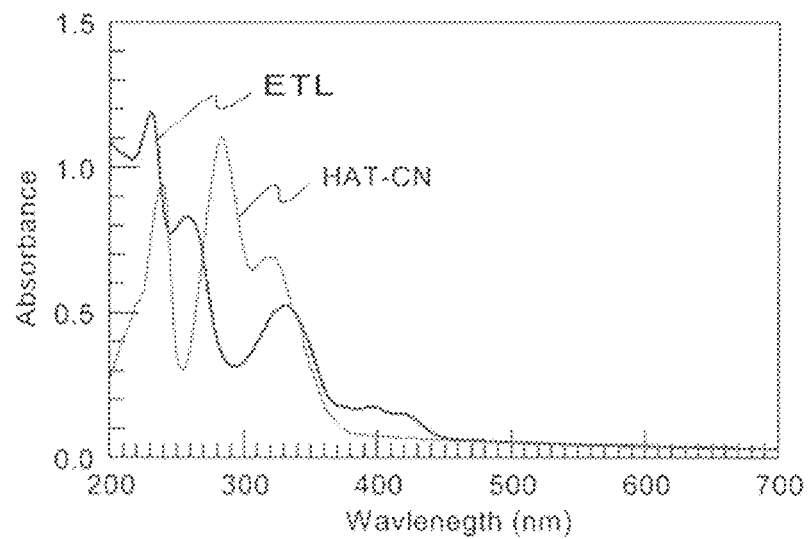
[FIG. 21]
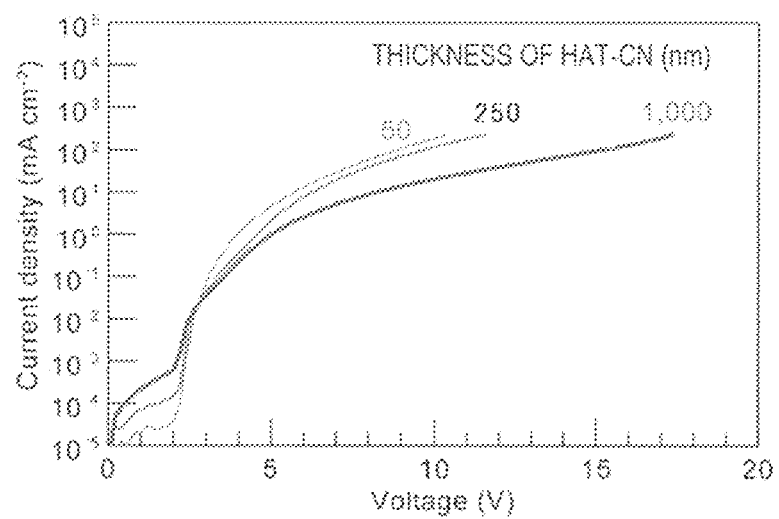

[FIG. 22]
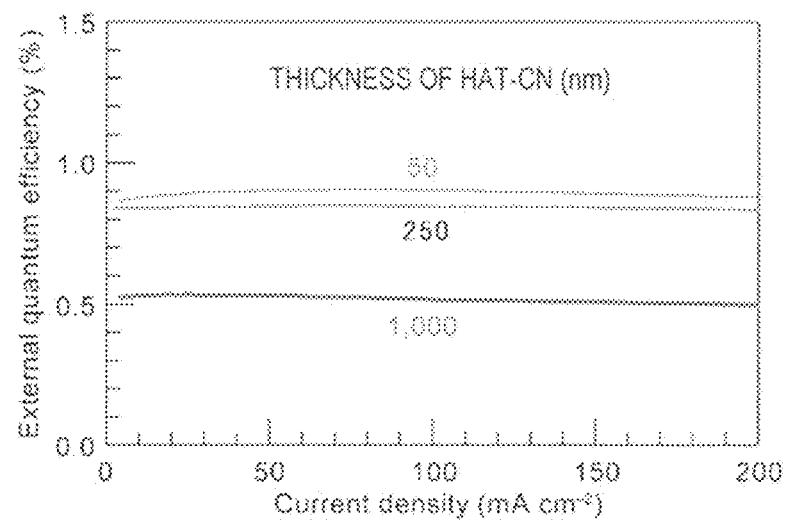
[FIG. 23]
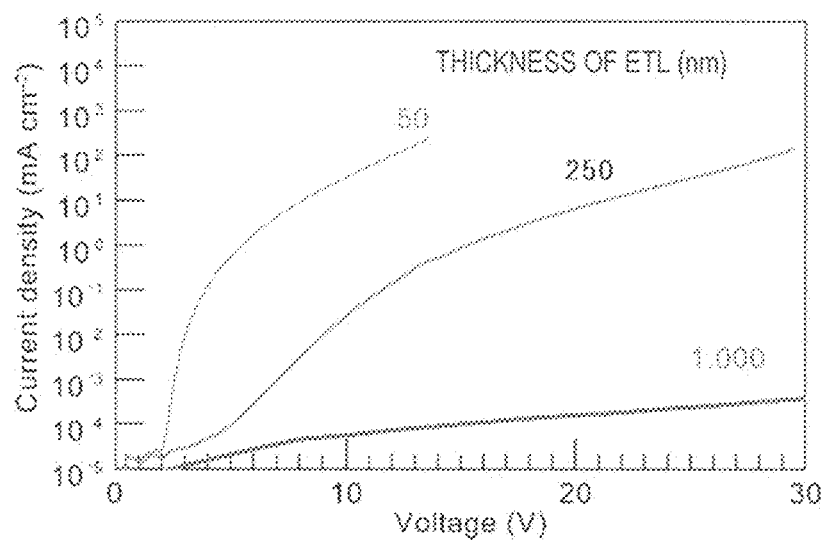

[FIG. 24]
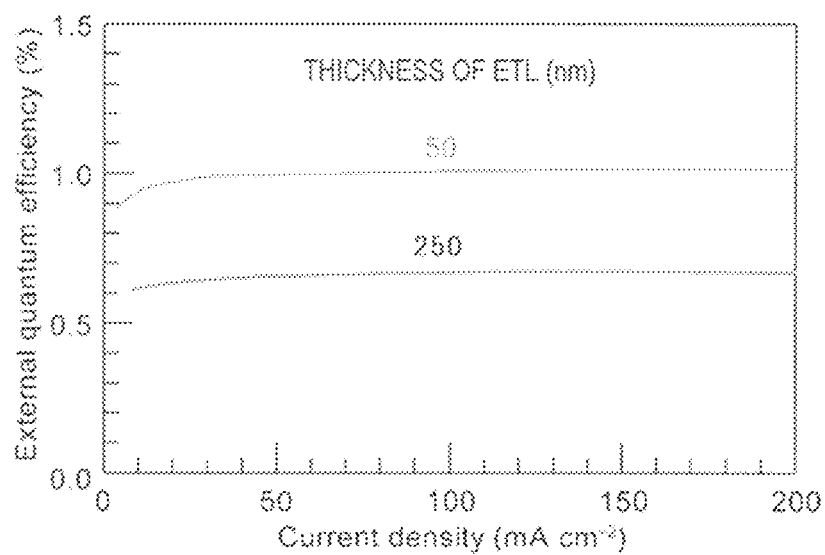
[FIG. 25]
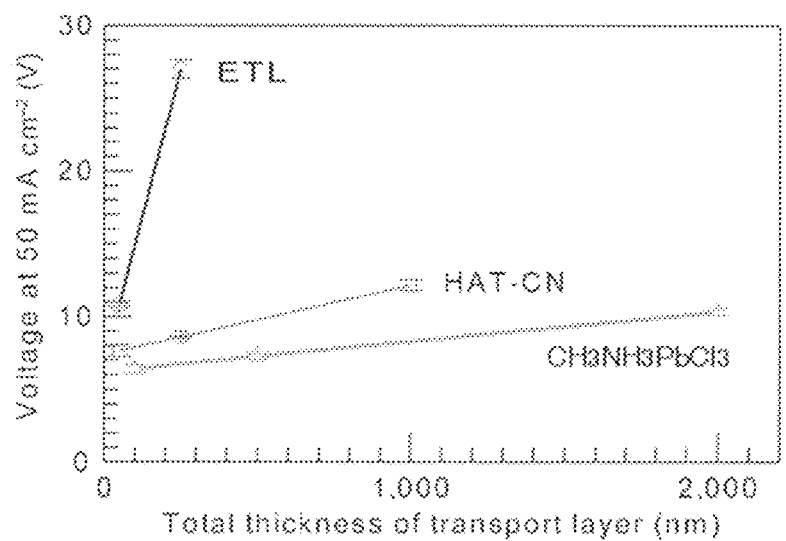

[FIG. 26]
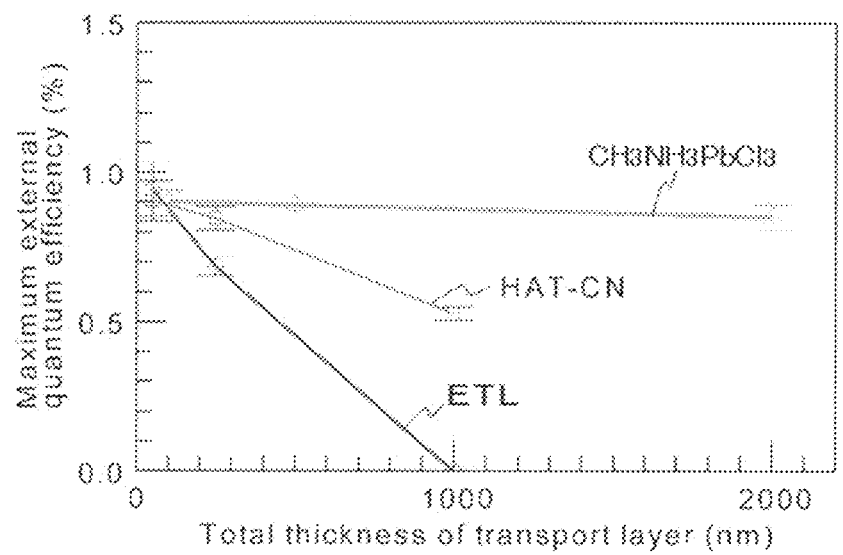
[FIG. 37]
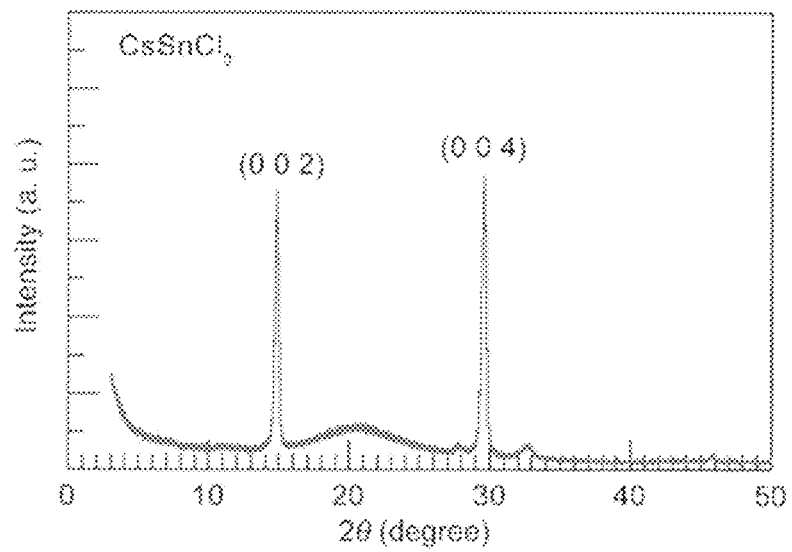

[FIG. 28]
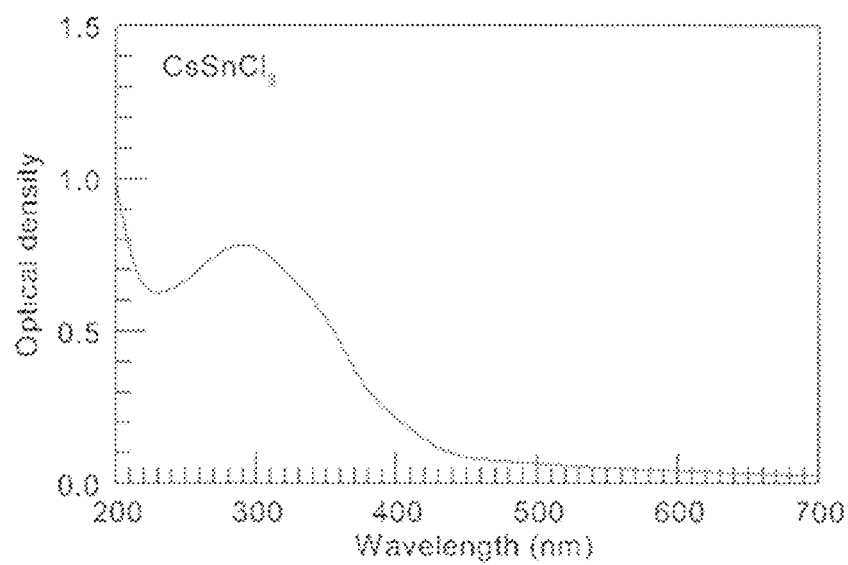
[FIG. 29]
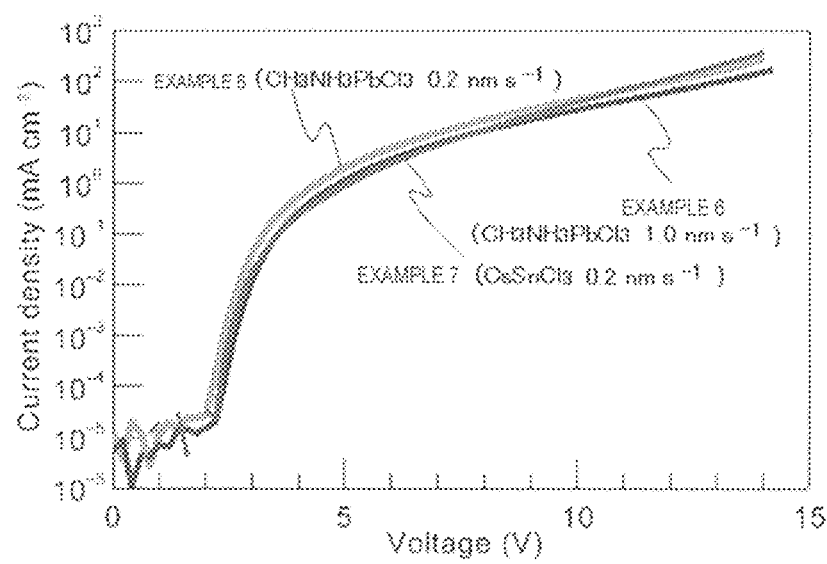

[FIG. 30]
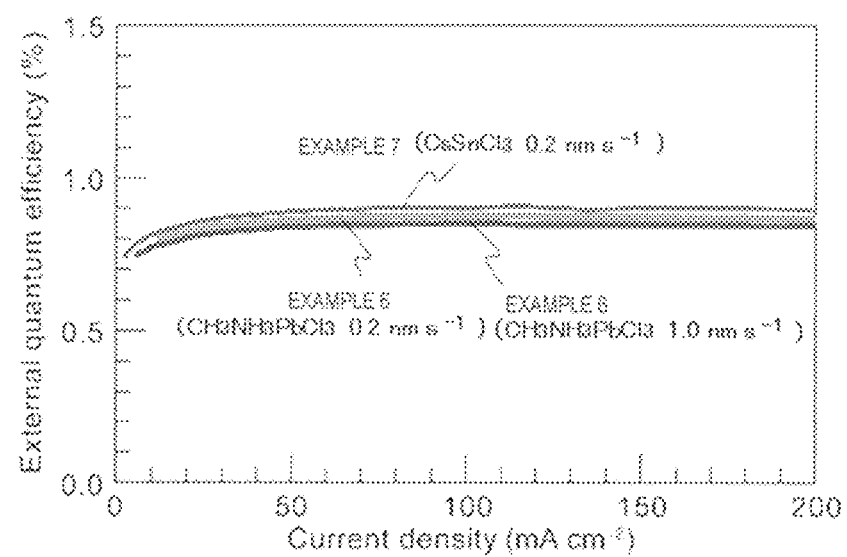

ORGANIC LIGHT-EMITTING ELEMENT

TECHNICAL FIELD

The present invention relates to an organic light emitting device hardly suffering interelectrode short-circuiting and current leakage.

BACKGROUND ART

An organic light-emitting device using a light-emitting phenomenon of an organic material does not need a backlight and therefore can be lightweight and flexible and is, in addition, expected to enjoy rapid responsibility and high visibility, and for such reasons, energetic development of the device for attaining practicable drive voltage and power efficiency has been promoted. As a result, in 1987, as a configuration of a practicable organic light-emitting device, an organic light-emitting device having, as layered in that order, an anode, a hole transport layer, an electron transport and light-emitting layer that serves both as a light-emitting layer and as an electron transport layer, and a cathode was proposed (NPL 1). In this, TAPC represented by the following formula is used in the hole transport layer, and $Alq_3$ represented by the following formula is used in the electron transport and light-emitting layer. Regarding the thickness of each layer therein, the thickness of the hole transport layer is 75 nm or so and that of the electron transport and light-emitting layer is 80 nm or so, that is, these layers are thinned to increase the carrier injection efficiency and the carrier transport efficiency thereby reducing the drive voltage and improving the power efficiency.

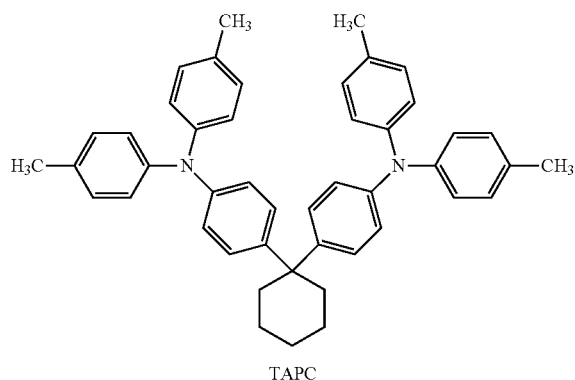

TAPC

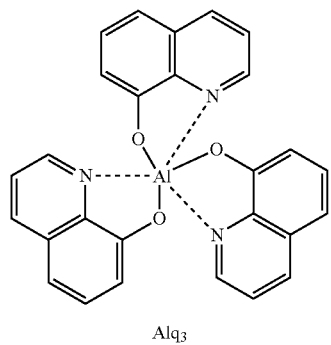

$Alq_3$

CITATION LIST

Non-Patent Literature

NPL 1: Appl. Phys. Lett. 51, 913 (1987)

SUMMARY OF INVENTION

Technical Problem

As seen from the organic light-emitting device described in the above-mentioned NPL 1 and from the organic light-emitting devices developed after that, heretofore-known organic light-emitting devices are made to realize a practicable drive voltage and power efficiency by thinning the organic layers such as the carrier injection layer and the carrier transport layer therein.

In an organic light-emitting device, however, organic layers are formed according to a solution coating method or a dry process such as a vacuum evaporation method, and when the films formed in such a case, some parts could not be sufficiently thick or some parts may often have an island profile, that is, it is difficult to form organic layers with no unevenness. In particular, in a case of producing an organic light-emitting device for use for large-screen displays, it is difficult to attain uniform film-forming conditions for the entire organic layer-forming face and unevenness may occur more readily. Here, when organic layers are formed unevenly, there may occur interelectrode short-circuiting and current leakage in the layers provided on and below the layers, thereby causing a disadvantage of poor production yield of organic light-emitting devices. Needless-to-say, when organic layers are formed sufficiently thick, occurrence of interelectrode short-circuiting and current leakage can be evaded, but in existing organic light-emitting devices, if the carrier injection layer and the carrier transport layer are formed thick, carrier injection efficiency and carrier transport efficiency worsen to cause significant increase in drive voltage. In view of theses, in existing organic light-emitting devices, it is difficult to satisfy both suppression of interelectrode short-circuiting and current leakage and reduction in drive voltage to increase power efficiency, and the fact is practicability of organic light-emitting devices could not be sufficiently enhanced.

Given the situation, for solving the problems of existing technologies, the present inventors have promoted assiduous studies for the purpose of providing an organic light-emitting device having a low drive voltage and a high power efficiency and capable of suppressing occurrence of interelectrode short-circuiting and current leakage.

Solution to Problem

As a result of assiduous studies, the present inventors have found that a layer formed of a perovskite-type compound has an extremely high carrier mobility. With that, the inventors have achieved a finding that, when a layer of such a perovskite-type compound is formed to have a certain thickness or more, and arranged between a light-emitting layer and an electrode, then an organic light-emitting device having a low drive voltage and a high power efficiency and capable of suppressing occurrence of interelectrode short-circuiting and current leakage can be realized. The present invention is proposed here based on such a finding, and concretely has the following constitution.

[1] An organic light-emitting device having a perovskite layer having a thickness of 50 nm or more.

[2] The organic light-emitting device according to [1], wherein the carrier mobility of the perovskite layer is $10^{-2}$ to $10^3$ cm$^2$V$^{-1}$s$^{-1}$.

[3] The organic light-emitting device according to [1] or [2], further having a light-emitting layer.

[4] The organic light-emitting device according to [3], having at least two the perovskite layers, and having a structure that the light-emitting layer is sandwiched between the two perovskite layers.

[5] The organic light-emitting device according to [3] or [4], wherein the perovskite layer does not have a maximum absorption wavelength in an emission wavelength range of the light-emitting layer.

[6] The organic light-emitting device according to any one of [1] to [5], wherein the perovskite layer contains a perovskite-type compound represented by the following general formula (4):

$$A^3BX_3 \qquad (4)$$

wherein $A^3$ represents an organic cation, B represents a divalent metal ion, X represents a halide ion, and three X's may be the same as or different from each other.

[7] The organic light-emitting device according to any one of [1] to [6], wherein the perovskite layer is a vapor-deposited film.

[8] The organic light-emitting device according to any one of [1] to [7], wherein the thickness of the perovskite layer is 50 to 10000 nm.

[9] The organic light-emitting device according to any one of [1] to [8], which is an organic electroluminescent device.

[10] The organic light-emitting device according to [9], having an anode and a cathode, a light-emitting layer arranged between the anode and the cathode, a first perovskite layer arranged between the anode and the light-emitting layer, and a second perovskite layer arranged between the cathode and the light-emitting layer, wherein the first perovskite layer and the second perovskite layer are perovskite layers each having a thickness of 50 nm or more.

[11] The organic light-emitting device according to [10], further having a hole injection layer arranged between the anode and the first perovskite layer and an electron injection layer arranged between the cathode and the second perovskite layer.

Advantageous Effects of Invention

The organic light-emitting device of the present invention has a perovskite layer having a thickness of 50 nm or more, therefore has a low drive voltage and a high power efficiency, can suppress interelectrode short-circuiting and current leakage and can be produced at a high yield.

BRIEF DESCRIPTION OF DRAWINGS

FIG. 1 This is a schematic cross-sectional view showing an example of layer configuration of an organic electroluminescent device.

FIG. 2 This shows an X-ray diffraction pattern of the perovskite layer formed in Experimental Example 1.

FIG. 3 This shows a photoabsorption spectrum of the perovskite layer formed in Experimental Example 1, and an emission spectrum of a light-emitting material.

FIG. 4 This shows, as superimposed, X-ray diffraction patterns of the perovskite layer formed in Experimental Example 1, in which the perovskite layer was left in air at a temperature of 24° C. and at a relative humidity of 50% for 11 days, and the X-ray diffraction pattern thereof was measured on day 0, day 1, day 3, day 5, day 7, day 9 and day 11 after the start of leaving it.

FIG. 5 This shows, as superimposed, absorption spectra of the perovskite layer formed in Experimental Example 1, in which the perovskite layer was left in air at a temperature of 24° C. and at a relative humidity of 50% for 11 days, and the absorption spectrum thereof was measured on day 0, day 1, day 3, day 5, day 7, day 9 and day 11 after the start of leaving it.

FIG. 6A and FIG. 6B These show an energy level diagram of the materials constituting FIG. 6A the hole transport device and FIG. 6B the electron transport device produced in Experimental Example 3.

FIG. 7 This is a graph showing evaluation results of molecular orientation of the 4CzIPN evaluation sample and the Ir(ppy)$_3$ evaluation sample produced in Experimental Example 4.

FIG. 8 This shows an energy level diagram of the materials constituting the organic light-emitting devices produced in Examples 1 to 3.

FIG. 9 This is a graph showing a current density-voltage characteristic of the organic light-emitting device having a first perovskite layer and a second perovskite layer each having a thickness of 50 nm (Example 1), the organic light-emitting device having a first perovskite layer and a second perovskite layer each having a thickness of 250 nm (Example 2), the organic light-emitting device having a first perovskite layer and a second perovskite layer each having a thickness of 1000 nm (Example 3), the organic light-emitting device having an α-NPD layer having a thickness of 100 nm and an Alq$_3$ layer having a thickness of 100 nm (Comparative Example 1), and the organic light-emitting device having an α-NPD layer having a thickness of 1050 nm and an Alq$_3$ layer having a thickness of 1050 nm (Comparative Example 2).

FIG. 10 This is a graph showing an external quantum efficiency-current density characteristic of the organic light-emitting device having a first perovskite layer and a second perovskite layer each having a thickness of 50 nm (Example 1), the organic light-emitting device having a first perovskite layer and a second perovskite layer each having a thickness of 250 nm (Example 2), the organic light-emitting device having a first perovskite layer and a second perovskite layer each having a thickness of 1000 nm (Example 3), and the organic light-emitting device having an α-NPD layer having a thickness of 100 nm and an Alq$_3$ layer having a thickness of 100 nm (Comparative Example 1).

FIG. 11 This is a graph showing a power efficiency-current density characteristic of the organic light-emitting device having a first perovskite layer and a second perovskite layer each having a thickness of 50 nm (Example 1), the organic light-emitting device having a first perovskite layer and a second perovskite layer each having a thickness of 1000 nm (Example 3), and the organic light-emitting device having an α-NPD layer having a thickness of 100 nm and an Alq$_3$ layer having a thickness of 100 nm (Comparative Example 1).

FIG. 12 This is a graph showing a brightness change with time in continuous driving of the organic light-emitting device having a first perovskite layer and a second perovskite layer each having a thickness of 50 nm (Example 1), the organic light-emitting device having a first perovskite layer and a second perovskite layer each having a thickness of 250 nm (Example 2), the organic light-emitting device having a first perovskite layer and a second perovskite layer each having a thickness of 1000 nm (Example 3), and the organic light-emitting device having an α-NPD layer having a thickness of 100 nm and an Alq₃ layer having a thickness of 100 nm (Comparative Example 1).

FIG. 13 This is a graph showing a drive voltage change with time in continuous driving of the organic light-emitting device having a first perovskite layer and a second perovskite layer each having a thickness of 50 nm (Example 1), the organic light-emitting device having a first perovskite layer and a second perovskite layer each having a thickness of 250 nm (Example 2), the organic light-emitting device having a first perovskite layer and a second perovskite layer each having a thickness of 1000 nm (Example 3), and the organic light-emitting device having an α-NPD layer having a thickness of 100 nm and an Alq₃ layer having a thickness of 100 nm (Comparative Example 1).

FIG. 14A-FIG. 14C These show emission spectra, as measured with varying the viewing angle at intervals of 5° between 0 and 800 and superimposed, of the organic light-emitting device having a first perovskite layer and a second perovskite layer each having a thickness of 50 nm (Example 1, FIG. 14B), the organic light-emitting device having a first perovskite layer and a second perovskite layer each having a thickness of 1000 nm (Example 3, FIG. 14C), and the organic light-emitting device having an α-NPD layer having a thickness of 100 nm and an Alq₃ layer having a thickness of 100 nm (Comparative Example 1, FIG. 14A).

FIG. 15 This shows an energy level diagram of the materials constituting the organic light-emitting devices produced in Examples 4 and 5.

FIG. 16 This is a graph showing a current density-voltage characteristic of an organic light-emitting material using 4CzIPN as a light-emitting material (Example 4) and an organic light-emitting device using Ir(ppy)₃ as a light-emitting material (Example 5).

FIG. 17 This is a graph showing an external quantum efficiency-current density characteristic of an organic light-emitting material using 4CzIPN as a light-emitting material (Example 4) and an organic light-emitting device using Ir(ppy)₃ as a light-emitting material (Example 5).

FIGS. 18A and 18B These show an emission angle dependence of an organic light-emitting device (Example 4); FIG. 18A is an emission spectrum of the device as measured with varying the viewing angle at intervals of 5 between 0 and 80°, and FIG. 18B is a graph showing an angle dependence of the maximum emission wavelength and that of the emission intensity.

FIGS. 19A and 19B These show an emission angle dependence of an organic light-emitting device (Example 5); FIG. 19A is an emission spectrum of the device as measured with varying the viewing angle at intervals of 5° between 0 and 80°, and FIG. 19B is a graph showing an angle dependence of the maximum emission wavelength and that of the emission intensity.

FIG. 20 This shows absorption spectra of a HAT-CN layer and ETL.

FIG. 21 This shows a current density-voltage characteristic of organic light-emitting devices using a HAT-CN layer as a hole transport layer (Comparative Examples 3 to 5).

FIG. 22 This shows an external quantum efficiency-current density characteristic of organic light-emitting devices using a HAT-CN layer as a hole transport layer (Comparative Examples 3 to 5).

FIG. 23 This shows a current density-voltage characteristic of organic light-emitting devices using ETL (Comparative Examples 6 to 8).

FIG. 24 This shows an external quantum efficiency-current density characteristic of organic light-emitting devices using ETL (Comparative Examples 6 and 7).

FIG. 25 This shows a graph drawn by plotting a voltage at 50 mA·cm² of organic light-emitting devices produced in Examples 1 to 3 and Comparative Examples 3 to 6 and 8, relative to the total thickness of the first perovskite layer and the second perovskite layer, the thickness of the HAT-CN layer or the thickness of ETL.

FIG. 26 This shows a graph drawn by plotting a maximum external quantum efficiency of organic light-emitting devices produced in Examples 1 to 3 and Comparative Examples 3 to 8, relative to the total thickness of the first perovskite layer and the second perovskite layer, the thickness of the HAT-CN layer or the thickness of ETL.

FIG. 27 This shows an X-ray diffraction pattern of a $CsSnCl_3$ layer.

FIG. 28 This shows an absorption spectrum of a $CsSnCl_3$ layer.

FIG. 29 This shows a current density-voltage characteristic of an organic light-emitting device with a $CH_3NH_3Cl_3$ layer formed at a film formation speed of 0.2 nm/s (Example 6), an organic light-emitting device with a $CH_3NH_3Cl_3$ layer formed at a film formation speed of 1.0 nm/s (Example 6), and an organic light-emitting device with a $CsSnCl_3$ layer formed at a film formation speed of 0.2 nm/s (Example 7).

FIG. 30 This shows an external quantum efficiency-current density characteristic of an organic light-emitting device with a $CH_3NH_3Cl_3$ layer formed at a film formation speed of 0.2 nm/s (Example 6), an organic light-emitting device with a $CH_3NH_3Cl_3$ layer formed at a film formation speed of 1.0 nm/s (Example 6), and an organic light-emitting device with a $CsSnCl_3$ layer formed at a film formation speed of 0.2 nm/s (Example 7).

DESCRIPTION OF EMBODIMENTS

Hereafter, the present invention is described in detail. As provided below, the constituent elements may be described based on representative embodiments and specific examples of the present invention, but the present invention is not limited to such embodiments and specific examples. As used herein, a numerical range expressed using "to" means a range that includes the numerical values before and after "to" as the minimum and maximum values, respectively. As used herein, a "major constituent" refers to a constituent that accounts for the largest portion of the content of something. A hydrogen atom present in a compound molecule used in the present invention is not particularly limited in terms of isotopic species. For example, all hydrogen atoms in a molecule can be $^1H$, or all or part of them can be $^2H$ [heavy hydrogen (deuterium) D].

<Organic Light-Emitting Device>

The organic light-emitting device of the present invention is characterized by having a perovskite layer having a thickness of 50 nm or more.

"Perovskite layer" in the present invention is a layer containing a perovskite-type compound, and is preferably composed of a perovskite compound as a major material. Here, "composed of a perovskite-type compound as a major material" means that 51% by weight or more of the perovskite layer is composed of a perovskite-type compound. "Perovskite-type compound" is an ionic compound composed of an organic cation or an inorganic cation, and a divalent metal ion, and a halide ion, and can form a perovskite-type crystal structure.

Having a perovskite-type crystal structure, a perovskite layer has a relatively broad band gap and tends to readily diffuse a carrier therein, and therefore has a high carrier mobility. Consequently, an organic light-emitting device having such a perovskite layer can be driven at a low voltage even though the thickness of the perovskite layer therein is thick to be 50 nm or more, even 1000 nm or so, and can therefore realize a high power efficiency. Depending on molecular design of the organic cation to constitute a perovskite-type compound, the physical properties such as photoabsorption characteristic of a perovskite layer can be readily controlled, and therefore, for example, by reducing photoabsorption thereof in an emission wavelength region of a light-emitting material, the layer can have properties convenient for organic light-emitting devices. Accordingly, the layer can improve device characteristics such as light takeoff efficiency of organic light-emitting devices.

Further, in the present invention, the thickness of the perovskite layer is defined to be 50 nm or more, and therefore in any case of using a dry process or a wet process, the perovskite layer can be formed with no unevenness. Consequently, interelectrode short-circuiting or current leakage through the perovskite layer can be suppressed, and organic light-emitting devices can be produced at high yield. In this connection, in an existing organic light-emitting device using an organic material as a carrier injection layer or a carrier transport layer, when these layers are thickened, the drive voltage for the devices increases, and therefore there is a problem that a method of controlling the thickness of these layers to evade interelectrode short-circuiting and current leakage could not be employed. As opposed to this, in the organic light-emitting device of the present invention, even when the perovskite layer is thickened as above, practicably sufficient emission efficiency and power efficiency can be obtained, and accordingly, by thickening the perovskite layer, interelectrode short-circuiting and current leakage can be evaded. In addition, when the perovskite layer is thickened, an optical interference effect with a thin layered structure is suppressed, therefore attaining another effect of suppressing angle dependency such that a color emitted from an organic light-emitting device varies depending on different viewing angles. Further, a perovskite compound is inexpensive as compared with organic materials, therefore providing still another effect of evading cost increase even though a thick film of the compound is formed.

[Perovskite-Type Compound]

The perovskite-type compound for use in the perovskite layer in the present invention is an ion compound composed of an organic cation or an inorganic cation, a divalent metal ion, and a halide ion, and can form a perovskite-type crystal structure. The perovskite-type compound for use in the present invention may be a three-dimensional perovskite in which the constituent ions are regularly arranged in three-dimensional directions to form a perovskite-type structure, or may be a two-dimensional perovskite that forms a layered structure in which inorganic layers made of two-dimensionally arranged inorganic frameworks each corresponding to the octahedral portion in a perovskite-type structure, and organic layers formed of oriented organic cations are alternately layered. The perovskite-type compound includes compounds represented by the following general formulae (1) to (4). Among these, compounds represented by the general formulae (1) to (3) are compounds capable of forming a two-dimensional perovskite structure, and compounds represented by the general formula (4) are compounds capable of forming a three-dimensional perovskite structure. The organic cation in the general formulae (1) to (4) may be substituted with an inorganic cation such as a cesium ion.

(Compounds Represented by General Formula (1))

$$A_2BX_4 \qquad (1)$$

In the general formula (1), A represents an organic cation, B represents a divalent metal ion, and X represents a halide ion. The two instances of A, or the four instances of X, may be the same as each other or not.

The compound represented by the general formula (1) can form a layered structure composed of, as alternately layered, an inorganic layer of two-dimensionally arranged inorganic skeletons $BX_4$ corresponding to the octahedral portion of a perovskite-type structure, and an organic layer of two-dimensionally arranged oriented organic cations $A_2$. Here, the inorganic skeleton $BX_4$ has a structure where a divalent metal ion B is arranged in the center of an octahedron having a halide ion X at the corner thereof, and the neighboring octahedrons share the corner. The organic cation A is oriented with the cationic group facing the organic layer side. Four cationic groups above and below each octahedron are the corners of a cubic crystal system, and the corner of each octahedron is the face center of a cubic crystal system to constitute a perovskite-type structure.

The organic cation represented by A is preferably an ammonium represented by the general formula (5) below.

$$R_4N^+ \qquad (5)$$

In the general formula (5), R represents a hydrogen atom or a substituent, wherein at least one of the four instances of R is a substituent with a carbon number of 2 or more. Among the four instances of R, the number of substituents with a carbon number of 2 or more is preferably 1 or 2, more preferably 1. Also, in the four instances of R that constitute the ammonium, preferably one of them is a substituent with a carbon number of 2 or more, and the rest are hydrogen atoms. When two or more instances of R are substituents, these substituents may be the same as each other or not. The substituent with a carbon number of 2 or more or any other substituent is not particularly limited, but can be an alkyl group, an aryl group, a heteroaryl group, or the like, wherein such a substituent can be further substituted with an alkyl group, an aryl group, a heteroaryl group, halogen, or the like. The number of carbons in the substituent with a carbon number of 2 or more as an alkyl group is preferably 2 to 30, more preferably 2 to 10, further preferably 2 to 5. In an aryl group, it is preferably 6 to 20, more preferably 6 to 18, further preferably 8 to 10. In a heteroaryl group, it is preferably 5 to 19, more preferably 5 to 17, further preferably 7 to 9. A heteroatom in the heteroaryl group can be a nitrogen atom, an oxygen atom, a sulfur atom, or the like. The thickness of the organic layer will depend on the length of the substituent represented by R (e.g., the chain length of the alkyl group), whereby the characteristics of the functional layer formed from this compound can be controlled.

Preferably, the organic cation represented by A has at least one of an alkylene group and an aromatic ring, preferably both of the alkylene group and the aromatic ring, more preferably a structure formed by joining the alkylene group to the aromatic ring, further preferably an ammonium represented by the general formula (5a) below.

$$Ar(CH_2)_{n1}NH_3 \qquad (5a)$$

In the general formula (5a), Ar represents an aromatic ring. n1 is an integer from 1 to 20.

The aromatic ring in the organic cation may be an aromatic hydrocarbon or an aromatic heterocycle, and is preferably an aromatic hydrocarbon. A heteroatom in the aromatic heterocycle can be a nitrogen atom, an oxygen atom, a sulfur atom, or the like. The aromatic hydrocarbon is: preferably a benzene ring, or a fused polycyclic hydrocarbon that has a structure with more than one benzene ring fused; preferably a benzene ring, naphthalene ring, phenanthrene ring, anthracene ring, chrysene ring, tetracene ring, or perylene ring, preferably a benzene ring or naphthalene ring; further preferably a benzene ring. The aromatic heterocycle is: preferably a pyridine ring, pyrazine ring, pyrimidine ring, pyridazine ring, pyrrole ring, thiophene ring, furan ring, carbazole ring, or triazine ring; more preferably, a pyridine ring, pyrazine ring, pyrimidine ring, or pyridazine ring; further preferably, a pyridine ring. The aromatic ring in the organic cation may have a substituent such as an alkyl group, an aryl group, or a halogen atom (preferably a fluorine atom), wherein a hydrogen atom in the aromatic ring or in the substituent bond to the aromatic ring may be a heavy hydrogen atom.

In the general formula (5a), n1 is an integer from 1 to 20, preferably an integer from 2 to 10.

Besides an ammonium, the organic cation represented by A can be formamidinium, cesium, or the like.

The divalent metal ion represented by B can be $Cu^{2+}$, $Ni^{2+}$, $Mn^{2+}$, $Fe^{2+}$, $CO^{2+}$, $Pd^{2+}$, $Ge^{2+}$, $Sn^{2+}$, $Pb^{2+}$, $Eu^{2+}$, or the like, and is preferably $Sn^{2+}$, or $Pb^{2+}$, more preferably $Sn^{2+}$.

The halide ion represented by X can be a fluoride, chloride, bromide, or iodide ion. The halide ions represented by three instances of X may be the same as each other, or may be a combination of 2 or 3 different halide ions. Preferably, the three instances of X are the same halide ion. More preferably, the three instances of X are each an iodide ion.

Specific preferred examples of the perovskite-type compound represented by the general formula (1) include: tin-based perovskites such as $[CH_3(CH_2)_{n2}NH_3]_2SnI_4$ (n2=2 to 17), $(C_4H_9C_2H_4NH_3)_2SnI_4$, $(CH_3(CH_2)_{n3}(CH_3)CHNH_3)_2SnI_4$ [n3=5 to 8], $(C_6H_5C_2H_4NH_3)_2SnI_4$, $(C_{10}H_7CH_2NH_3)_2SnI_4$, and $(C_6H_5C_2H_4NH_3)_2SnBr_4$; and lead-based perovskites such as $[CH_3(CH_2)_{n2}NH_3]_2PbI_4$ (n2=2 to 17), $(C_4H_9C_2H_4NH_3)_2PbI_4$, $(CH_3(CH_2)_{n3}(CH_3)CHNH_3)_2PbI_4$ [n3=5 to 8], $(C_6H_5C_2H_4NH_3)_2PbI_4$, $(C_{10}H_7CH_2NH_3)_2PbI_4$, and $(C_6H_5C_2H_4NH_3)_2PbBr_4$. However, perovskite-type compounds that may be used in the present invention are not limited to these compounds.

(Compound Represented by General Formula (2))

$$A^2{}_2A^1{}_{n-1}B_nX_{3n+1} \qquad (2)$$

In the general formula (2), $A^2$ represents an organic cation with a carbon number greater than that of $A^1$. In the general formula (2), B and X are as defined for the general formula (1), and $A^2$ in the general formula (2) is as defined for the general formula (1). For the preferred range and specific examples of $A^2$, B, and X in the general formula (2), one can refer to the preferred range and specific examples of A, B, and X in the general formula (1). Here, the two instances of $A^2$, or the plural instances of X, may be the same as each other or not. When plural instances of $A^1$ or B are present, the plural instances of $A^1$ or B may be the same as each other or not.

The organic cation represented by $A^1$ is an organic cation with a carbon number smaller than that of $A^2$, preferably an ammonium represented by the general formula (6) below.

$$R^{11}{}_4N^+ \qquad (6)$$

In the general formula (6), $R^{11}$ represents a hydrogen atom or a substituent, and at least one of the four instances of Rn is a substituent. The number of substituents among the four instances of $R^{11}$ is preferably one or two, more preferably one. That is, among the four instances of $R^{11}$ that constitute the ammonium, preferably one is a substituent and the rest are hydrogen atoms. When two or more instances of $R^{11}$ are substituents, these substituents may be the same as each other or not. The substituents are not particularly limited, but include an alkyl group and an aryl group (phenyl group, naphthyl group, and the like), wherein each substituent may be further substituted with an alkyl group, an aryl group, or the like. The number of carbons in the substituent as an alkyl group is preferably 1 to 30, more preferably 1 to 20, further preferably 1 to 10. In an aryl group, it is preferably 6 to 30, more preferably 6 to 20, further preferably 6 to 10.

Besides an ammonium, the organic cation represented by $A^1$ or $A^2$ can be formamidinium, cesium, or the like.

The compound represented by the general formula (2) forms a layered structure in which inorganic layers formed from octahedral inorganic skeletons $B_nX_{3n+1}$ and organic layers formed from organic cations $A^2$ are alternately layered. n corresponds to the number of layered octahedra per inorganic layer, and is an integer from 1 to 100. When n is 2 or more, organic cations $A^1$ are positioned between the layered octahedra at the corners of the cubic crystal system.

Specific preferred examples of the organic-inorganic perovskite-type compound represented by the general formula (2) include a compound represented by the general formula (2a) below.

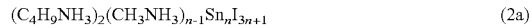
$$(C_4H_9NH_3)_2(CH_3NH_3)_{n-1}Sn_nI_{3n+1} \qquad (2a)$$

In the general formula (2a), n is an integer from 1 to 100, preferably an integer from 1 to 5. Specifically, it can be $(C_4H_9NH_3)_2SnI_4$, $(C_4H_9NH_3)_2(CH_3NH_3)Sn_2I_7$, $(C_4H_9NH_3)_2(CH_3NH_3)_2Sn_3I_{10}$, $(C_4H_9NH_3)_2(CH_3NH_3)_3Sn_4I_{13}$, or $(C_4H_9NH_3)_2(CH_3NH_3)_4Sn_5I_{16}$. Also, specific preferred examples of the organic-inorganic perovskite-type compound represented by the general formula (2) include: $[CH_3(CH_2)_nNH_3)]_2PbI_4$ (n=2 to 17), $(C_4H_9C_2H_4NH_3)_2PbI_4$, $(CH_3(CH_2)_n(CH_3)CHNH_3)_2PbI_4$[n=5 to 8], $(C_6H_5C_2H_4NH_3)_2PbI_4$, $(C_{10}H_7CH_2NH_3)_2PbI_4$, $(C_6H_5C_2H_4NH_3)_2PbBr_4$, and the like. However, perovskite-type compounds that may be used in the present invention are not limited to these compounds.

(Compound Represented by General Formula (3))

$$A^2{}_2A^1{}_mB_mX_{3m+2} \qquad (3)$$

In the general formula (3), $A^2$ represents an organic cation with a carbon number greater than that of $A^1$. In the general formula (3), B and X are as defined for the general formula (1). For the preferred range and specific examples of B and X in the general formula (3), one can refer to the preferred range and specific examples of B and X in the general formula (1), respectively. In the general formula (3), $A^1$ is as defined for the general formula (2). For the preferred range and specific examples of $A^1$ in the general formula (3), one can refer to the preferred range and specific examples of $A^1$ in the general formula (2).

The two instances of $A^2$, or the plural instances of X, may be the same as each other or not. When plural instances of $A^1$ or B are present, the plural instances of $A^1$ or B may be the same as each other or not.

The compound represented by the general formula (3) forms a layered structure in which inorganic layers formed from inorganic skeletons $B_mX_{3m+2}$ and organic layers formed from organic cations $A^2$ are alternately layered. m corresponds to the number of layered inorganic skeletons per inorganic layer, and is an integer from 1 to 100.

The organic cation represented by $A^2$ is an organic cation with a carbon number greater than that of $A^1$, preferably an ammonium represented by the general formula (6) above, more preferably an ammonium represented by the general formula (7) below.

$$(R^{12}{}_2C=NR^{13}{}_2)^+ \quad (7)$$

In the general formula (7), $R^{12}$ and $R^{13}$ each independently represent a hydrogen atom or a substituent, wherein one instance of $R^{12}$ may be the same as another one or not, and one instance of $R^{13}$ may be the same as another one or not. The substituents are not particularly limited, but include an alkyl group, an aryl group, an amino group, a halogen atom, and the like, wherein the alkyl group, the aryl group, or the amino group can be further substituted with an alkyl group, an aryl group, an amino group, a halogen atom, or the like. The number of carbons in the substituent as an alkyl group is preferably 1 to 30, more preferably 1 to 20, further preferably 1 to 10. In an aryl group, it is preferably 6 to 30, more preferably 6 to 20, further preferably 6 to 10. The thickness of the organic layer will depend on the length of the substituent represented by $R^{12}$ (e.g., the chain length of the alkyl group), whereby the characteristics of the functional layer formed from this mixture can be controlled. To make a combination of $R^{12}$ and $R^{13}$, an amino group or a halogen atom as $R^{12}$ and a hydrogen atom or an alkyl group as $R^{13}$ can be employed in combination, for example. Alternatively, an amino group or a halogen atom as $R^{12}$ and a hydrogen atom as $R^{13}$ can be employed in combination.

Besides an ammonium, the organic cation represented by $A^2$ can be formamidinium, cesium, or the like.

Specific preferred examples of the organic-inorganic perovskite-type compound represented by the general formula (3) include a compound represented by the general formula (3a) below.

$$[NH_2C(I)=NH_2]_2(CH_3NH_3)_mSn_mI_{3m+2} \quad (3a)$$

In the general formula (3a), m is an integer from 2 to 100, preferably an integer from 2 to 5. Specifically, it can be $[NH_2C(I)=NH_2]_2(CH_3NH_3)_2Sn_2I_8$, $[NH_2C(I)=NH_2]_2(CH_3NH_3)_3Sn_3I_{11}$, or $[NH_2C(I)=NH_2]_2(CH_3NH_3)_4Sn_4I_{14}$. However, the perovskite-type compounds that may be used in the present invention are not limited to these compounds.

The total number of the inorganic layers and the organic layers formed of the compound of the general formulae (1) to (3) is preferably 1 to 100, more preferably 1 to 50, even more preferably 5 to 20.

(Compound Represented by General Formula (4))

$$A^3BX_3 \quad (4)$$

In the general formula (4), $A^3$ represents an organic cation. B and X in the general formula (4) each have the same meanings as those of B and X in the general formula (1). For preferred ranges and specific examples of B and X in the general formula (4), reference may be made to the preferred ranges and the specific examples of B and X in the general formula (1). B in the compound represented by the general formula (4) is preferably a fluoride ion, and also preferably a combination of an iodide ion and a fluoride ion. For preferred ranges and specific examples of $A^3$ in the general formula (4), reference may be made to the preferred ranges and the specific examples of $A^1$ in the general formula (2). Three X's may be the same as or different from each other.

The compound represented by the general formula (4) forms a cubic perovskite structure having a unit lattice of a cubic crystal system, in which the organic cation A is positioned at each corner of the cubic crystal, the metal ion B is positioned at the body center thereof, and the halide ion X is positioned at each face center thereof. Here, the inorganic skeleton of the metal ion B and the halide ion X forms an octahedron.

Preferred examples of the perovskite-type compound represented by the general formula (4) include $CH_3NH_3PbI_3$, $CH_3NH_3PbCl_3$, $CH_3NH_3PbBr_3$, $CH_3NH_3SnI_3$, $CH_3NH_3SnI_qF_{3-q}$ (where q is an integer of 0 to 2), $CH_3NH_3SnCl_3$, $CH_3NH_3SnBr_3$, $(NH_2)_2CHSnI_3$, and $CsSnCl_3$. $CH_3NH_3PbI_3$, $CH_3NH_3SnI_qF_{3-q}$, and $(NH_2)_2CHSnI_3$ are preferred. However, the perovskite-type compounds for use in the present invention are not limitatively interpreted by these compounds.

Among the above-mentioned perovskite-type compounds, preferred are those containing at least one of $Sn^{2+}$ and $Pb^{2+}$ as a metal ion, those containing at least one of methylammonium, formamidinium and cesium as an organic cation or an inorganic cation, and those containing at least one of $Cl^-$, $I^-$, and $F^-$ as a halide ion. Among the compounds represented by the general formula (1) to the general formula (4), the compounds represented by the general formula (4) are preferred, $CH_3NH_3PbCl_3$, $CH_3NH_3SnI_3$, and $CsSnCl_3$ are more preferred, and $CH_3NH_3PbCl_3$ is most preferred.

One kind alone or two or more kinds of the perovskite-type compounds may be used either singly or as combined. A preferred combination is a combination of two or more of $CH_3NH_3SnI_3$, and $CH_3NH_3SnI_qF_{3-q}$ (where q is an integer of 0 to 2).

[Thickness of Perovskite Layer]

The thickness of the perovskite layer in the present invention is 50 nm or more, and is, from the viewpoint of more surely suppressing interelectrode short-circuiting and current leakage, preferably 80 nm or more, more preferably 100 nm or more, even more preferably 200 nm or more. The thickness of the perovskite layer may be, for example, 10000 nm or less. From the viewpoint of realizing a high emission efficiency and a low drive voltage, the thickness is preferably 1200 nm or less, more preferably 1100 nm or less, even more preferably 1000 nm or less.

The thickness of the perovskite layer may be measured using an electron microscope or an atomic force microscope, or using a stylus-type film thickness measuring apparatus, or according to a spectral ellipsometry or using a confocal microscope. A concrete numerical value of the thickness of the perovskite layer in the present invention is a layer thickness measured with an electron microscope.

[Carrier Mobility of Perovskite Layer]

The carrier mobility of the perovskite layer in the present invention is preferably $10^{-2}$ to $10^3$ $cm^2V^{-1}s^{-1}$, more preferably $10^{-1}$ to $10^2$ $cm^2V^{-1}s^{-1}$. With that, even when the perovskite layer has a thickness of 1000 nm or so and is thick, a low drive voltage and a high power efficiency can be surely realized.

The carrier mobility of the perovskite layer can be determined by preparing a hole transport device so configured as to have a perovskite layer and to carry out hole transport alone of carrier transport, and an electron transport device so configured as to have a perovskite layer and to carry out electron transport alone of carrier transport, then operating the two to determine the voltage and the current density thereof from the double logarithmic chart of current density-voltage characteristic, and fitting the data according to a space charge limited current system. Regarding the specific configurations of the hole transport device and the electron transport device and the space charge limited current system to be employed here, the section of (Experimental Example 3) to be given hereinunder may be referred to.

[Photoabsorption Characteristic of Perovskite Layer]

The perovskite layer for use in the organic light-emitting device of the present invention preferably does not have a maximum absorption wavelength at 200 to 750 nm in the emission wavelength range of the light-emitting material to be used in the organic light-emitting device, more preferably does not have a maximum absorption wavelength at 200 to 2000 nm. With that, the light takeoff efficiency from the organic light-emitting device can be high. Here, the emission wavelength range of a light-emitting material is a wavelength region within a range of $\lambda_{max} \pm 100$ nm, wherein means a maximum emission wavelength of the light-emitting material existing in a visible light region of 380 to 750 nm.

[Method for Forming Perovskite Layer]

A method for forming the perovskite layer is not specifically limited, and the layer may be formed according to a dry process such as a vacuum evaporation method, or a wet process such as a solution coating method. The perovskite layer can be formed according to any such film formation process, and is advantageous in that the layer formation process can be selected in accordance with the convenience of the other production steps. Here, when a solution coating method is employed, the layer can be formed using a simple apparatus within a short period of time, and is therefore advantageous in point of cost reduction for industrial scale mass-production. When a vacuum evaporation method is employed, its advantage is that a perovskite layer having a better surface condition can be formed.

For example, for forming a perovskite layer of a perovskite-type compound $A^3BX_3$ is formed according to a vacuum evaporation method, employable is a co-evaporation method of co-evaporating a compound $A^3X$ of an organic cation and a halide ion, and a metal halide compound $BX_2$ from different evaporation sources. A perovskite layer of any other perovskite-type compound represented by the above-mentioned general formulae than the compound can also be formed by co-evaporating a compound of an organic cation and a halide ion and a metal halide compound according to this method.

For forming a perovskite layer of a perovskite-type compound $A^3BX_3$ according to a solution coating method, a compound $A^3X$ of an organic cation and a halide ion, and a metal halide compound $BX_2$ are reacted in a solution to synthesize a perovskite-type compound, then a coating liquid containing the perovskite-type compound is applied onto the surface of a support, and drying it to form a perovskite layer thereon. A perovskite layer of any other perovskite-type compound represented by the above-mentioned general formulae than the compound can also be formed according to this method by reacting a compound of an organic cation and a halide ion and a metal halide compound in a solvent to prepare a coating liquid containing a perovskite-type compound, and applying the coating liquid onto the surface of a support and drying it to form a perovskite layer thereon.

A coating method with a coating liquid is not specifically limited, and any conventionally-known coating method such as a gravure coating method, a bar coating method, a printing method, a spraying method, a spin coating method, a dipping method or a die coating method may be used. Since a relatively thin coating film can be formed uniformly, a spin coating method is preferred.

The solvent for the coating liquid is not particularly limited as long as it can dissolve the perovskite-type compound. Specifically, it can be an ester (methyl formate, ethyl formate, propyl formate, pentyl formate, methyl acetate, ethyl acetate, pentyl acetate, or the like), a ketone (γ-butyrolactone, N-methyl-2-pyrrolidone, acetone, dimethyl ketone, diisobutyl ketone, cyclopentanone, cyclohexanone, methyl cyclohexanone, or the like), an ether (diethyl ether, methyl-tert-butyl ether, diisopropyl ether, dimethoxymethane, dimethoxyethane, 1,4-dioxane, 1,3-dioxolan, 4-methyldioxolan, tetrahydrofuran, methyl tetrahydrofuran, anisole, phenetole, or the like), an alcohol (methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, 2,2,3,3-tetrafluoro-1-propanol, or the like), a glycol ether (cellosolve) (ethylene glycol monomethyl ether, ethylene glycol monoethyl ether, ethylene glycol monobutyl ether, ethylene glycol monoethyl ether acetate, triethylene glycol dimethyl ether, or the like), an amide solvent (N,N-dimethyl formamide, acetamide, N,N-dimethyl acetamide, or the like), a nitrile solvent (acetonitrile, isobutyronitrile, propionitrile, methoxyacetonitrile, or the like), a carbonate agent (ethylene carbonate, propylene carbonate, or the like), a halogenated hydrocarbon (methylene chloride, dichloromethane, chloroform, or the like), a hydrocarbon (n-pentane, cyclohexane, n-hexane, benzene, toluene, xylene, or the like), dimethyl sulfoxide, or the like. It can also have two or more of ester, ketone, ether, and alcohol functional groups (i.e., —O—, —CO—, —COO—, —OH), or it can be an ester, a ketone, an ether, or an alcohol in which a hydrogen atom in the hydrocarbon portion is replaced by a halogen atom (particularly a fluorine atom).

The amount of the perovskite-type compound contained in the coating liquid is preferably 1 to 50% by mass based on the entire coating liquid, more preferably 2 to 30% by mass, further preferably 5 to 20% by mass.

Preferably, the coating liquid on the support surface is dried by air-drying or heat drying in an atmosphere purged with an inert gas such as nitrogen.

[Layer Configuration of Organic Light-Emitting Device]

The organic light-emitting device of the present invention has at least a perovskite layer having a thickness of 50 nm or more. The organic light-emitting device to which the present invention applies may be an organic photoluminescent device (organic PL device) or an organic electroluminescent device (organic EL device), but is preferably an organic electroluminescent device.

An organic photoluminescent device has a configuration with at least a perovskite layer formed on a substrate, and in addition to the perovskite layer, preferably has at least one light-emitting layer. In a case of an organic photoluminescent device having a perovskite layer and a light-emitting layer, the perovskite layer maybe arranged between the substrate and the light-emitting layer, or may be arranged on the side of the light-emitting layer opposite to the substrate.

An organic electroluminescent device has a configuration having at least an anode and a cathode and a layered light-emitting part arranged between the anode and the cathode. The light-emitting part contains at least a perovskite layer, and preferably has at least a light-emitting layer in addition to the perovskite layer. In the case where the light-emitting part has a perovskite layer and a light-emitting layer, the perovskite layer may be arranged between the light-emitting layer and the anode, or may be arranged between the light-emitting layer and the cathode. The perovskite layer may be arranged between the light-emitting layer and the anode and between the light-emitting layer and the cathode, and is preferably arranged between the light-emitting layer and the anode and between the light-emitting layer and the cathode. The perovskite layer has bipolarity of transporting both holes and electrons, and between a light-emitting layer and an anode, it efficiently transport holes from the anode toward the light-emitting layer side, and between a light-emitting layer and a cathode, the perovskite layer has a function of efficiently transporting electrons from the cathode toward the light-emitting layer side. The light-emitting part may have one or more functional layers in addition to the perovskite layer and the light-emitting layer. Such other functional layers include a hole transport layer or an electron transport layer, a hole injection layer, an electron blocking layer, a hole blocking layer, an electron injection layer, and an exciton blocking layer. The hole transport layer may be a hole injection and transport layer having a hole injection function, and the electron transport layer may be an electron injection and transport layer having an electron injection function. At least one of the hole transport layer and the electron transport layer is preferably the perovskite layer in the present invention, and both the hole transport layer and the electron transport layer are preferably the perovskite layers in the present invention. A configuration example of a typical organic electroluminescent device is shown in FIG. 1. In FIG. 1, 1 is a substrate, 2 is an anode, 3 is a hole injection layer, 4 is a first perovskite layer, 5 is a light-emitting layer, 6 is a second perovskite layer, and 7 is an electro injection layer and 8 is a cathode.

In the following, the constituent members and the layers of the organic electroluminescent device are described. The description of the substrate and the light-emitting layer given below may apply to the substrate and the light-emitting layer of an organic photoluminescent device.

(Substrate)

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

(Anode)

The anode of the organic electroluminescent device used is preferably formed of an electrode material, such as a metal, an alloy, or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being coated, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness of the anode may be generally selected from a range of from 10 to 1,000 nm, and preferably 10 to 200 nm, while depending on the material used.

(Cathode)

The cathode is preferably formed of as an electrode material such as a metal (which is referred to as an electron injection metal), an alloy, or an electroconductive compound, having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, is preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

(Light-Emitting Layer)

The light-emitting layer is a layer in which holes and electrons injected from an anode and a cathode are recombined to give excitons for light emission. A light-emitting material may be used singly in the light-emitting layer, but preferably, the layer contains a light-emitting layer and a host material. The light-emitting material may be any of a fluorescent material, a delayed fluorescent material or a phosphorescent material, but a delayed fluorescent material is preferably used as the ability thereof to readily provide a high emission efficiency. Here, delayed fluorescence is such that, in a compound in an excited state, after reverse intersystem crossing from an excited triplet state to an excited singlet state, a fluorescence is emitted in returning back from the exited singlet state to a ground state, and is generally observed later than the fluorescence (ordinary fluorescence) from the excited singlet state directly transited from a ground state. A delayed fluorescent material is a light-emitting material that emits such delayed fluorescence.

In order that the organic electroluminescent device and the organic photoluminescent device of the present invention can express a high light emission efficiency, it is important to confine the singlet exciton and the triplet exciton formed in the light-emitting material to the light-emitting material. Accordingly, preferably, a host material is used in addition to the light-emitting material in the light-emitting layer. As the host material, an organic compound, of which at least any one of the excited singlet energy and the excited triplet energy is higher than that of the light-emitting material, may be used. As a result, the singlet exciton and the triplet exciton formed in the light-emitting material can be confined to the molecule of the light-emitting material of the present invention to sufficiently derive the light emission efficiency thereof. Needless-to-say, there may be a case where a high light emission efficiency could be attained even though the singlet exciton and the triplet exciton could not be sufficiently confined, and therefore, any host material capable of realizing a high light emission efficiency can be used in the present invention with no specific limitation. In the organic light-emitting device or the organic electroluminescent device of the present invention, light emission occurs from the light-emitting material of the present invention contained in the light-emitting layer. The light emission may be any of fluorescent emission, delayed fluorescent emission or phosphorescent emission, or may two or more types of such emissions. In addition, a part of light emission may be partially from a host material.

In the case where a host material is used, the content of the compound of the present invention serving as a light-emitting material is preferably 0.1% by weight or more, more preferably 1% by weight or more, and is preferably 50% by weight or less, more preferably 20% by weight or less, even more preferably 10% by weight or less.

The host material in the light-emitting layer is preferably an organic compound having hole transport competence and electron transport competence, capable of preventing prolongation of emission wavelength and having a high glass transition temperature.

In addition to a light-emitting material and a host material, the light-emitting layer may further contain an assist dopant that assists emission from the light-emitting material. As the assist dopant, usable is a compound having an excitation singlet energy level between the excitation singlet energy of the host material and the excitation singlet energy of the light-emitting material, and capable of undergoing reverse intersystem crossing from an excited triplet state to an excited singlet state. Whether or not the compound undergoes such reverse intersystem crossing can be confirmed through observation of delayed fluorescence radiation.

As described above, the light-emitting material in the light-emitting layer is preferably a delayed fluorescent material as providing a high emission efficiency. The reason why a high emission efficiency can be attained by a delayed fluorescent material is because of the following principle.

In an organic electroluminescent device, carriers are injected from an anode and a cathode to a light-emitting material to form an excited state for the light-emitting material, with which light is emitted. In the case of a carrier injection type organic electroluminescent device, in general, excitons that are excited to the excited singlet state are 25% of the total excitons generated, and the remaining 75% thereof are excited to the excited triplet state. Accordingly, the use of phosphorescence, which is light emission from the excited triplet state, provides a high energy utilization. However, the excited triplet state has a long lifetime and thus causes saturation of the excited state and deactivation of energy through mutual action with the excitons in the excited triplet state, and therefore the quantum yield of phosphorescence may generally be often not high. A delayed fluorescent material emits fluorescent light through the mechanism that the energy of excitons transits to the excited triplet state through intersystem crossing or the like, and then transits to the excited singlet state through reverse intersystem crossing due to triplet-triplet annihilation or absorption of thermal energy, thereby emitting fluorescent light. It is considered that among the materials, a thermal activation type delayed fluorescent material emitting light through absorption of thermal energy is particularly useful for an organic electroluminescent device. In the case where a delayed fluorescent material is used in an organic electroluminescent device, the excitons in the excited singlet state normally emit fluorescent light. On the other hand, the excitons in the excited triplet state emit fluorescent light through intersystem crossing to the excited singlet state by absorbing the heat generated by the device. At this time, the light emitted through reverse intersystem crossing from the excited triplet state to the excited singlet state has the same wavelength as fluorescent light since it is light emission from the excited singlet state, but has a longer lifetime (light emission lifetime) than the normal fluorescent light, and thus the light is observed as fluorescent light that is delayed from the normal fluorescent light. The light may be defined as delayed fluorescent light. The use of the thermal activation type exciton transition mechanism may raise the proportion of the compound in the excited singlet state, which is generally formed in a proportion only of 25%, to 25% or more through the absorption of the thermal energy after the carrier injection. A compound that emits strong fluorescent light and delayed fluorescent light at a low temperature of lower than 100° C. undergoes the intersystem crossing from the excited triplet state to the excited singlet state sufficiently with the heat of the device, thereby emitting delayed fluorescent light, and thus the use of the compound may drastically enhance the light emission efficiency.

(Injection Layer)

The injection layer is a layer that is provided between the electrode and the organic layer, for decreasing the driving voltage and enhancing the light emission luminance, and includes a hole injection layer and an electron injection layer, which may be provided between the anode and the light-emitting layer or the hole transport layer and between the cathode and the light emitting layer or the electron transport layer. The injection layer may be provided depending on necessity.

(Blocking Layer)

The blocking layer is a layer that is capable of inhibiting charges (electrons or holes) and/or excitons present in the light-emitting layer from being diffused outside the light-emitting layer. The electron blocking layer may be disposed between the light-emitting layer and the hole transport layer, and inhibits electrons from passing through the light-emitting layer toward the hole transport layer. Similarly, the hole blocking layer may be disposed between the light-emitting layer and the electron transport layer, and inhibits holes from passing through the light-emitting layer toward the electron transport layer. The blocking layer may also be used for inhibiting excitons from being diffused outside the light-emitting layer. Thus, the electron blocking layer and the hole blocking layer each may also have a function as an exciton blocking layer. The term "the electron blocking layer" or "the exciton blocking layer" referred to herein is intended to include a layer that has both the functions of an electron blocking layer and an exciton blocking layer by one layer.

(Hole Blocking Layer)

The hole blocking layer has the function of an electron transport layer in a broad sense. The hole blocking layer has a function of inhibiting holes from reaching the electron transport layer while transporting electrons, and thereby enhances the recombination probability of electrons and holes in the light-emitting layer. As the material for the hole blocking layer, the material for the electron transport layer to be mentioned below may be used optionally.

(Electron Blocking Layer)

The electron blocking layer has the function of transporting holes in a broad sense. The electron blocking layer has a function of inhibiting electrons from reaching the hole transport layer while transporting holes, and thereby enhances the recombination probability of electrons and holes in the light-emitting layer.

(Exciton Blocking Layer)

The exciton blocking layer is a layer for inhibiting excitons generated through recombination of holes and electrons in the light-emitting layer from being diffused to the charge transporting layer, and the use of the layer inserted enables effective confinement of excitons in the light-emitting layer, and thereby enhances the light emission efficiency of the device. The exciton blocking layer may be inserted adjacent to the light-emitting layer on any of the side of the anode and the side of the cathode, and on both the sides. Specifically, in the case where the exciton blocking layer is present on the side of the anode, the layer may be inserted between the hole transport layer and the light-emitting layer and adjacent to the light-emitting layer, and in the case where the layer is inserted on the side of the cathode, the layer may be inserted between the light-emitting layer and the cathode and adjacent to the light-emitting layer. Between the anode and the exciton blocking layer that is adjacent to the light-emitting layer on the side of the anode, a hole injection layer, an electron blocking layer and the like may be provided, and between the cathode and the exciton blocking layer that is adjacent to the light-emitting layer on the side of the cathode, an electron injection layer, an electron transport layer, a hole blocking layer and the like may be provided. In the case where the blocking layer is provided, preferably, at least one of the excited singlet energy and the excited triplet energy of the material used as the blocking layer is higher than the excited singlet energy and the excited triplet energy of the light-emitting layer, respectively, of the light-emitting material.

(Hole Transport Layer)

The hole transport layer is formed of a hole transport material having a function of transporting holes, and the hole transport layer may be provided as a single layer or plural layers. In the present invention, as the hole transport layer, a perovskite layer having a thickness of 50 nm or more may be arranged. With that, the holes injected from the anode side toward the hole transport layer can be efficiently transported toward the light-emitting layer side of the hole transport layer, and even when the drive voltage of the organic light-emitting layer is lowered, the power efficiency can be still improved. In addition, even when the hole transport layer is thickened, a sufficient hole transport efficiency can be secured, and therefore a thick hole transport layer can be formed to evade interelectrode short-circuiting and current leakage.

In the case where the other functional layer than the hole transport layer is formed of a perovskite layer having a thickness of 50 nm or more, the hole transport layer may be formed of any other hole transport material than the perovskite layer having a thickness of 50 nm or more. The other hole transport material has one of injection or transporting property of holes and blocking property of electrons, and may be any of an organic material and an inorganic material. Examples of known hole transport materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer.

Among these, a porphyrin compound, an aromatic tertiary amine compound and a styrylamine compound are preferably used, and an aromatic tertiary amine compound is more preferably used.

(Electron Transport Layer)

The electron transport layer is formed of a material having a function of transporting electrons, and the electron transport layer may be a single layer or may be formed of plural layers. In the present invention, as the electron transport layer, a perovskite layer having a thickness of 50 nm or more may be arranged. With that, the electrons injected from the cathode side toward the electron transport layer can be efficiently transported toward the light-emitting layer side of the electron transport layer, and even when the drive voltage of the organic light-emitting layer is lowered, the power efficiency can be still improved. In addition, even when the electron transport layer is thickened, a sufficient electron transport efficiency can be secured, and therefore a thick electron transport layer can be formed to evade interelectrode short-circuiting and current leakage.

In the case where the other functional layer than the electron transport layer is formed of a perovskite layer having a thickness of 50 nm or more, the electron transport layer may be formed of any other electron transport material than the perovskite layer having a thickness of 50 nm or more. The other electron transport material (often also acting as a hole blocking material) may have a function of transmitting the electrons injected from a cathode to a light-emitting layer. The electron transport layer usable here includes, for example, nitro-substituted fluorene derivatives, diphenylquinone derivatives, thiopyran dioxide derivatives, carbodiimides, fluorenylidenemethane derivatives, anthraquinodimethane and anthrone derivatives, oxadiazole derivatives, etc. Further, thiadiazole derivatives derived from the above-mentioned oxadiazole derivatives by substituting the oxygen atom in the oxadiazole ring with a sulfur atom, and quinoxaline derivatives having a quinoxaline ring known as an electron-attractive group are also usable as the electron transport material. Further, polymer materials prepared by introducing these materials into the polymer chain, or having these material in the polymer main chain are also usable.

As described above, the organic electroluminescent device may have a perovskite layer having a thickness of 50 nm or more as any other layer than the hole transport layer and the electron transport layer (hereinafter referred to as "the other layer"). In such a case, the perovskite layer having a thickness of 50 nm or more may be used as the other layer alone, or may be used as both the hole transport layer or the electron transport layer and the other layer, or as all the hole transport layer, the electron transport layer and the other layer. In the case where the device has plural perovskite layers each having a thickness of 50 nm or more, the kind of the perovskite compound to be used in each perovskite layer and the thickness of each perovskite layer may be the same or different.

In producing an organic electroluminescent device, each organic layer to constitute the organic electroluminescent device is sequentially formed on a substrate. A method for forming such layers is not specifically limited, and may be any of a dry process or a wet process.

Preferred materials for use for the organic electroluminescent device are concretely exemplified below. However, the materials for use in the present invention are not limitatively interpreted by the following exemplary compounds.

Compounds, even though exemplified as materials having a specific function, can also be used as other materials having any other function.
First, as preferred examples of a light-emitting material for use in a light-emitting layer, exemplary compounds of a delayed fluorescent material are given below.
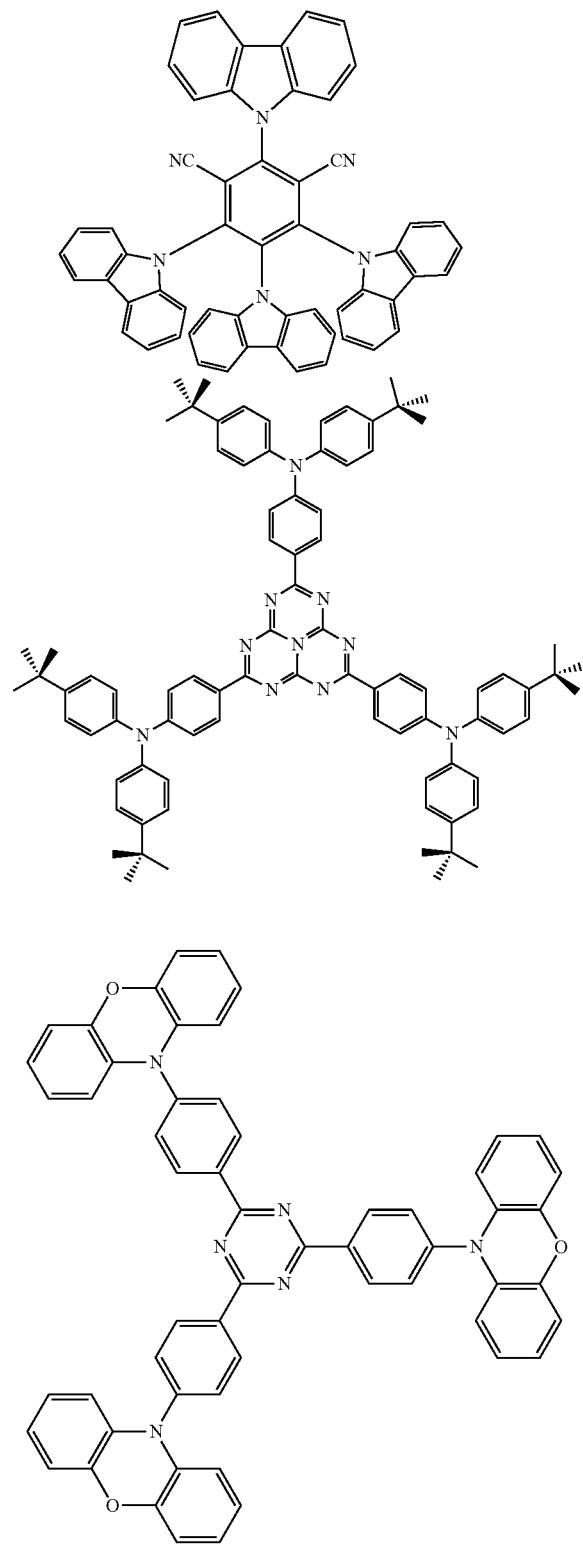
-continued
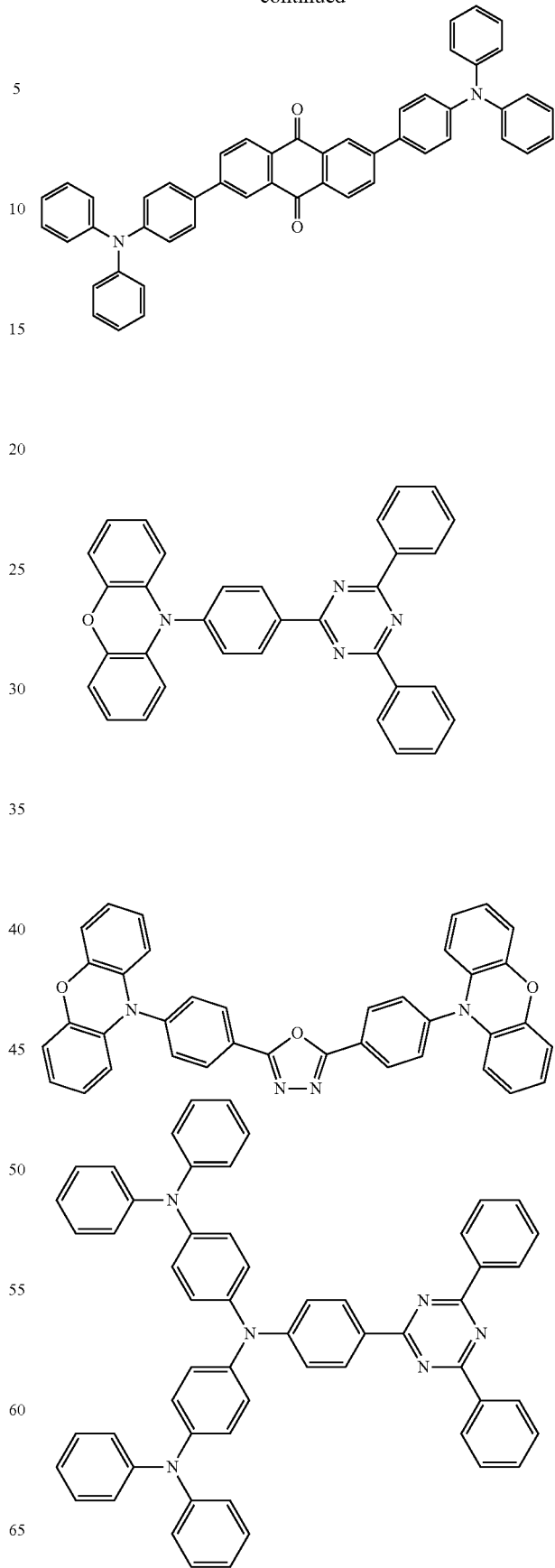

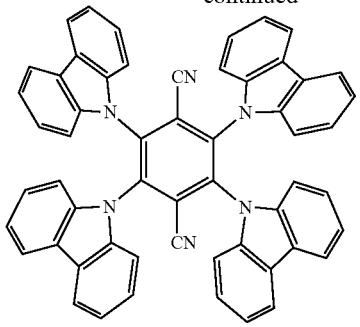

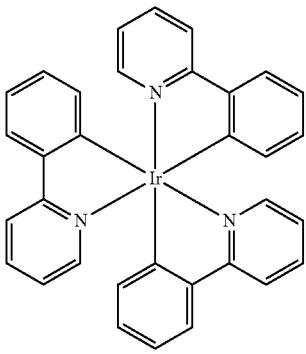

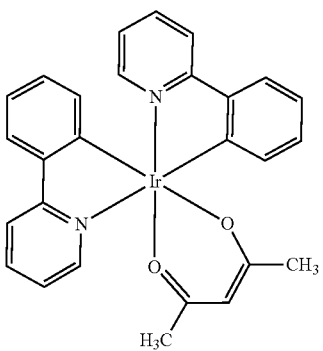

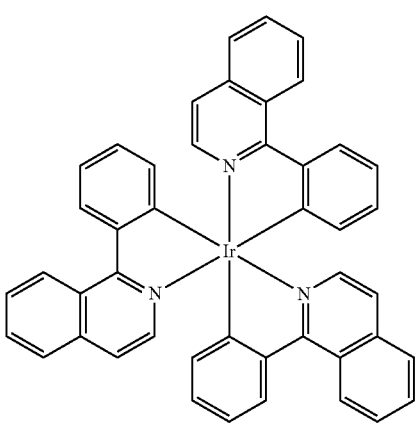

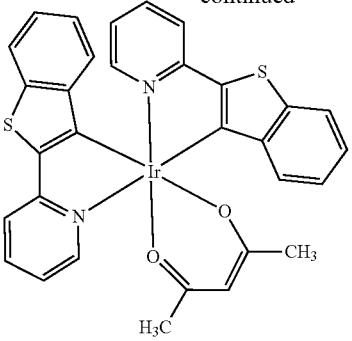

As preferred delayed fluorescent materials, also mentioned are compounds included in the general formulae, especially exemplary compounds capable of emitting delayed fluorescence described in WO2013/154064, paragraphs 0008 to 0048 and 0095 to 0133, WO2013/011954, paragraphs 0007 to 0047 and 0073 to 0085, WO2013/011955, paragraphs 0007 to 0033 and 0059 to 0066, WO2013/081088, paragraphs 0008 to 0071 and 0118 to 0133, JP 2013-256490 A, paragraph 0009 to 0046 and 0093 to 0134, JP 2013-116975 A, paragraphs 0008 to 0020 and 0038-0040, WO2013/133359, paragraphs 0007 to 0032 and 0079 to 0084, WO2013/161437, paragraphs 0008 to 0054 and 0101 to 0121, JP 2014-9352 A, paragraphs 0007 to 0041 and 0060 to 0069, and JP 2014-9224 A, paragraphs 0008 to 0048 and 0067 to 0076. In addition, light-emitting materials described in the following and capable of emitting delayed fluorescence are also preferably employed: JP 2013-253121 A, WO2013/133359, WO2014/034535, WO2014/1 15743, WO2014/122895, WO2014/126200, WO2014/136758, WO2014/133121, WO2014/136860, WO2014/196585, WO2014/189122, WO2014/168101, WO2015/008580, WO2014/203840, WO2015/002213, WO2015/016200, WO2015/019725, WO2015/072470, WO2015/108049, WO2015/080182, WO2015/072537, WO2015/080183, JP 2015-129240 A, WO2015/129714, WO2015/129715, WO2015/133501, WO2015/136880, WO2015/137244, WO2015/137202, WO2015/137136, WO2015/146541, and WO2015/159541. These patent publications as described in this paragraph are incorporated herein by reference as a part of this description.

Compounds represented by the following general formulae (A) to (F) and compounds having a structure described below capable of emitting delayed fluorescence are also preferably used as a delayed fluorescent material in the present invention.

First, compounds represented by a general formula (A) are described.

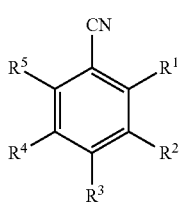

(A)

In the general formula (A), one or more of $R^1$, $R^2$, $R^3$, $R^4$ and $R^5$ each represent a 9-carbazolyl group having a substituent on at least one of the 1-position or the 8-position, a 10-phenoxazyl group having a substituent on at least one of the 1-position or the 9-position, or a 10-phenothiazyl group having a substituent on at least one of the 1-position or the 9-position, and the remaining groups thereof each represent a hydrogen atom or a substituent, but the substituent is not a 9-carbazolyl group having a substituent on at least one of the 1-position or the 8-position, a 10-phenoxazyl group having a substituent on at least one of the 1-position or the 9-position, or a 10-phenothiazyl group having a substituent on at least one of the 1-position or the 9-position. One or more carbon atoms constituting each ring skeleton of the 9-carbazolyl group, the 10-phenoxazyl group and the 10-phenothiazyl group may be substituted with a nitrogen atom.

Specific examples (m-D1 to m-D9) of the "9-carbazolyl group having a substituent on at least one of the 1-position or the 8-position" represented by one or more of $R^1$, $R^2$, $R^3$, $R^4$ and $R^5$ in the general formula (A) are shown below.

m-D1
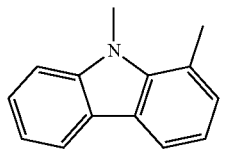

m-D2
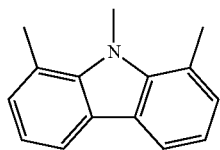

m-D3
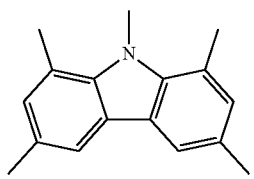

m-D4
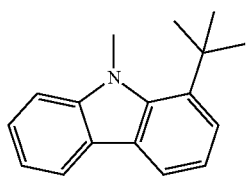

m-D5
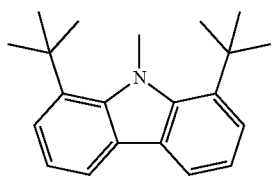

m-D6
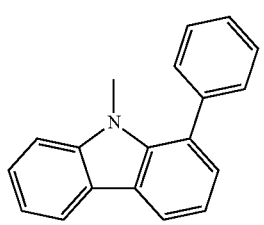

m-D7
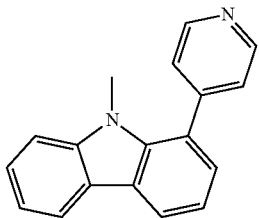

m-D8
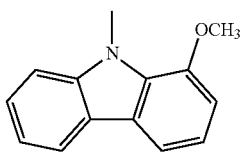

m-D9
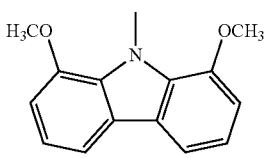

Specific examples (Cz, Cz-1 to 12) of the "substituent" represented by the remaining groups except the above-mentioned "one or more" of $R^1$, $R^2$, $R^3$, $R^4$ and $R^5$ in the general formula (A) are shown below.

Cz
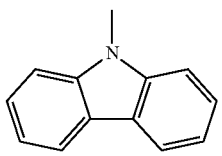

Cz1
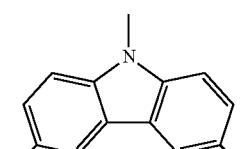

Cz2
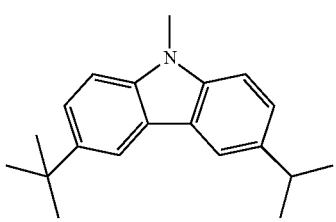

Cz3
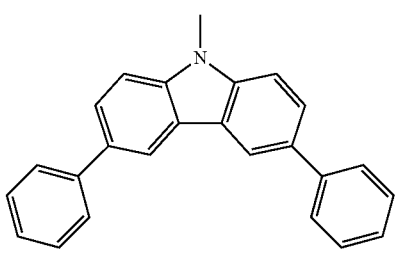

Cz4
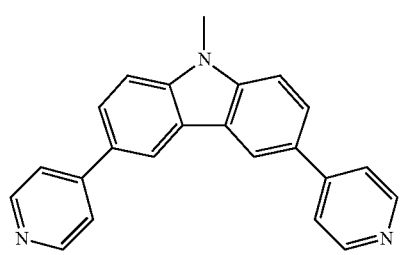
Cz5
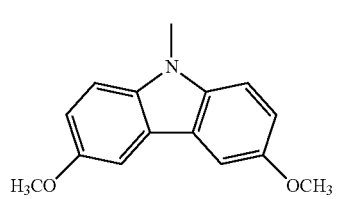
Cz6
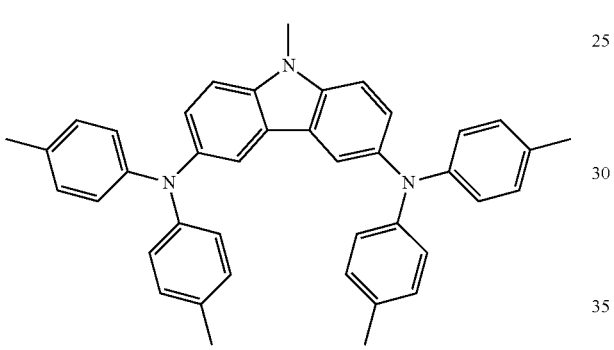
Cz7
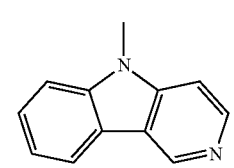
Cz8
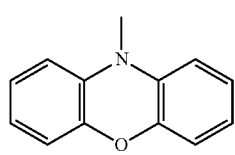
Cz9
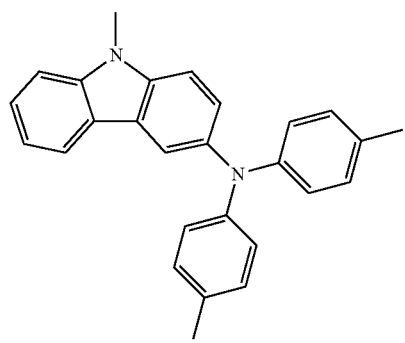
Cz10
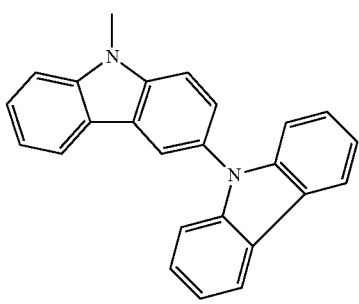
Cz11
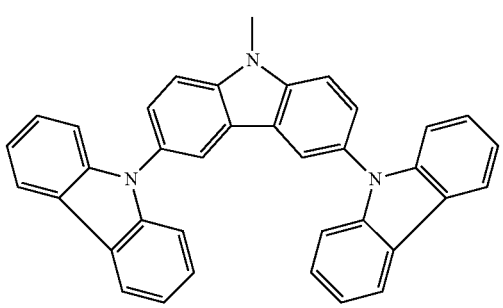
Cz12
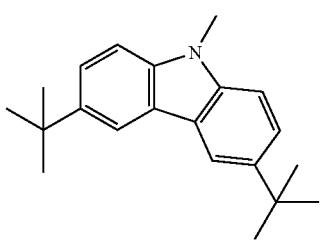
Specific examples of the compounds represented by the general formula (A) are shown below.
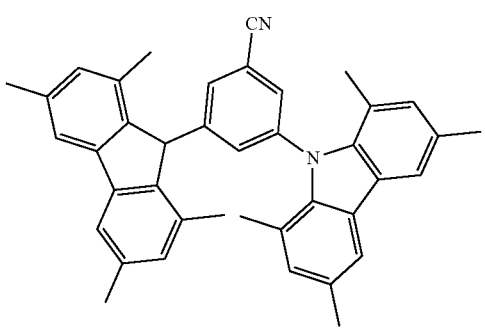

-continued

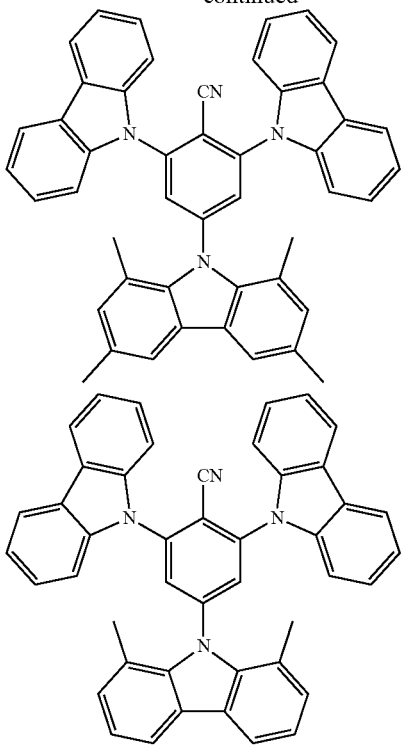

Next, compounds represented by a general formula (B) are described.

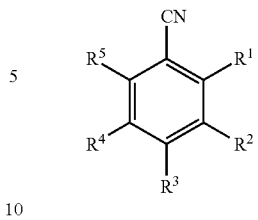

(B)

In the general formula (B), three or more of $R^1$, $R^2$, $R^4$ and $R^5$ each independently represent a substituted or unsubstituted 9-carbazolyl group, a substituted or unsubstituted 10-phenoxazyl group, a substituted or unsubstituted 10-phenothiazyl group, or a cyano group, the remaining groups each represent a hydrogen atom or a substituent, but the substituent is not a substituted or unsubstituted 9-carbazolyl group, a substituted or unsubstituted 10-phenoxazyl group, or a substituted or unsubstituted 10-phenothiazyl group. One or more carbon atoms constituting each ring skeleton of the substituted or unsubstituted 9-carbazolyl group, the substituted or unsubstituted 10-phenoxazyl group and the substituted or unsubstituted 10-phenothiazyl group may be substituted with a nitrogen atom. $R^3$ each independently represents a hydrogen atom or a substituent, but the substituent is not a substituted or unsubstituted 9-carbazolyl group, a substituted or unsubstituted 10-phenoxazyl group, a cyano group, a substituted or unsubstituted 10-phenothiazyl group, a substituted or unsubstituted aryl group, a substituted or unsubstituted heteroaryl group, or a substituted or unsubstituted alkynyl group.

Specific examples (D1 to D42) of $R^1$, $R^2$, $R^4$ and $R^5$ in the general formula (B) are shown below.

D1

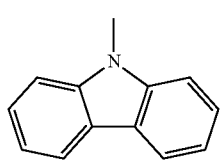

D2

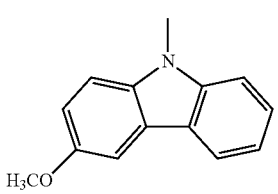

D3

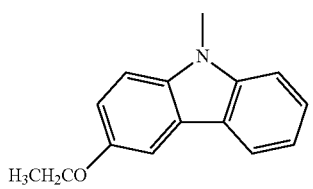

D4

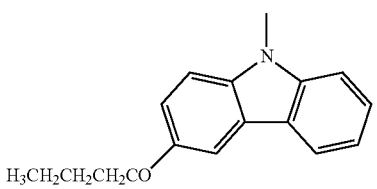

-continued
D5
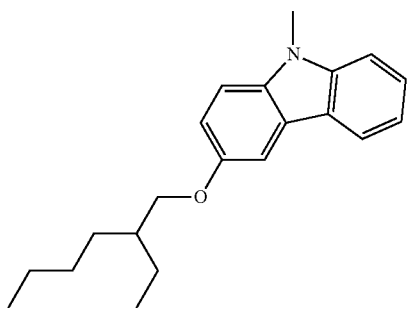
D6
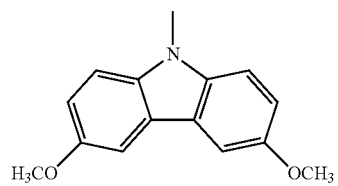
D7
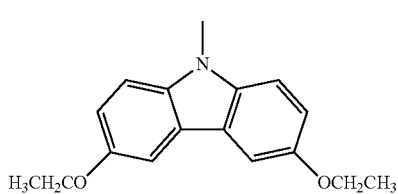
D8
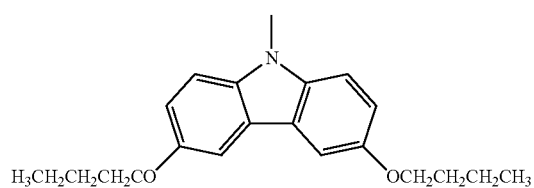
D9
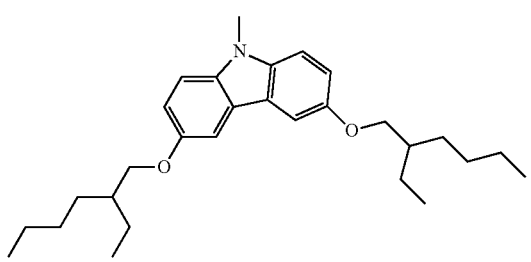
D10
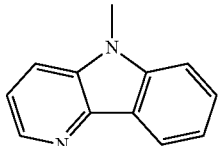
D11
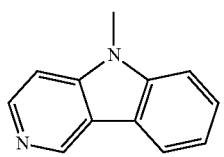
D12
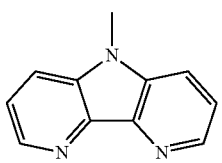
D13
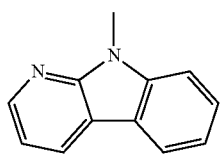
D14
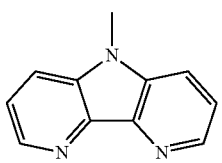
D15
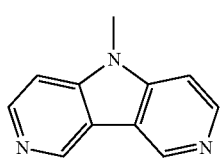
D16
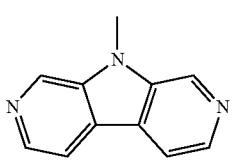
D17
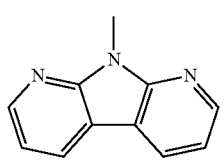
D18
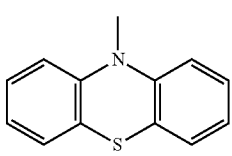

-continued
D19
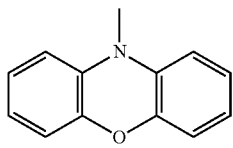
D20
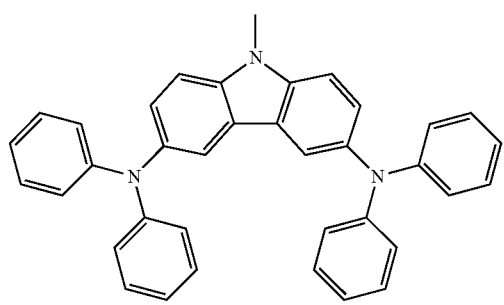
D21
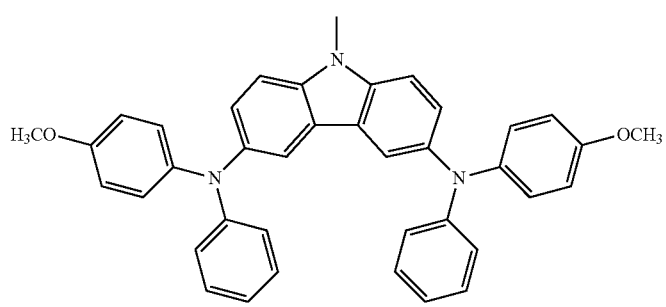
D22
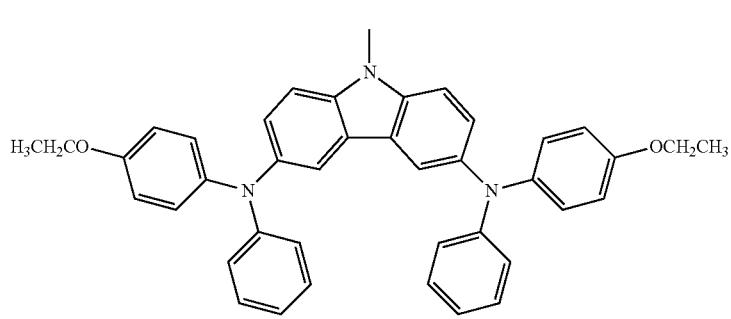
D23
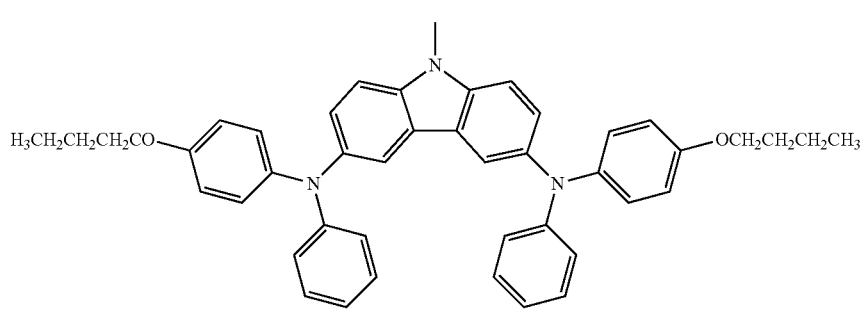
D24
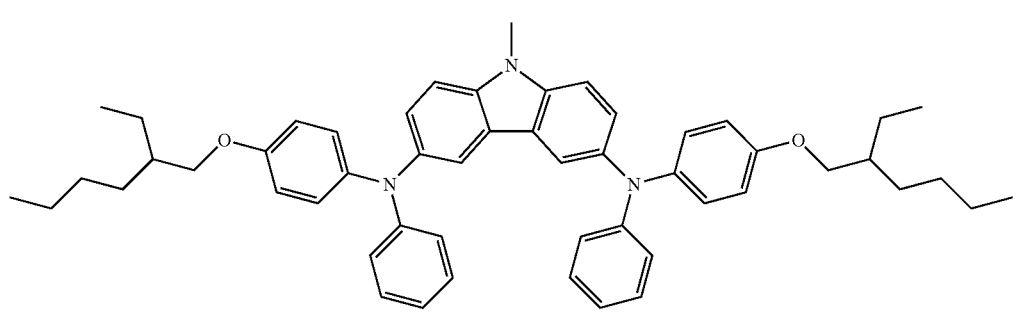

D25
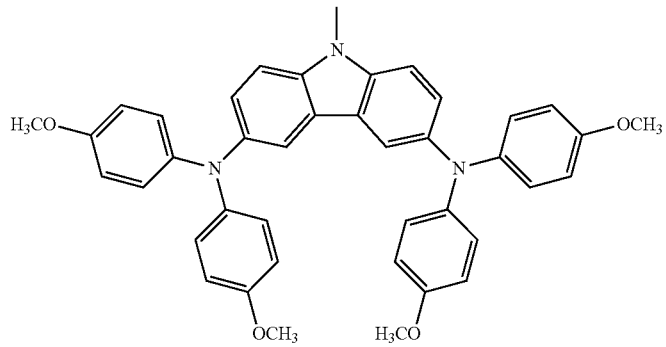
D26
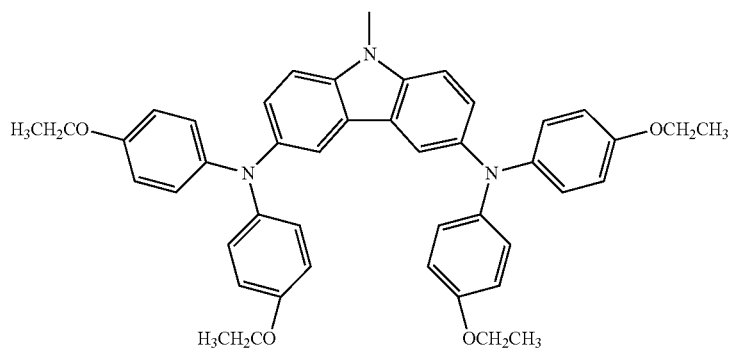
D27
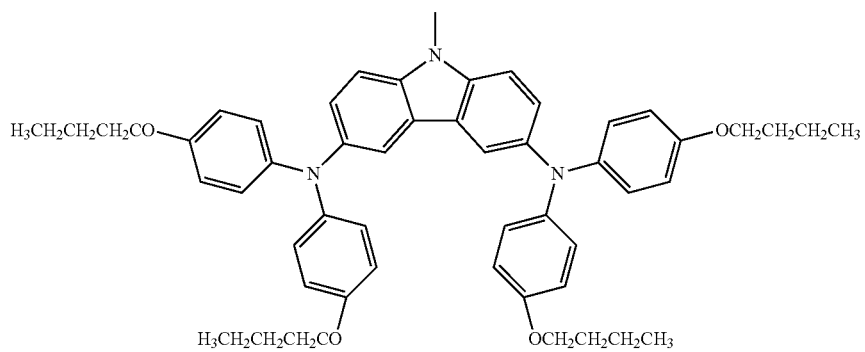
D28
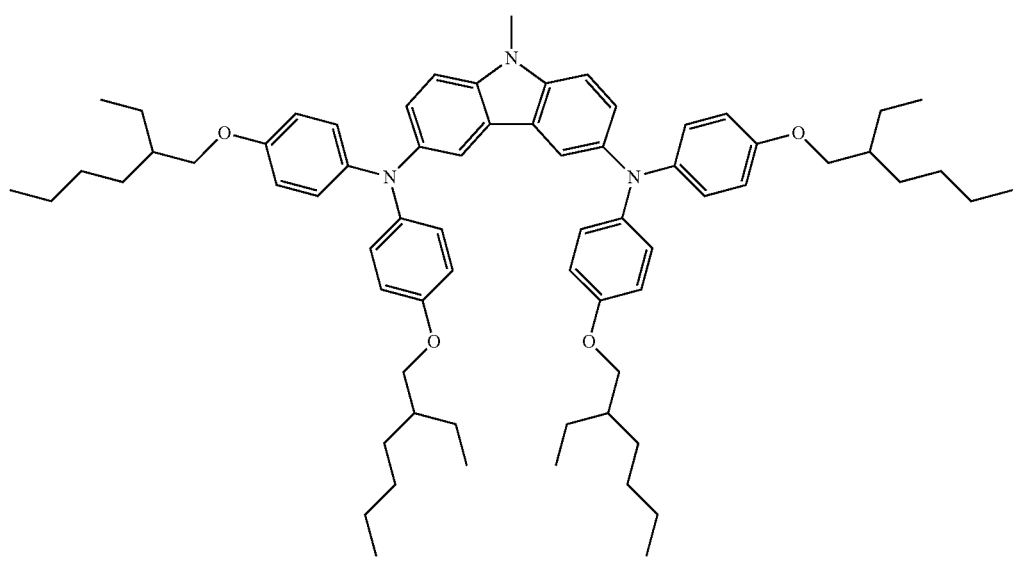

-continued
D29
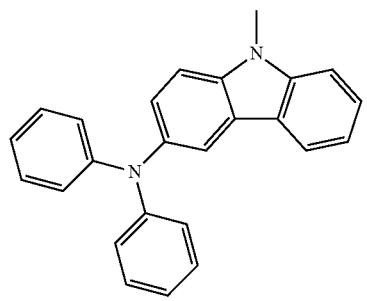
D30
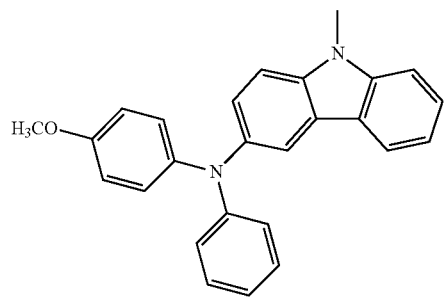
D31
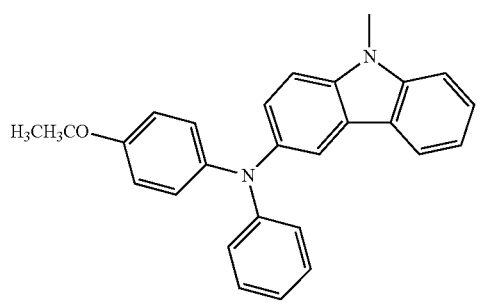
D32
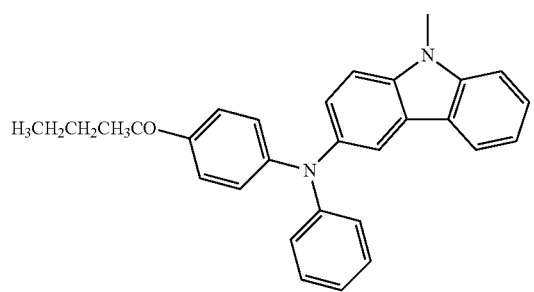
D33
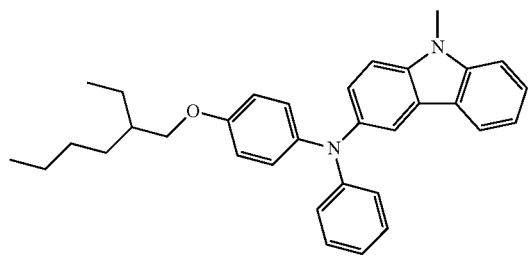
D34
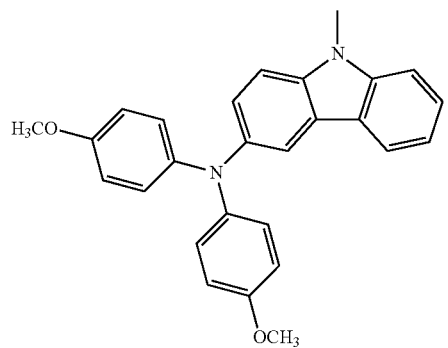
D35
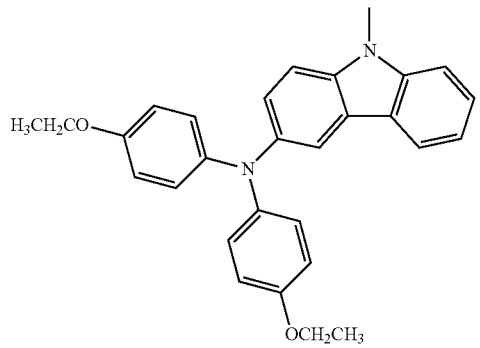
D36
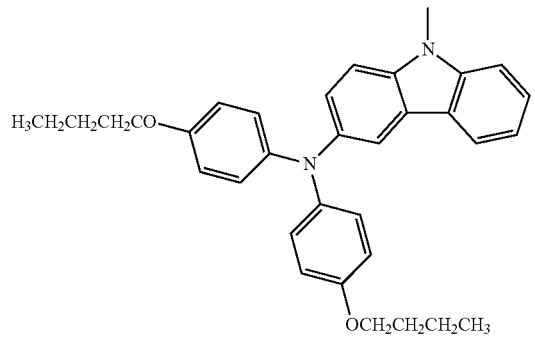

-continued
D37
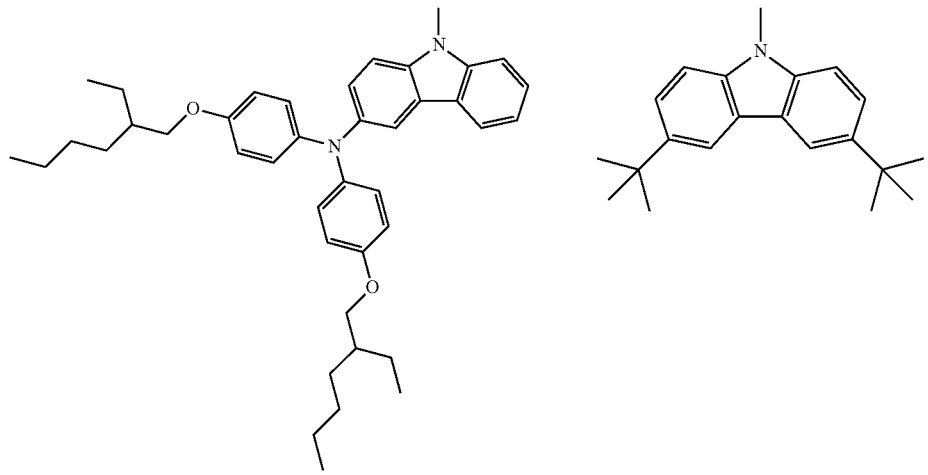
D38
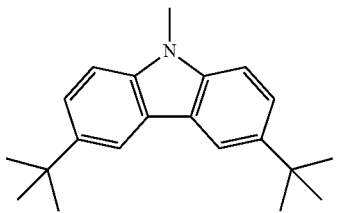
D39
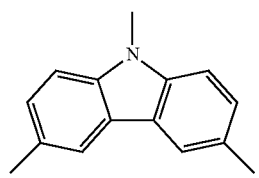
D40
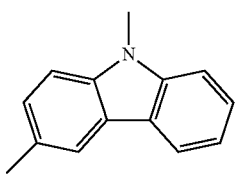
D41
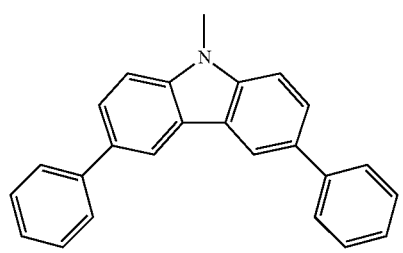
D42
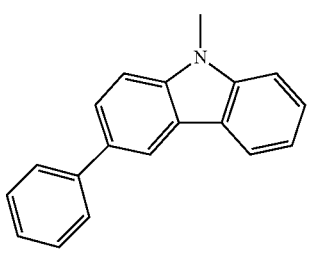

Specific examples of the compounds represented by the general formula (B) are shown below.

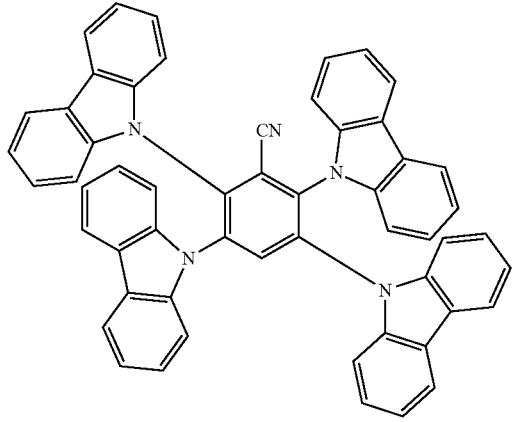

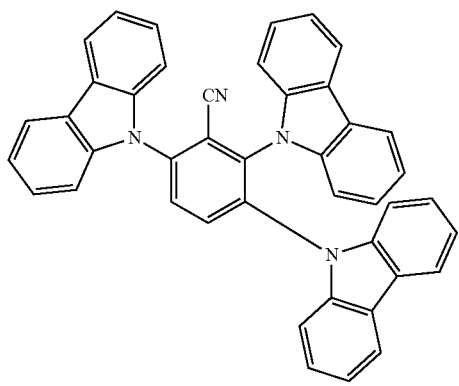

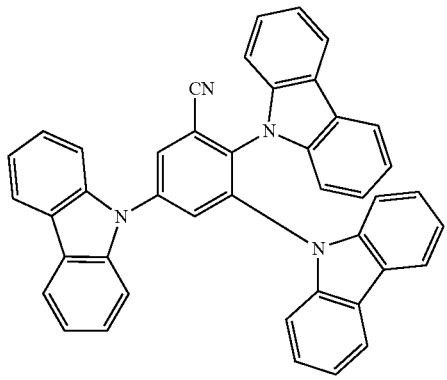

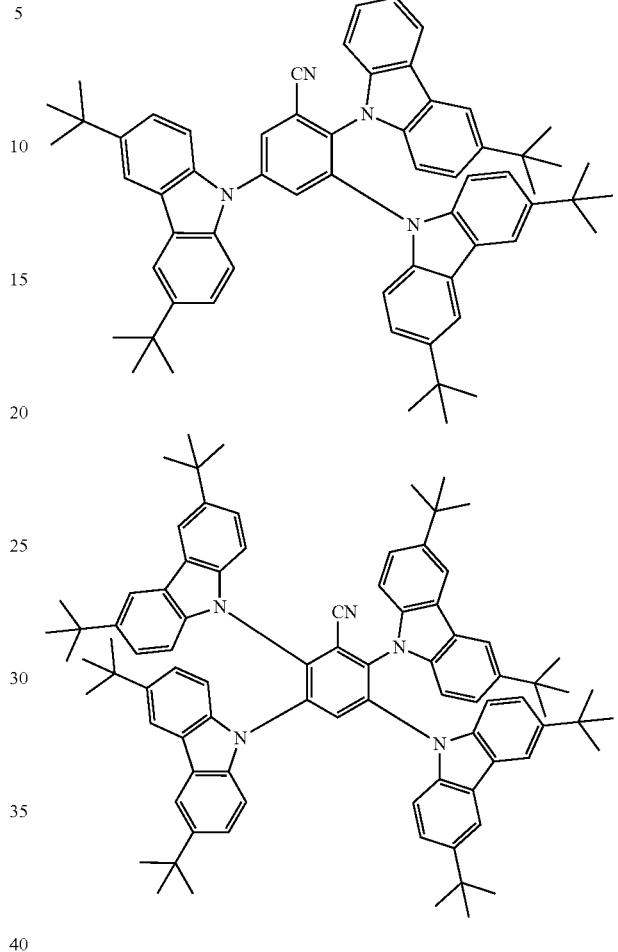

Next, compounds represented by a general formula (C) are described.

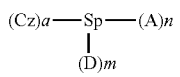
(C)

In the general formula (C),

Sp represents a benzene ring or a biphenyl ring,

Cz represents a 9-carbazolyl group having a substituent on at least one of the 1-position and the 8-position (where at least one carbon atom at the 1- to 8-positions constituting the ring skeleton of the carbazol ring of the 9-carbazolyl group may be substituted with a nitrogen atom, but both the 1-position and the 8-positions are not substituted with a nitrogen atom), D represents a substituent having a negative Hamett's $\sigma_p$ value, A represents a substituent having a positive Hamett's $\sigma_p$ value (except a cyano group), a represents an integer of 1 or more, m represents an integer of 0 or more, n represents an integer of 1 or more, but a+m+n is not more than a maximum number of substituents that may substitute on the benzene ring or the biphenyl ring represented by Sp.

Specific examples (m-D1 to m-D14) of the "9-carbazolyl group having a substituent on at least one of the 1-position and the 8-position" represented by Cz are shown below.
m-D1
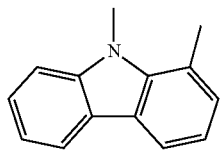
m-D2
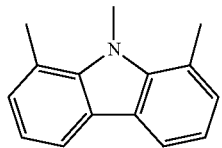
m-D3
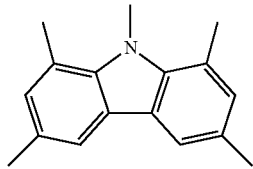
m-D4
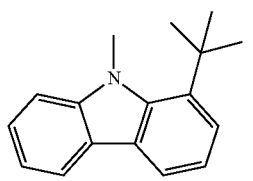
m-D5
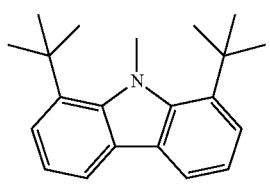
m-D6
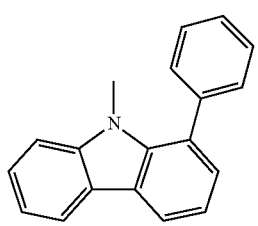
m-D7
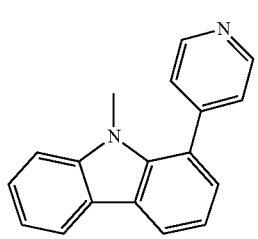
m-D8
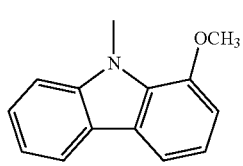
m-D9
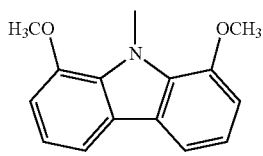
m-D10
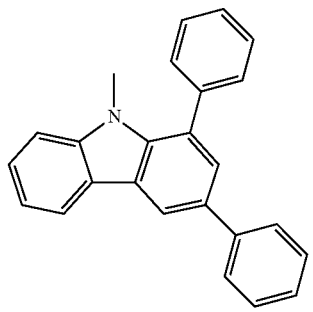
m-D11
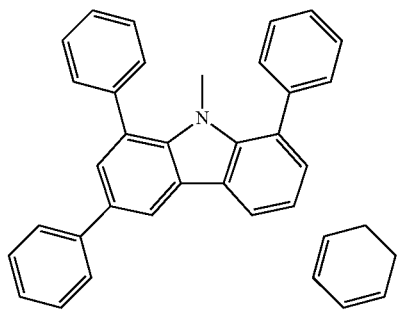
m-D12
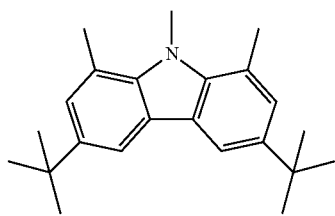
m-D13
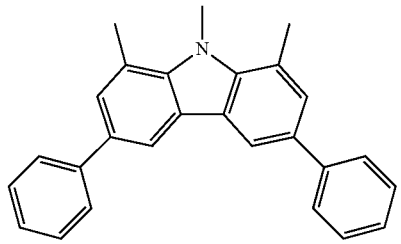
m-D14
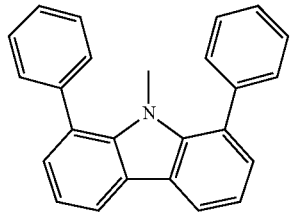
Specific examples (Cz, Cz-1 to 12) of the substituent represented by D are shown below.

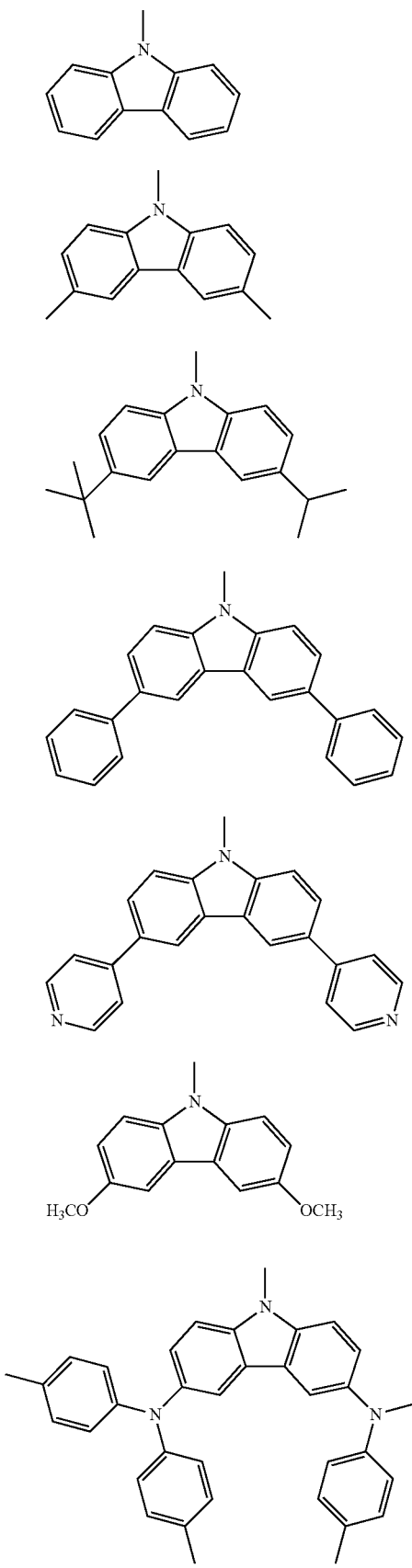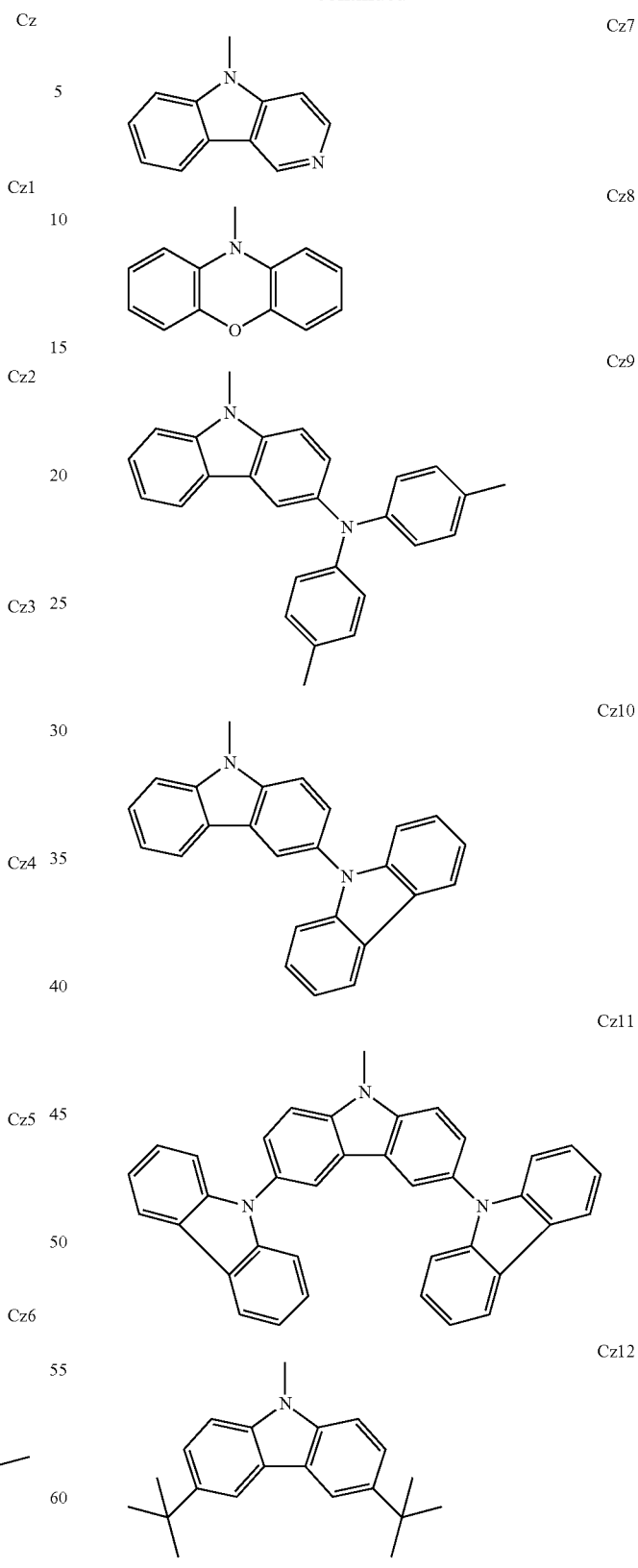
Specific examples (A-1 to A-77) of the substituent represented by A are shown below. * represents a bonding position.

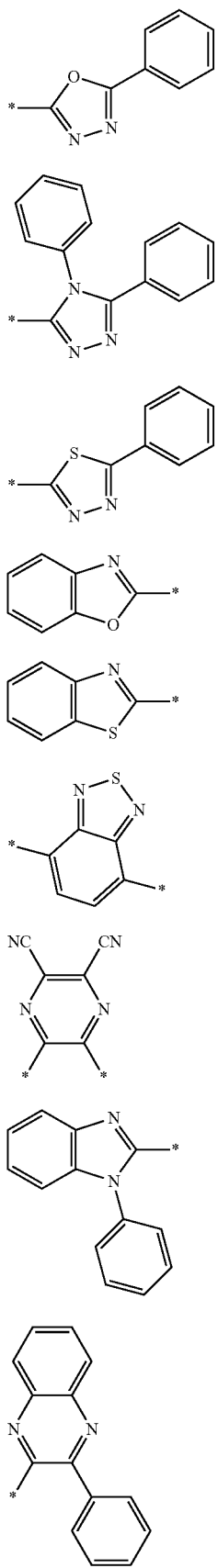
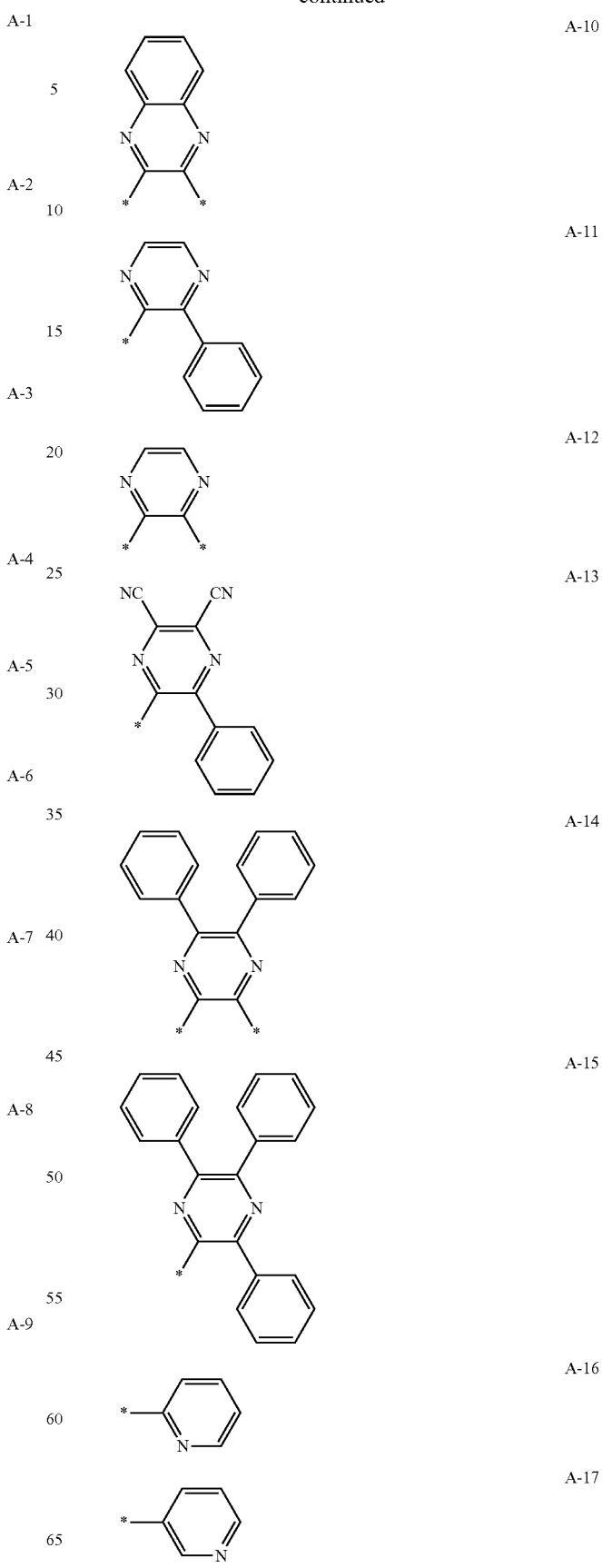

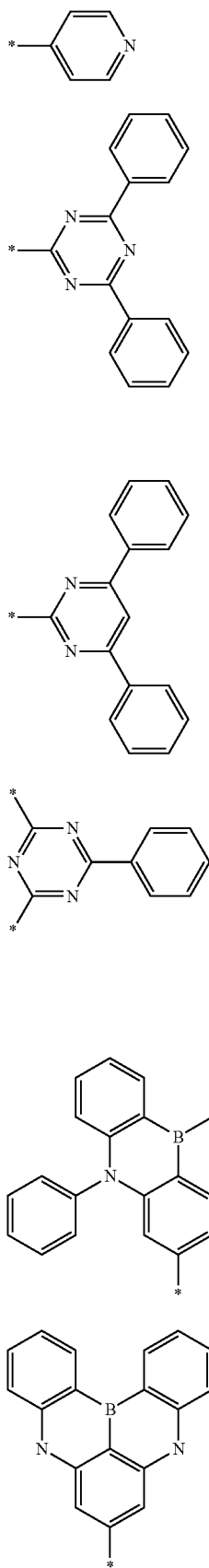
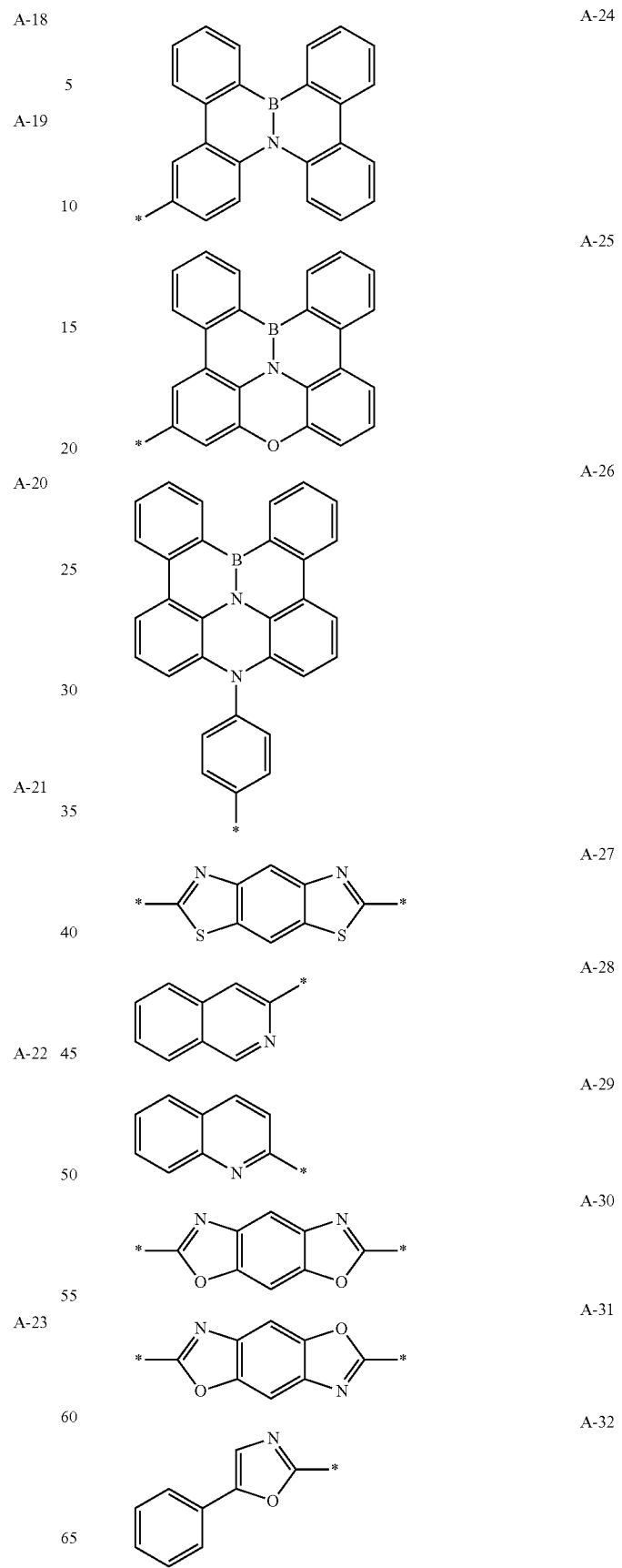

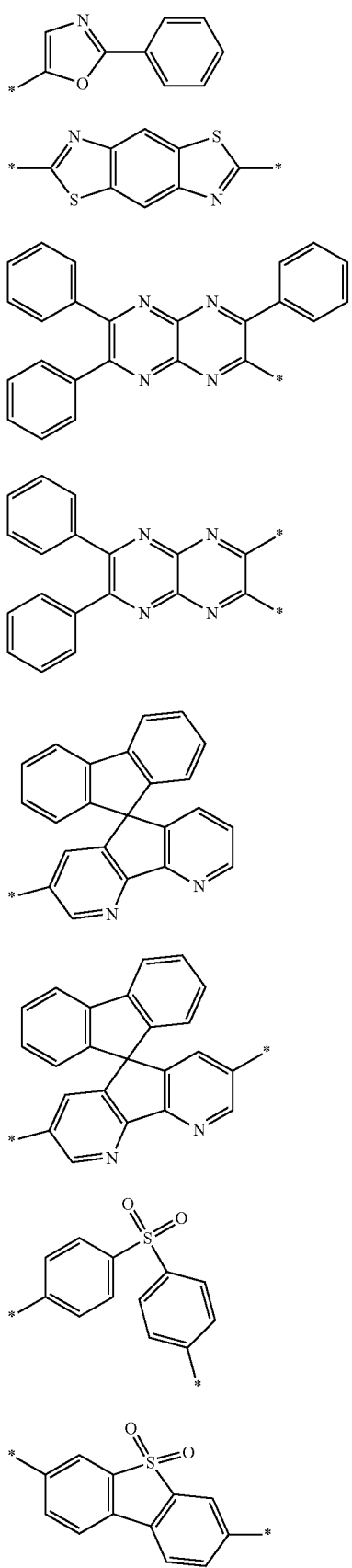
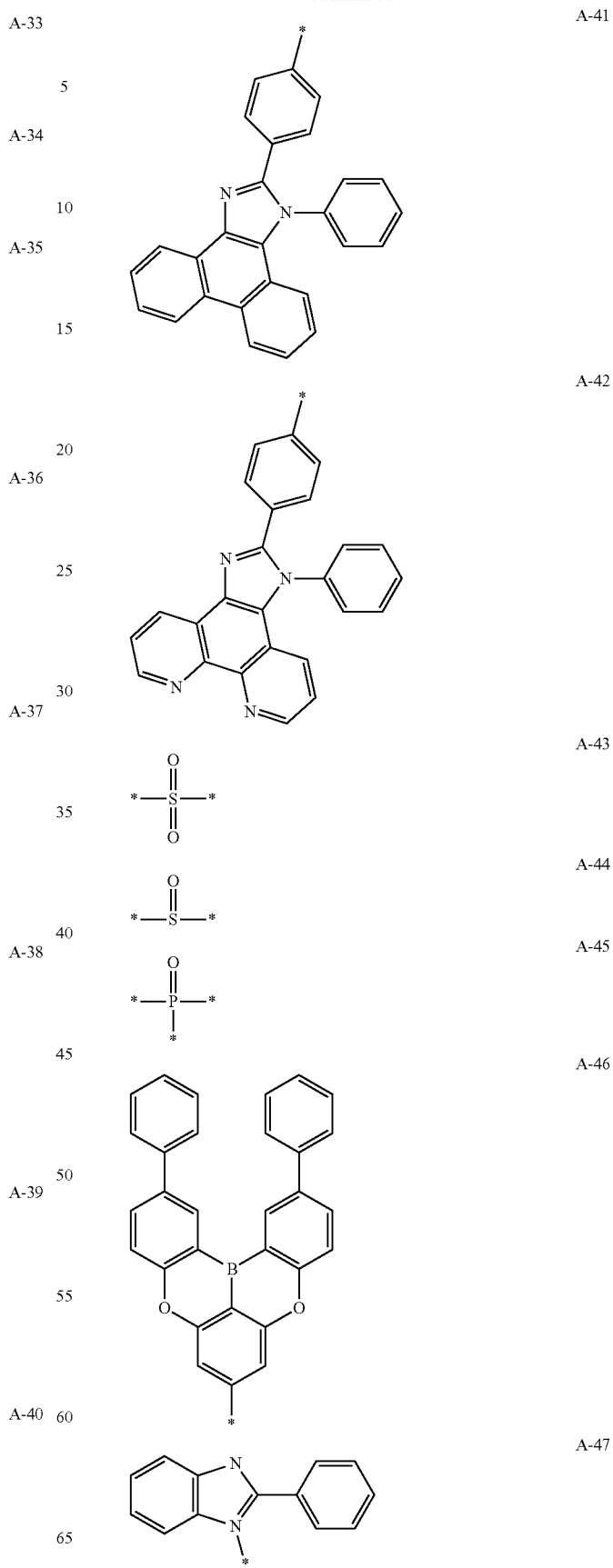

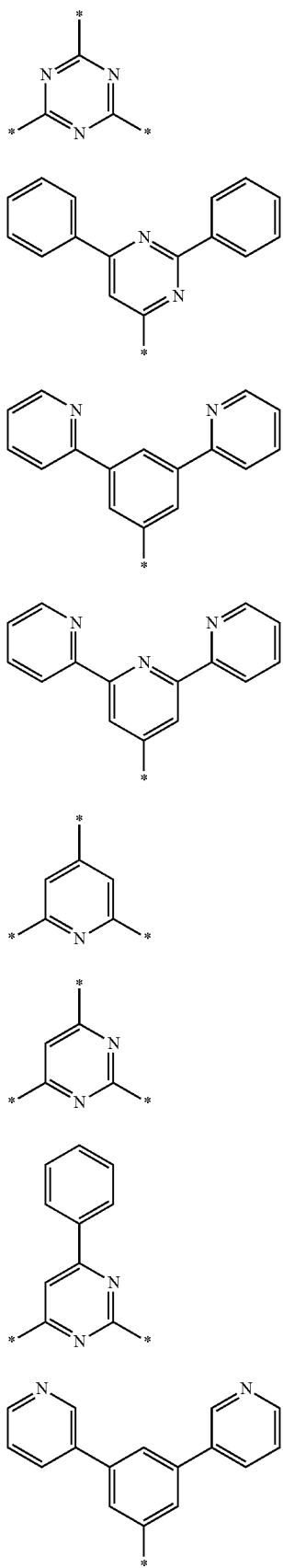
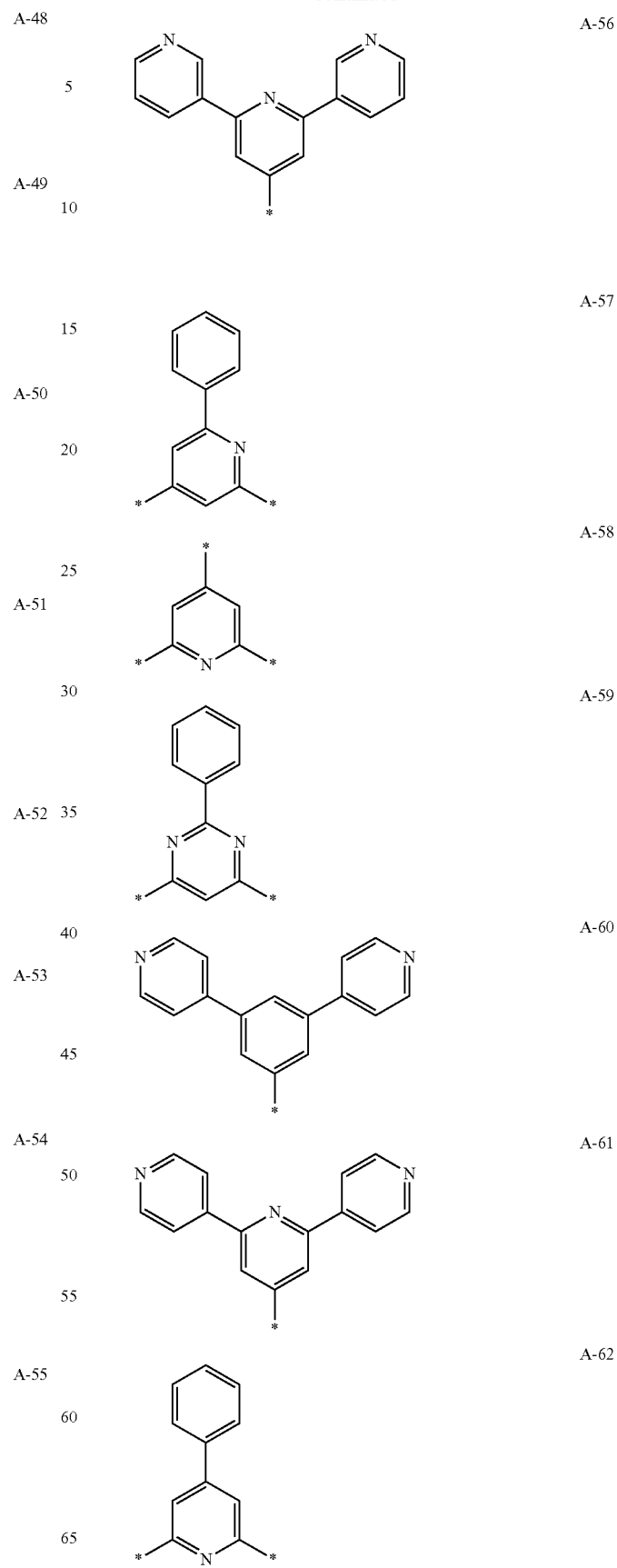

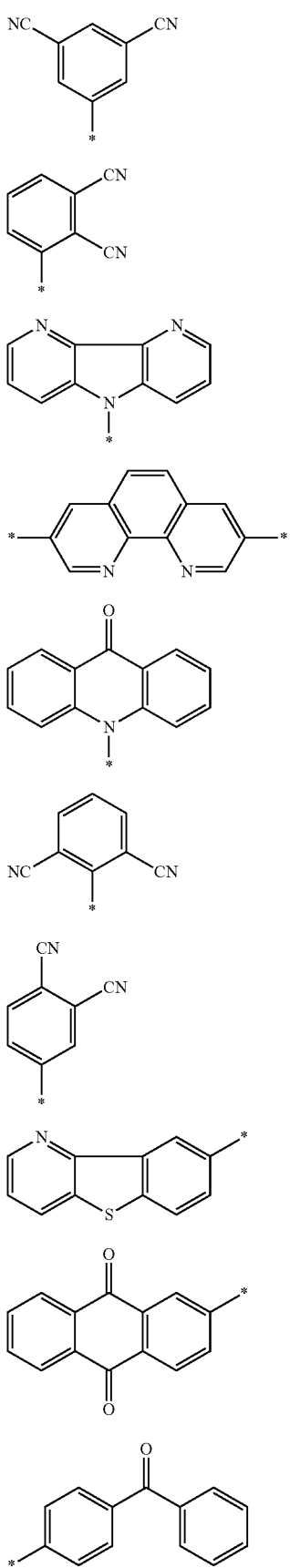

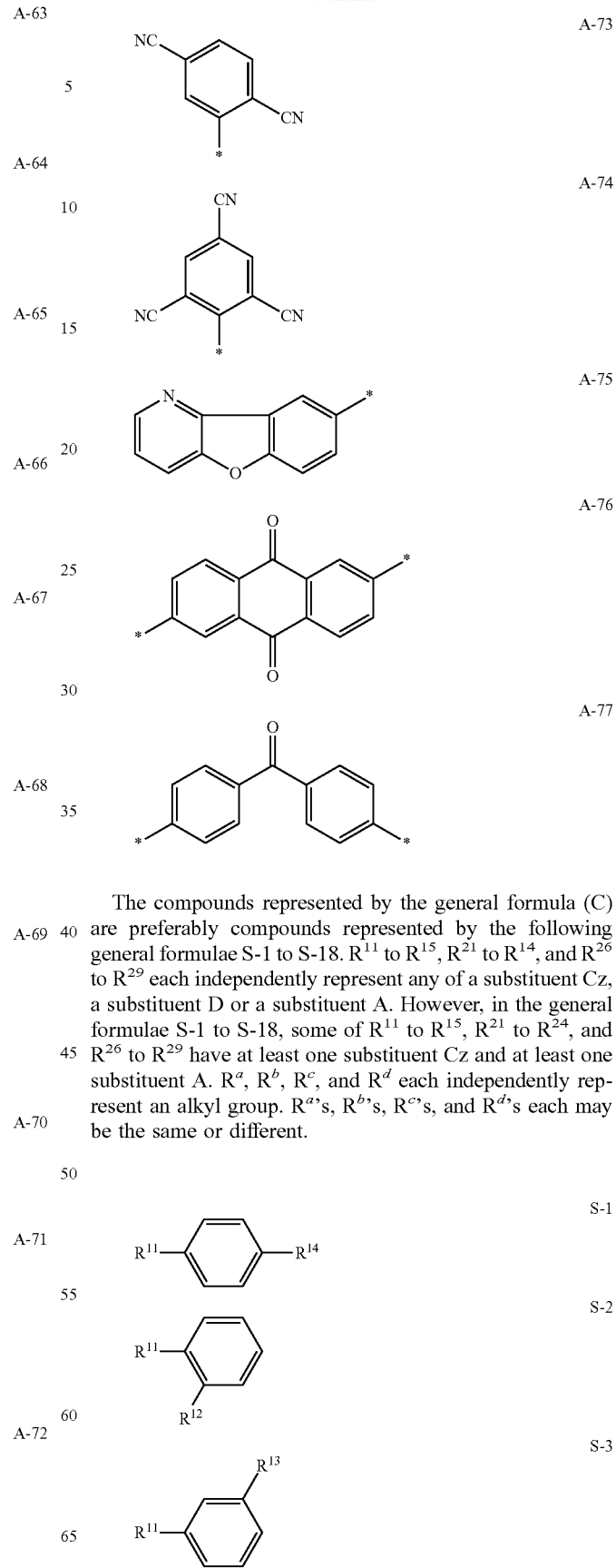

The compounds represented by the general formula (C) are preferably compounds represented by the following general formulae S-1 to S-18. $R^{11}$ to $R^{15}$, $R^{21}$ to $R^{14}$, and $R^{26}$ to $R^{29}$ each independently represent any of a substituent Cz, a substituent D or a substituent A. However, in the general formulae S-1 to S-18, some of $R^{11}$ to $R^{15}$, $R^{21}$ to $R^{24}$, and $R^{26}$ to $R^{29}$ have at least one substituent Cz and at least one substituent A. $R^a$, $R^b$, $R^c$, and $R^d$ each independently represent an alkyl group. $R^a$'s, $R^b$'s, $R^c$'s, and $R^d$'s each may be the same or different.

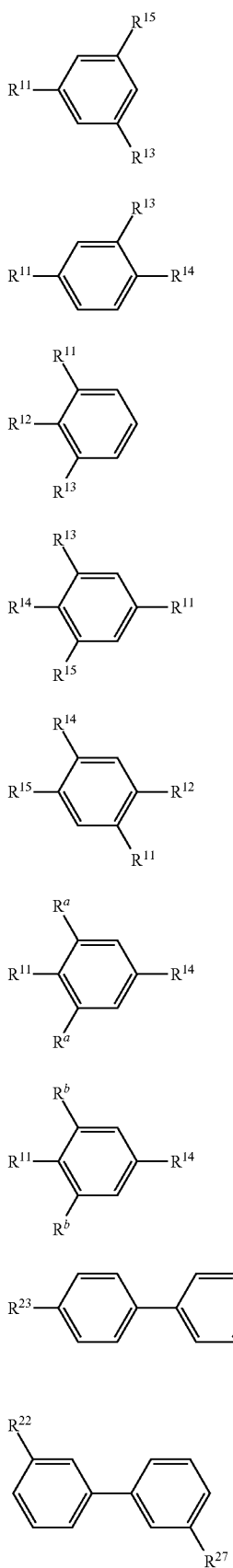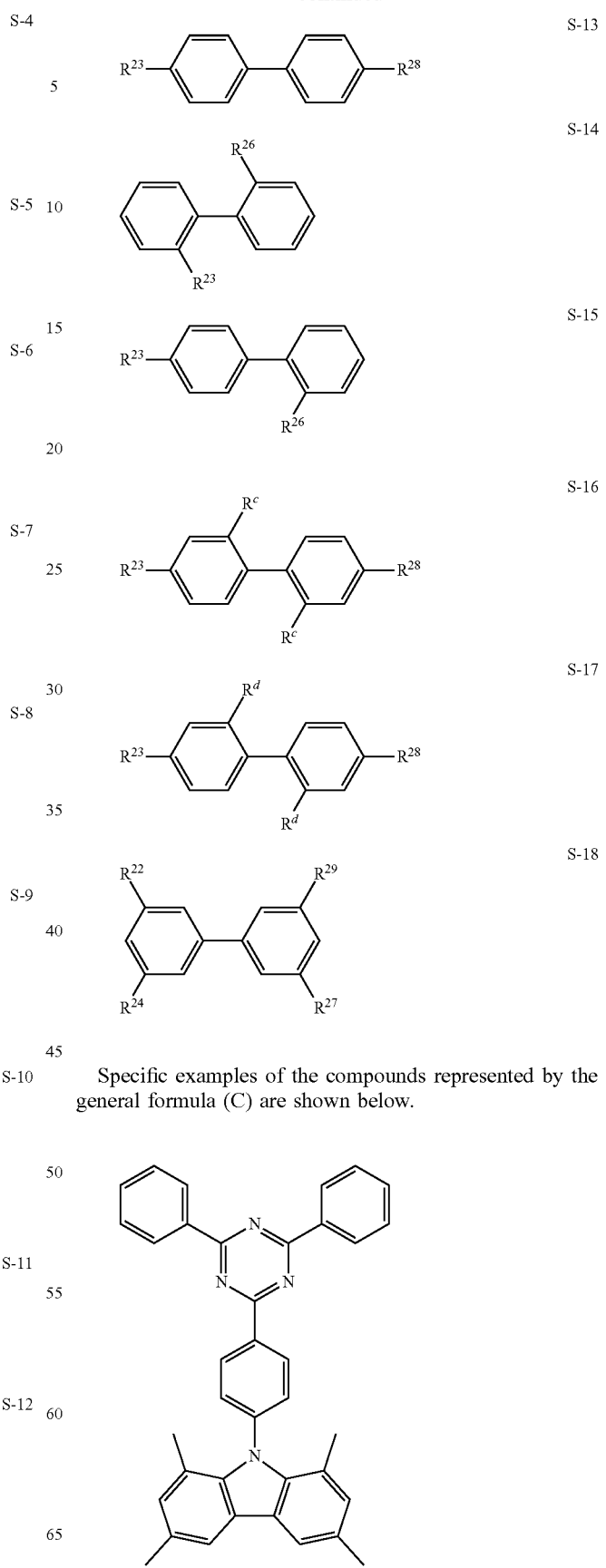
Specific examples of the compounds represented by the general formula (C) are shown below.

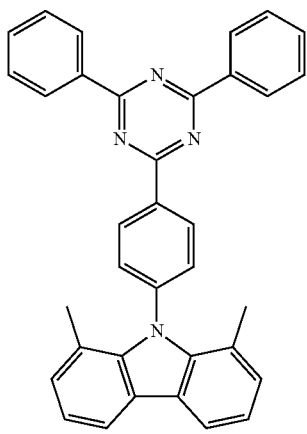

The compounds represented by the general formula (D) are described.

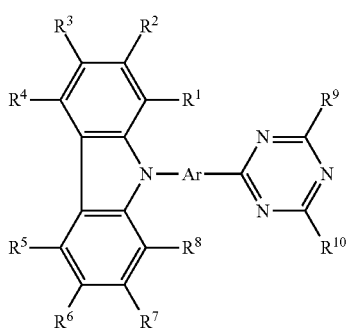
(D)

In the general formula (D),

Ar represents a substituted or unsubstituted phenylene group, a substituted or unsubstituted biphenyldiyl group or a substituted or unsubstituted heteroarylene group.

$R^1$ to $R^{10}$ each represent a hydrogen atom or a substituent, and at least one of $R^1$ and $R^8$ is a substituent. At least one of $R^1$ to $R^8$ is a dibenzofuryl group or a dibenzothienyl group.

Specific examples of the carbazolyl group bonding to Ar in the general formula (D) are shown below.

m-D1

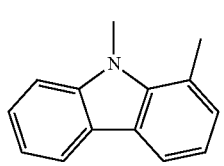

m-D2

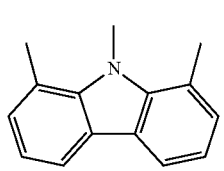

m-D3

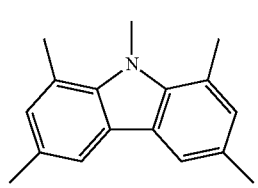

m-D4

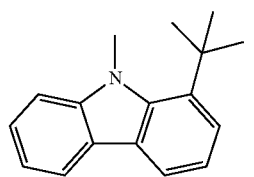

m-D5

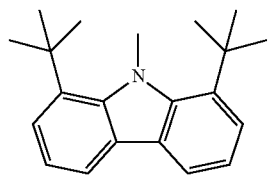

m-D6

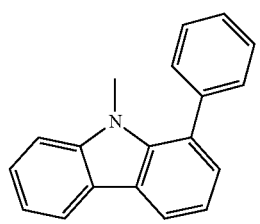

m-D7

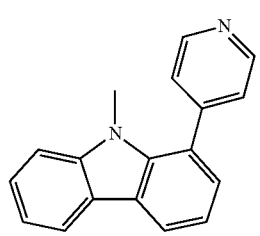

m-D8

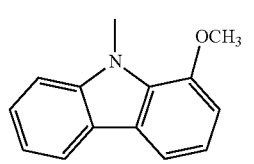

m-D9

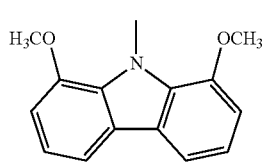

m-D10

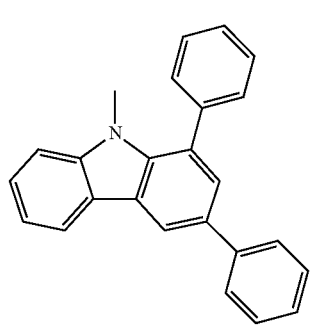

-continued
m-D11
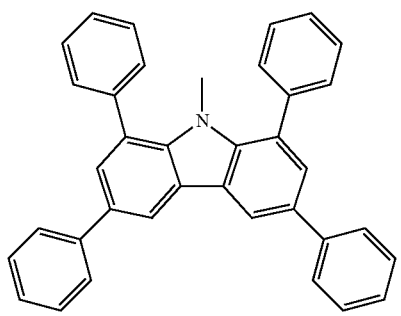
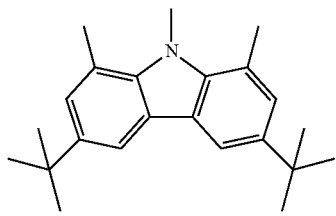
m-D12
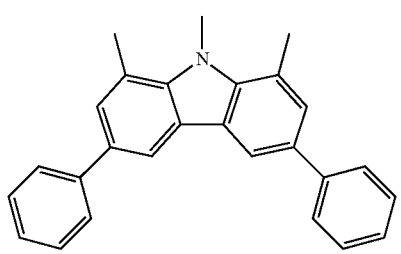
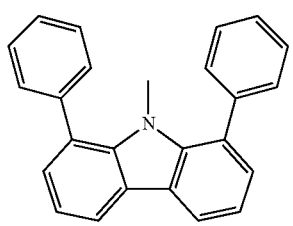
Specific examples of the compounds represented by the general formula (D) are shown below. In the following, X represents O or S.
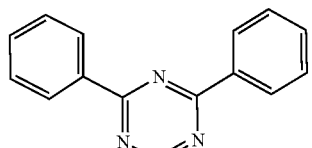
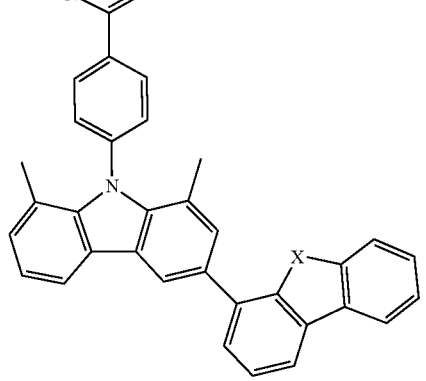
m-D12
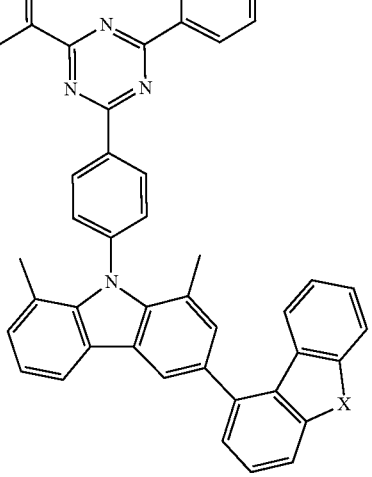
m-D13
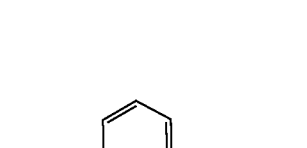
m-D14
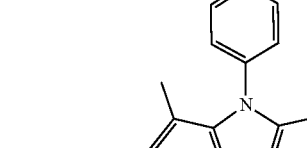
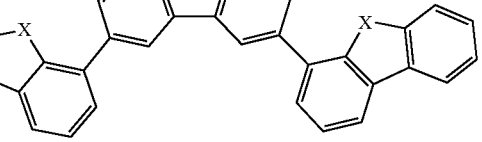

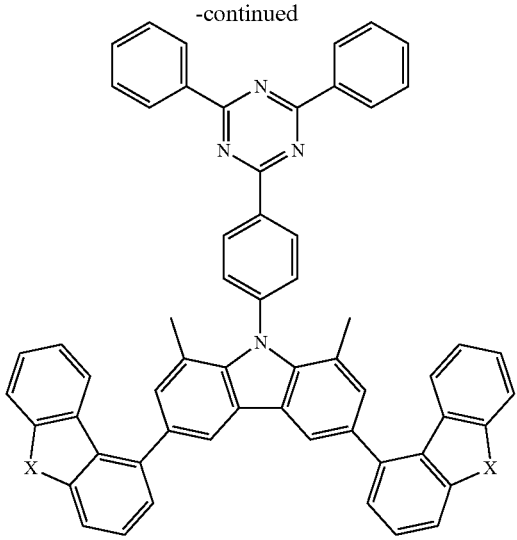

The compounds represented by the general formula (E) are described below.

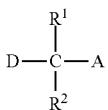

(E)

In the general formula (E), $R^1$ and $R^2$ each independently represent a fluoroalkyl group, D represents a substituent having a negative Hammett's $\sigma_p$ value, and A represents a substituent having a positive Hammett's σp value.

Specific examples of the substituent that A includes may be the specific examples (A-1 to A-77) represented by A in the general formula (C) described hereinabove.

Specific examples of the compounds represented by the general formula (E) are shown below.

COMPOUND 1

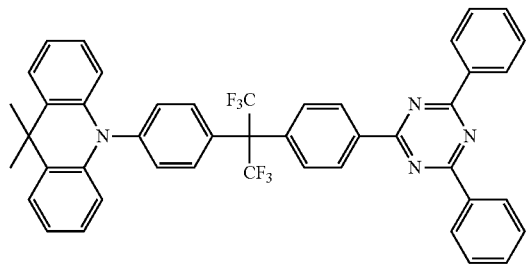

COMPOUND 2

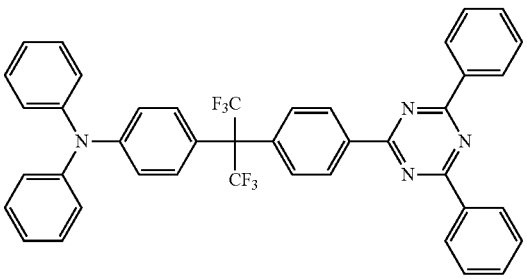

COMPOUND 3

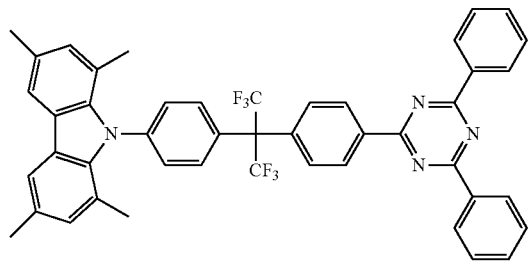

COMPOUND 4

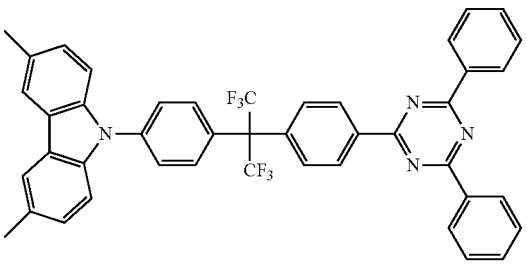

COMPOUND 5

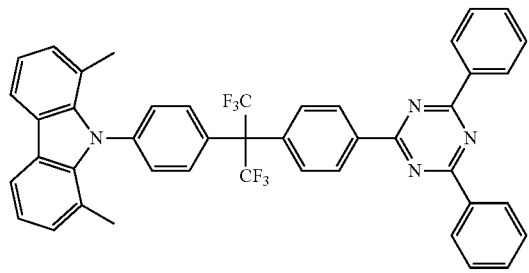

COMPOUND 6

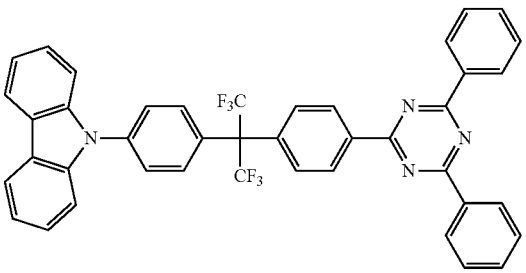

-continued
COMPOUND 7
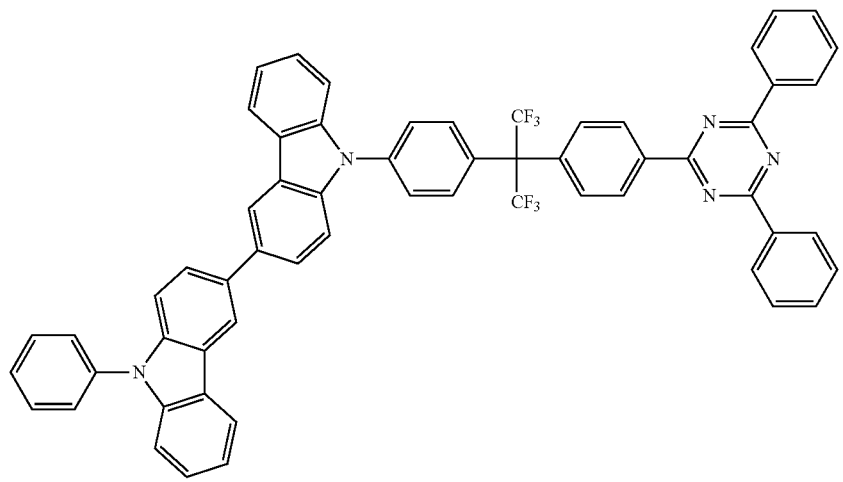
COMPOUND 8
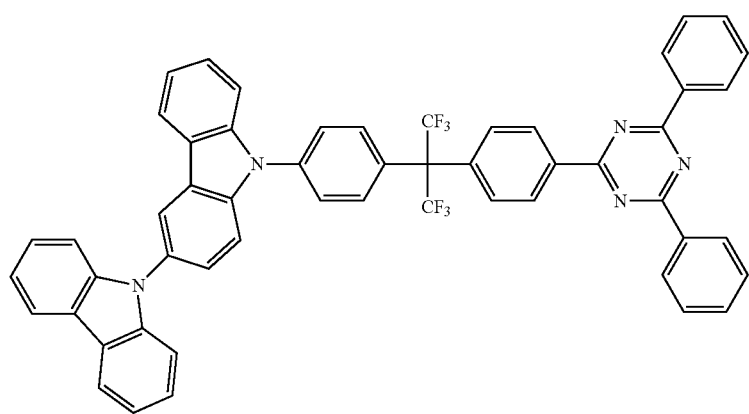
COMPOUND 9
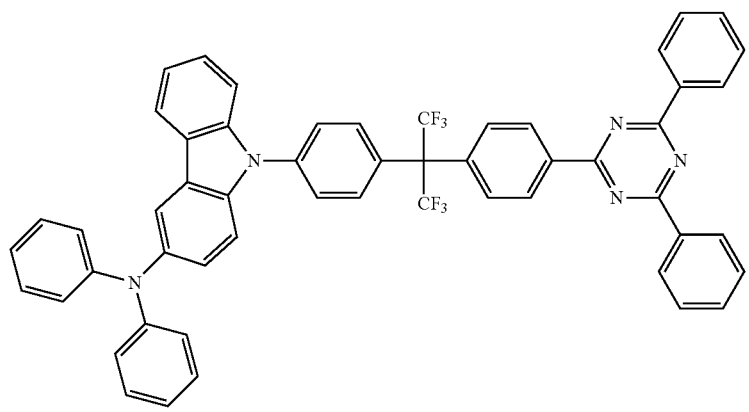

COMPOUND 10
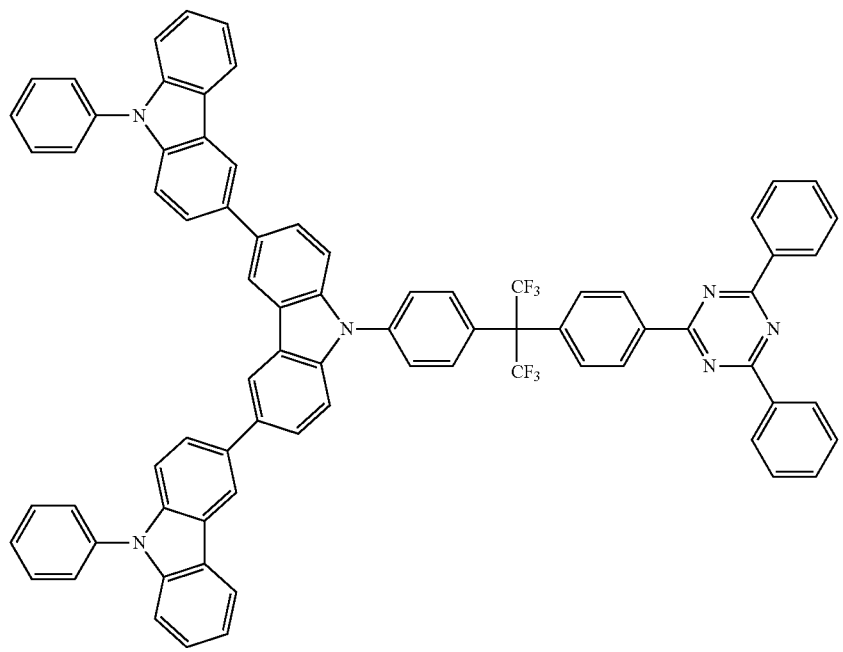
COMPOUND 11
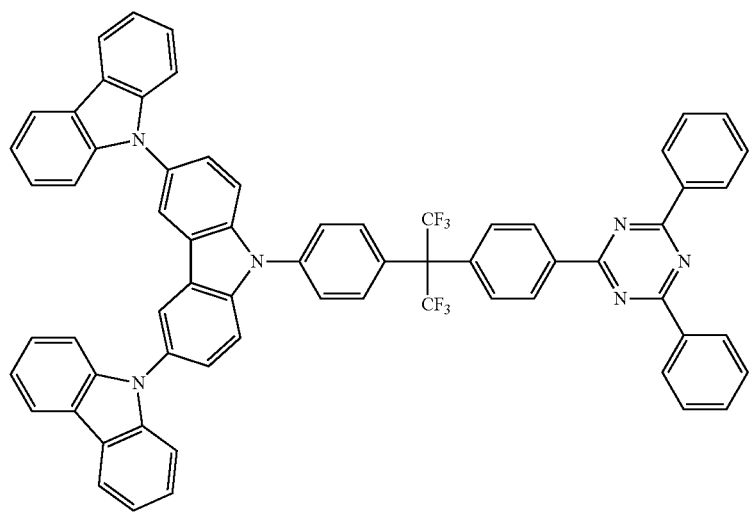
COMPOUND 12
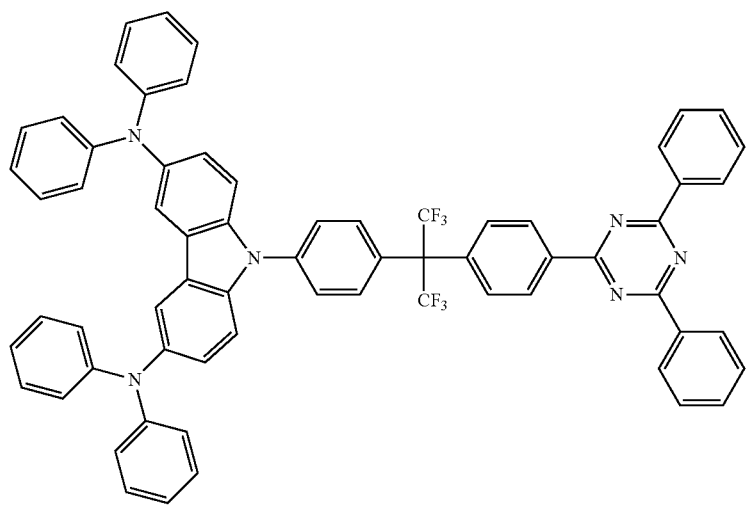

-continued
COMPOUND 13
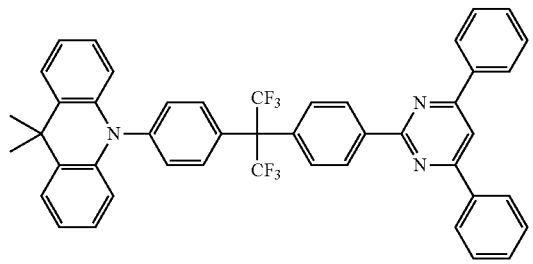
COMPOUND 14
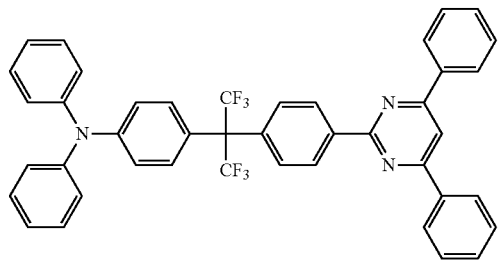
COMPOUND 15
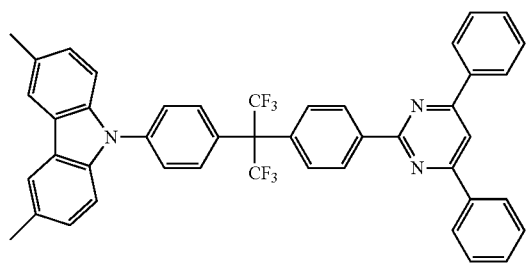
COMPOUND 16
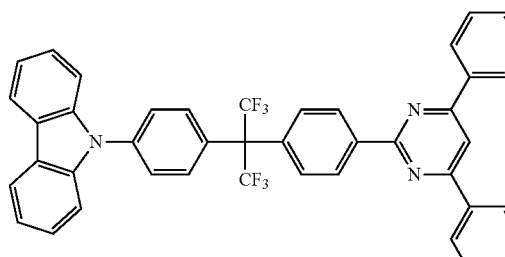
COMPOUND 17
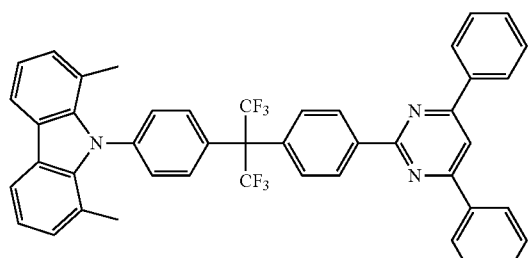
COMPOUND 18
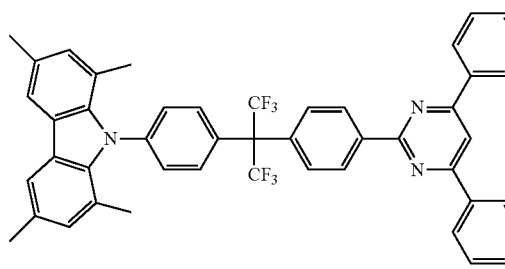
COMPOUND 19
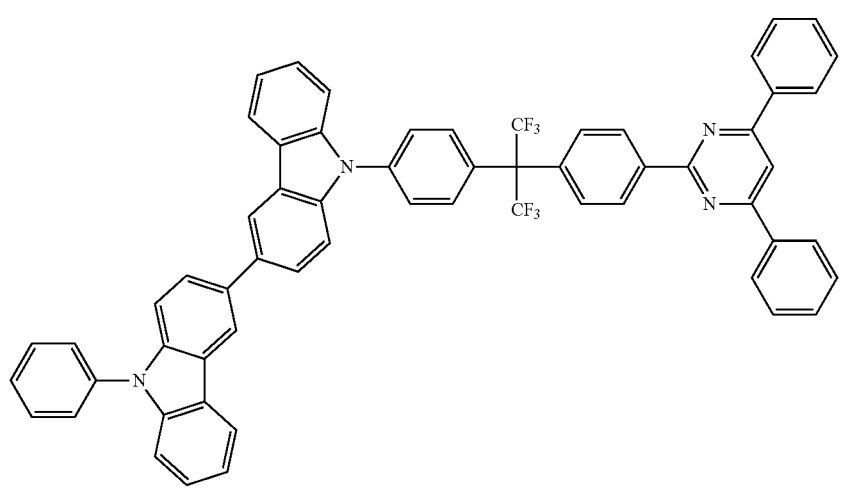

-continued
COMPOUND 20
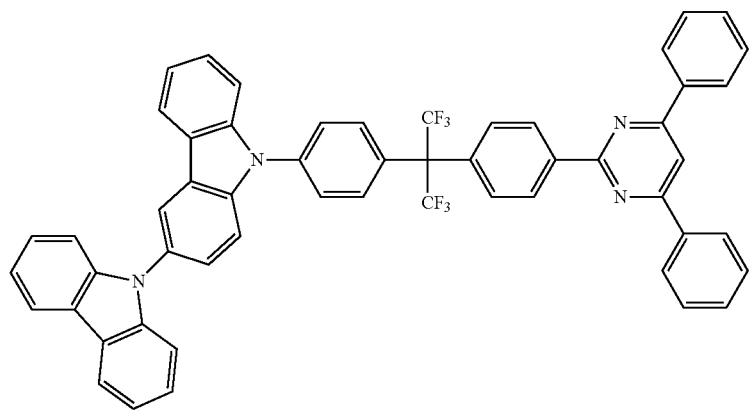
COMPOUND 21
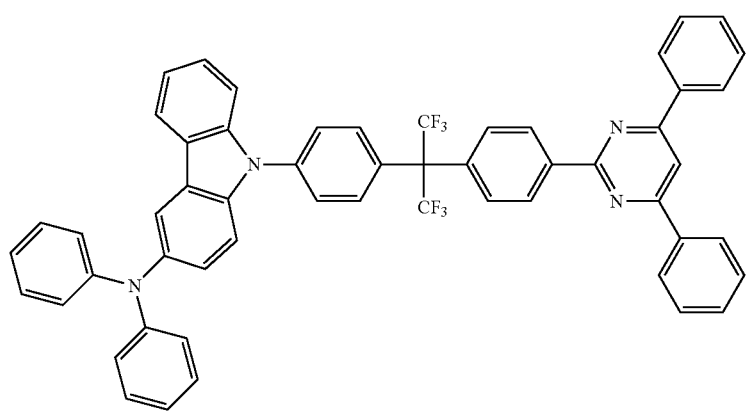
COMPOUND 22
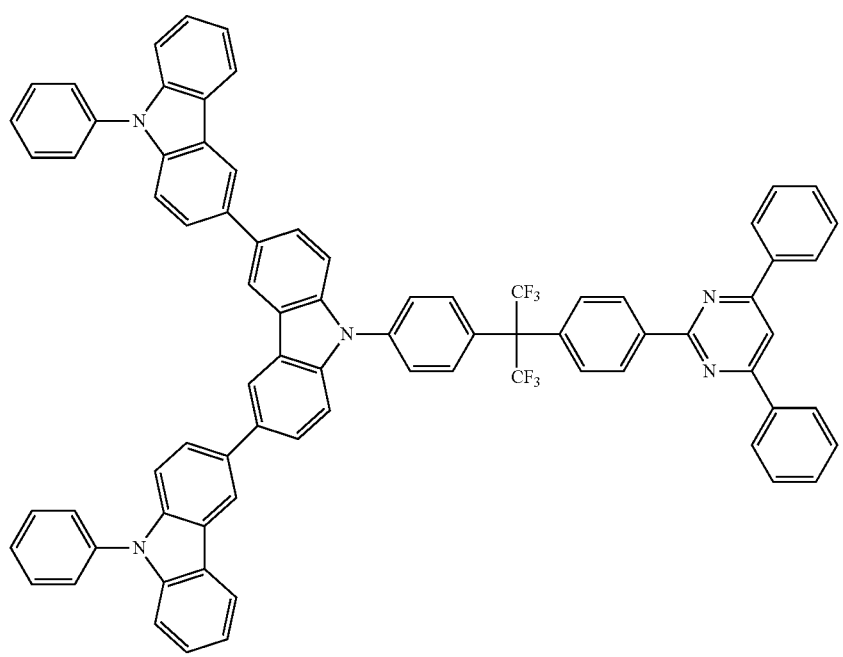

-continued
COMPOUND 23
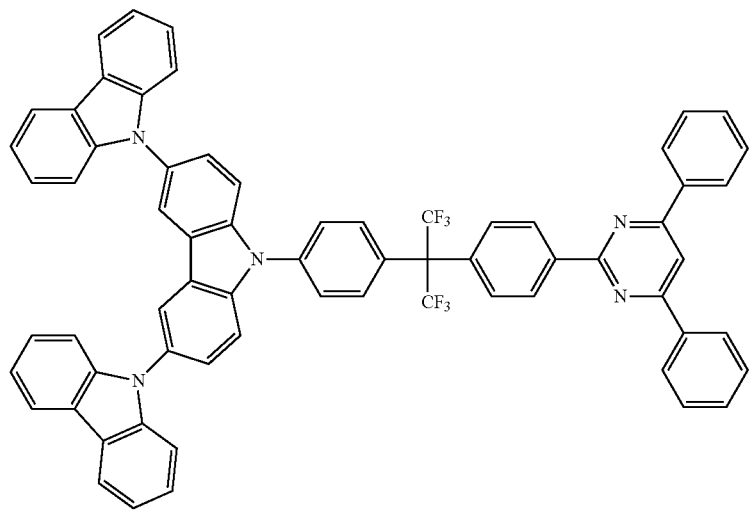
COMPOUND 24
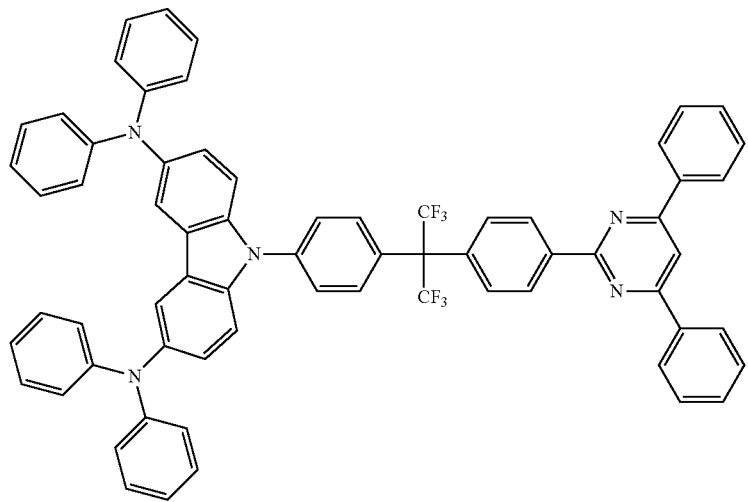
COMPOUND 25
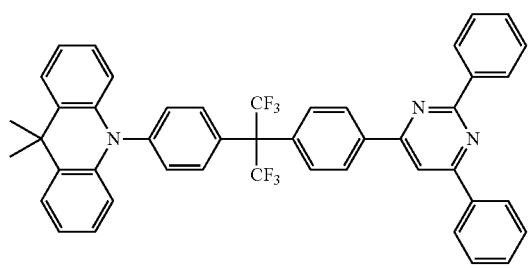
COMPOUND 26
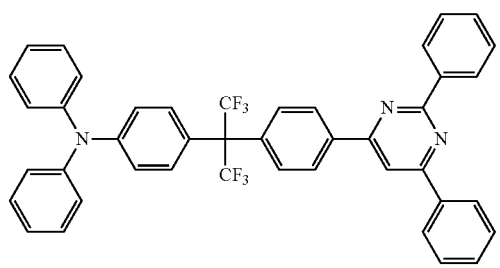
COMPOUND 27
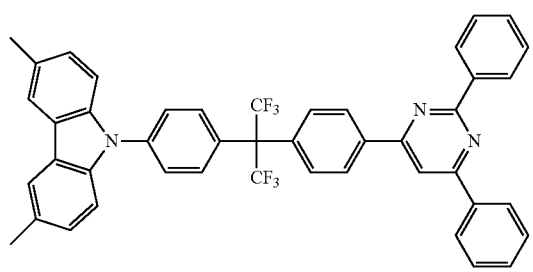
COMPOUND 28
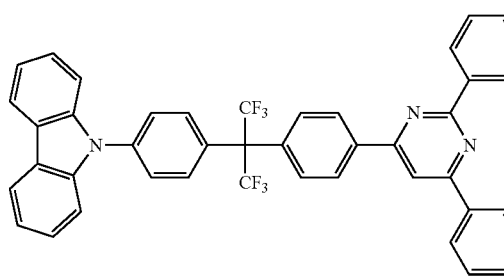

-continued
COMPOUND 29
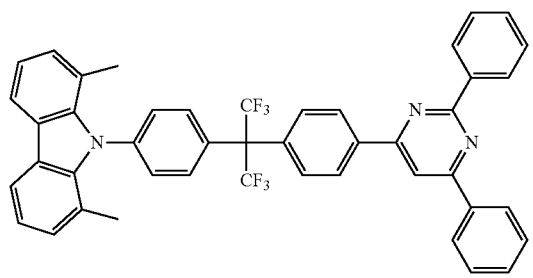
COMPOUND 30
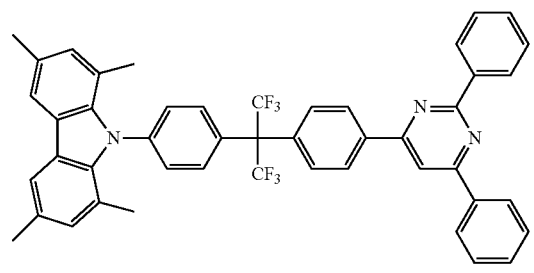
COMPOUND 31
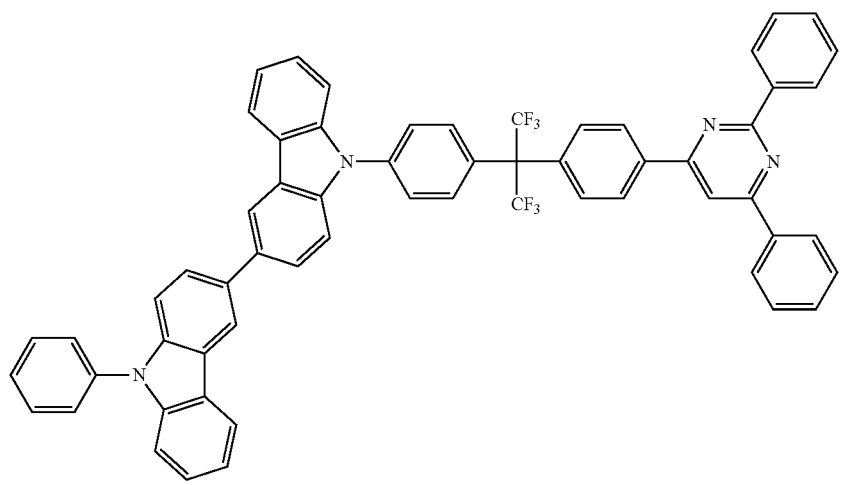
COMPOUND 32
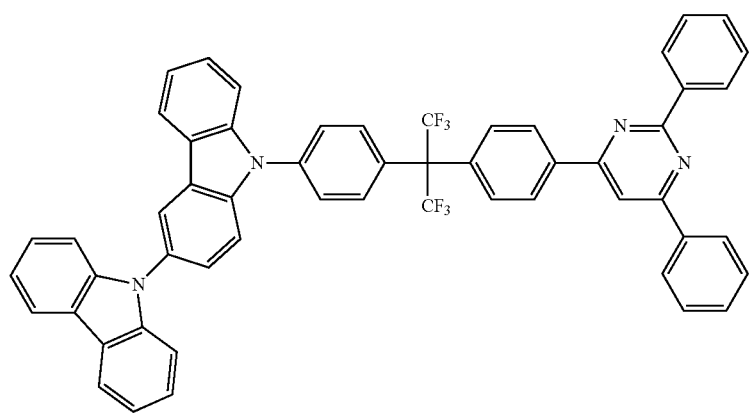
COMPOUND 33
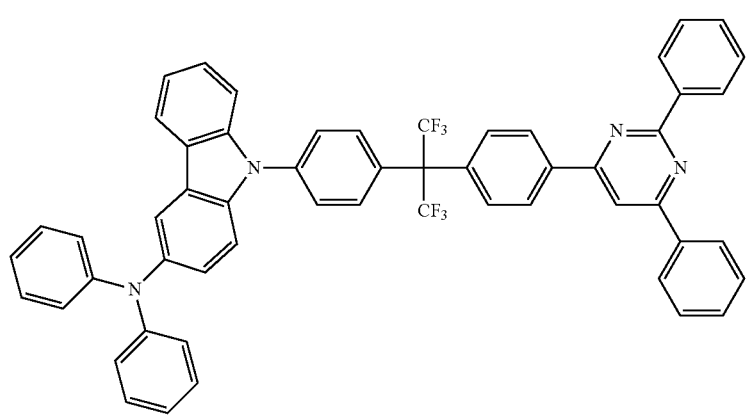

COMPOUND 34
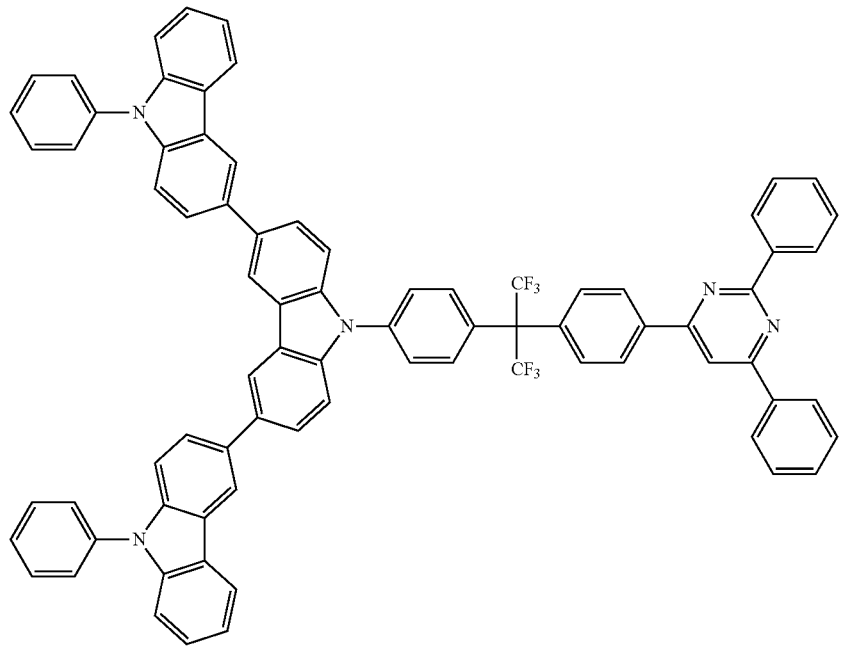
COMPOUND 35
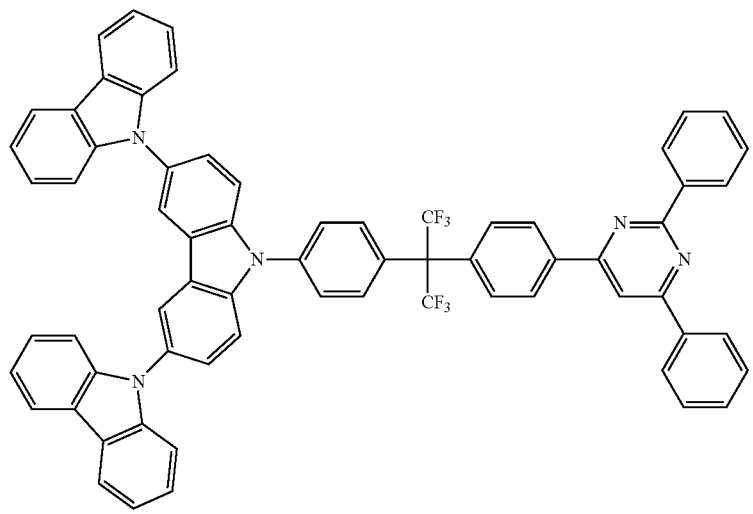
COMPOUND 36
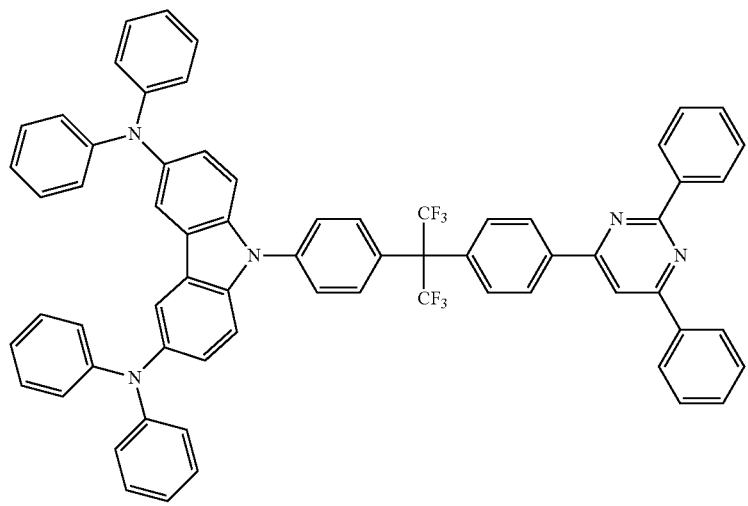

-continued
COMPOUND 37
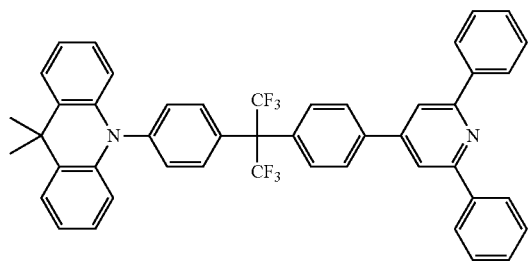
COMPOUND 38
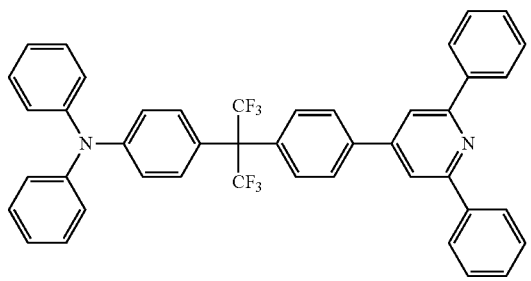
COMPOUND 39
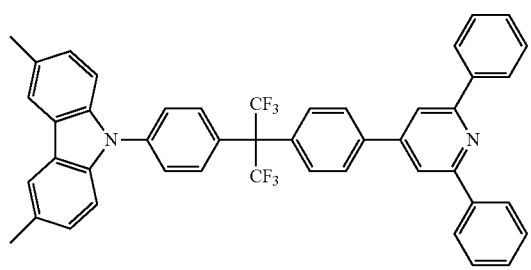
COMPOUND 40
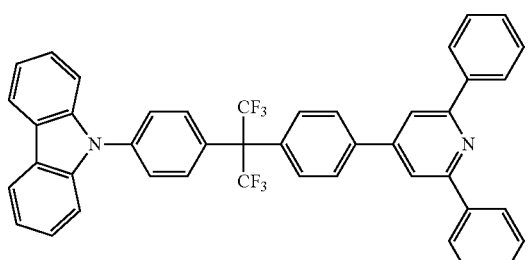
COMPOUND 41
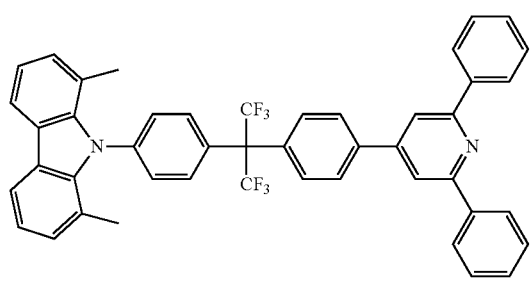
COMPOUND 42
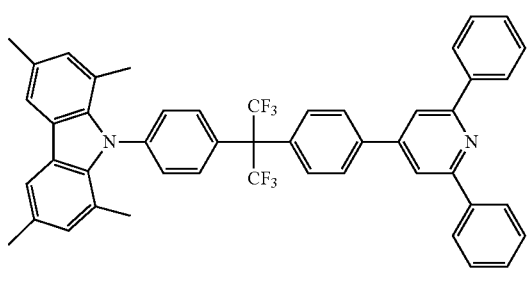
COMPOUND 43
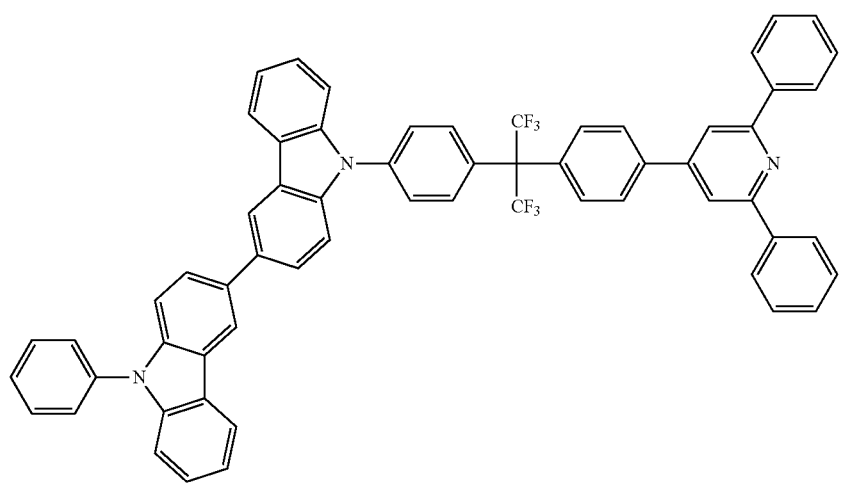

COMPOUND 44
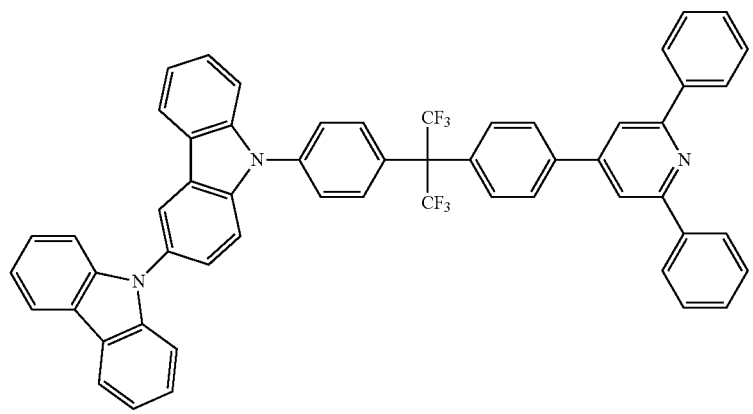
COMPOUND 45
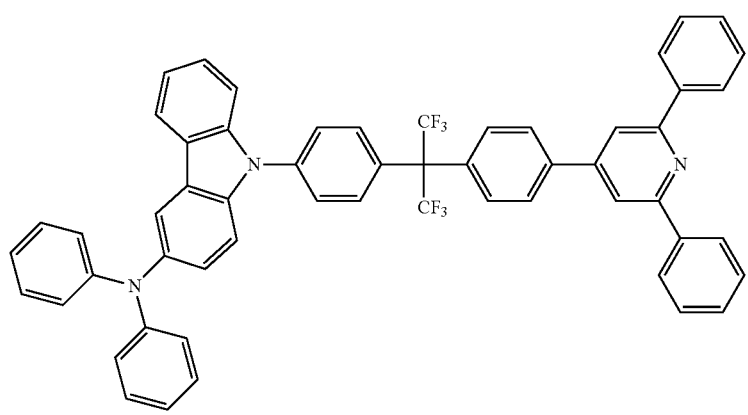
COMPOUND 46
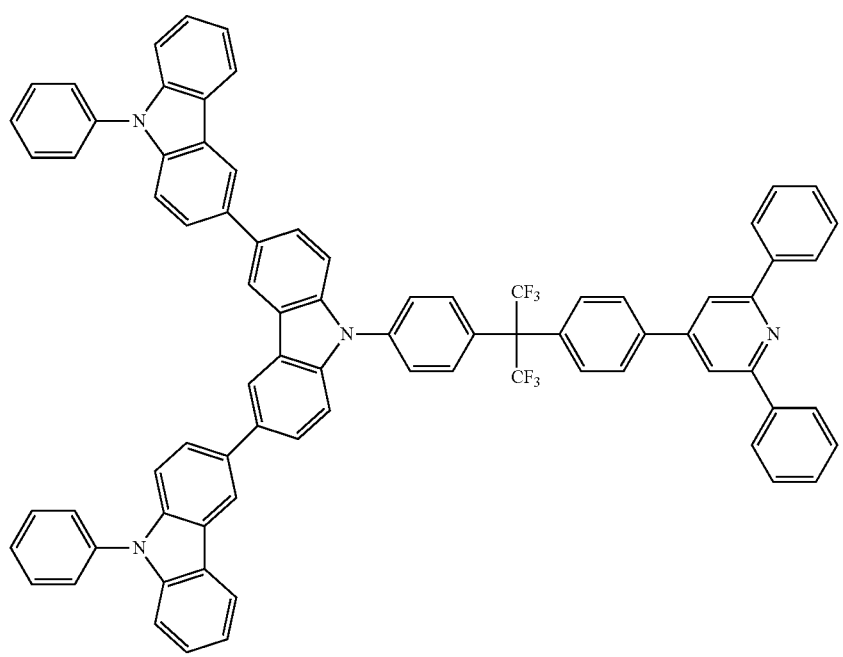

COMPOUND 47
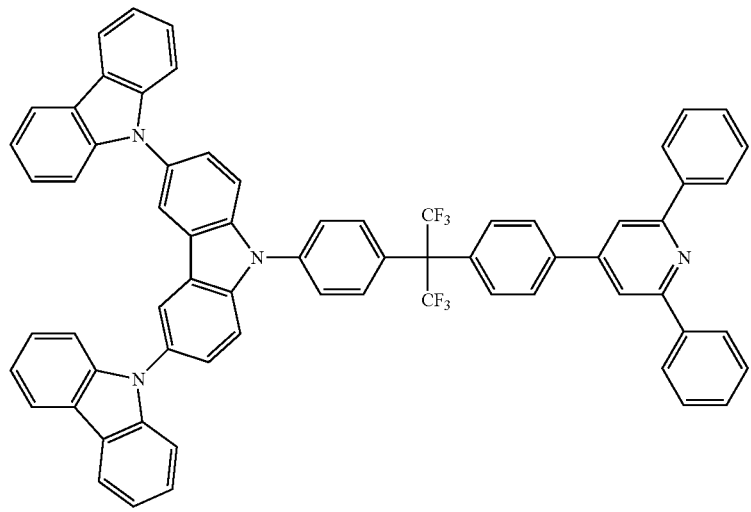
COMPOUND 48
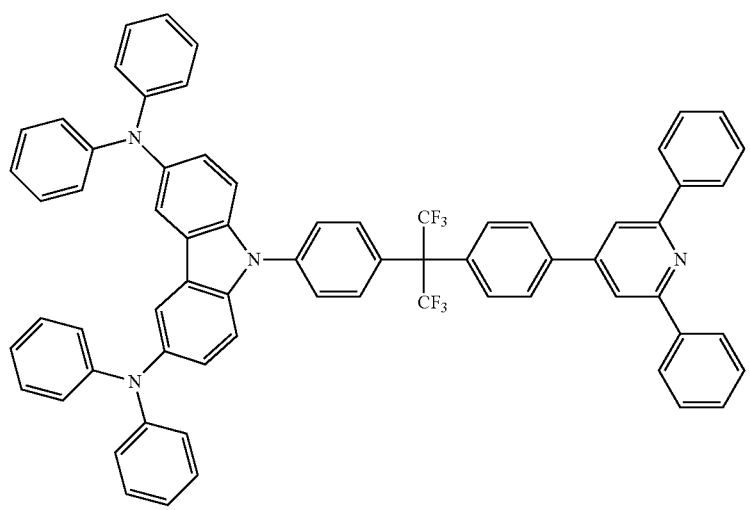
COMPOUND 49
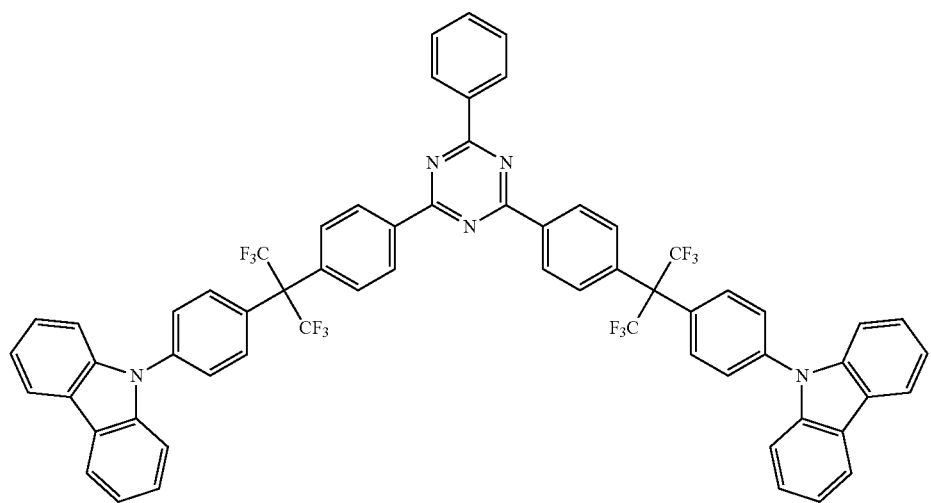

COMPOUND 50
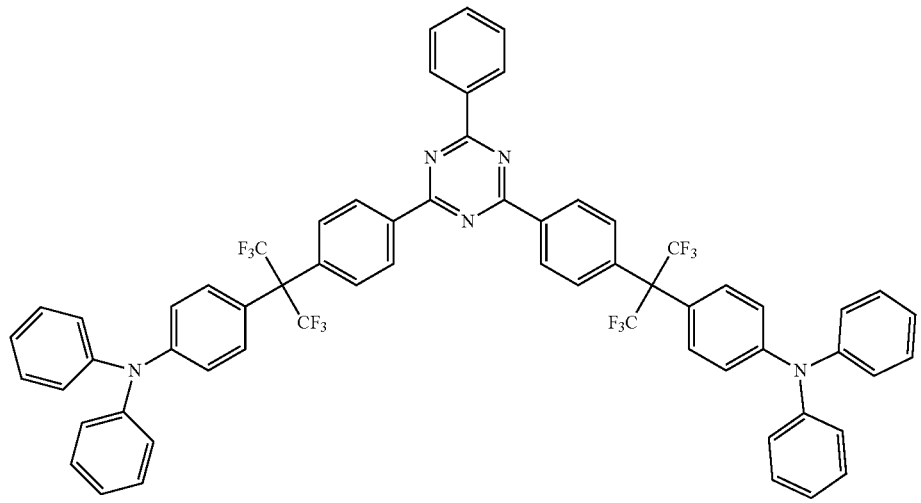
COMPOUND 51
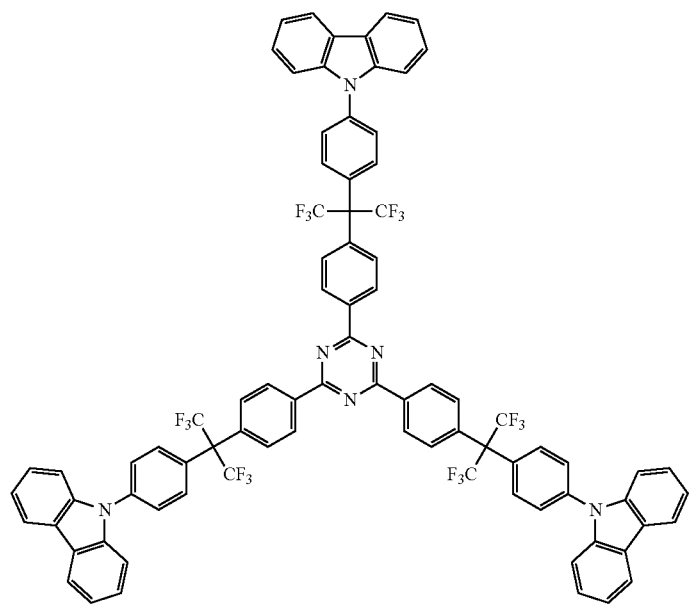

COMPOUND 52
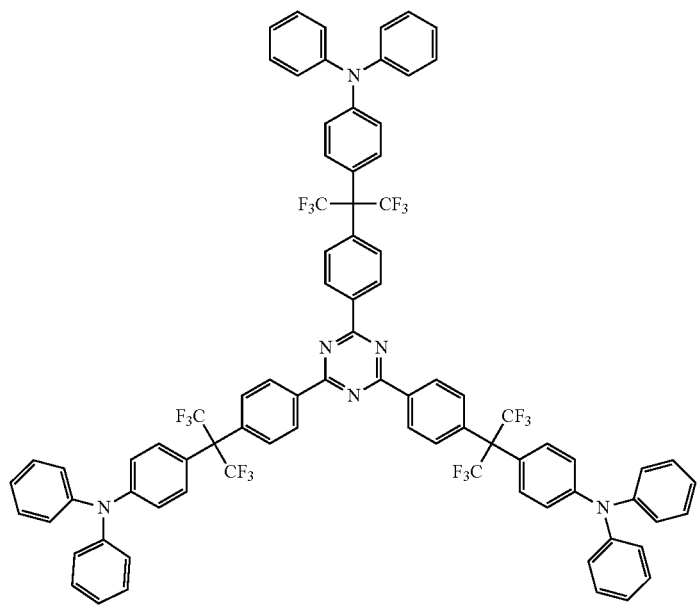
COMPOUND 53
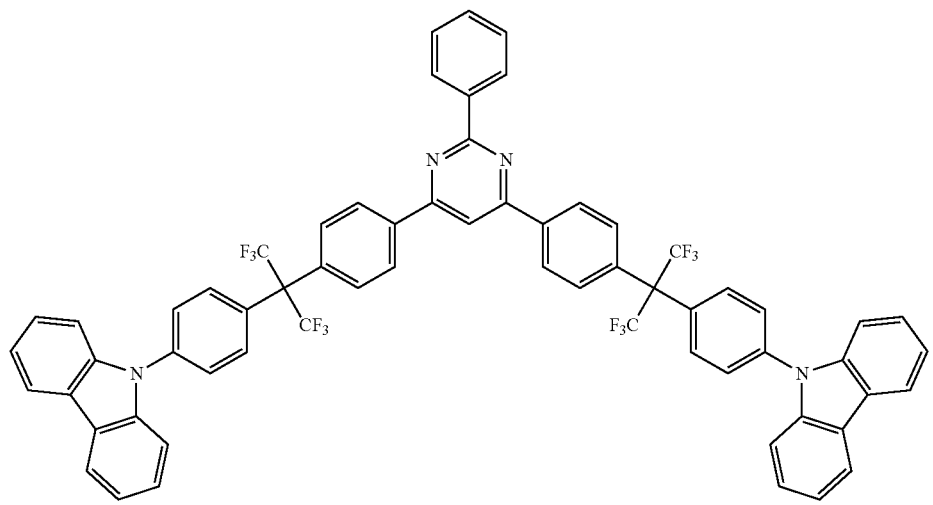
COMPOUND 54
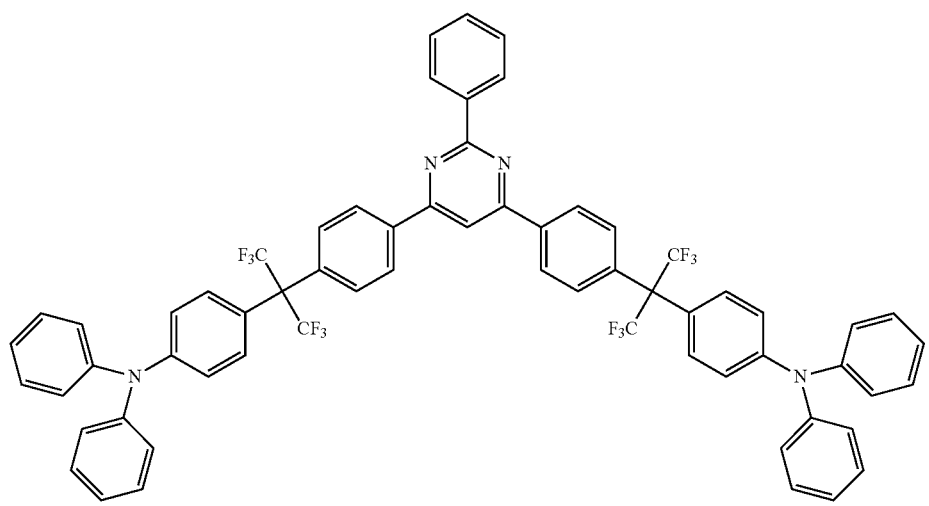

COMPOUND 55
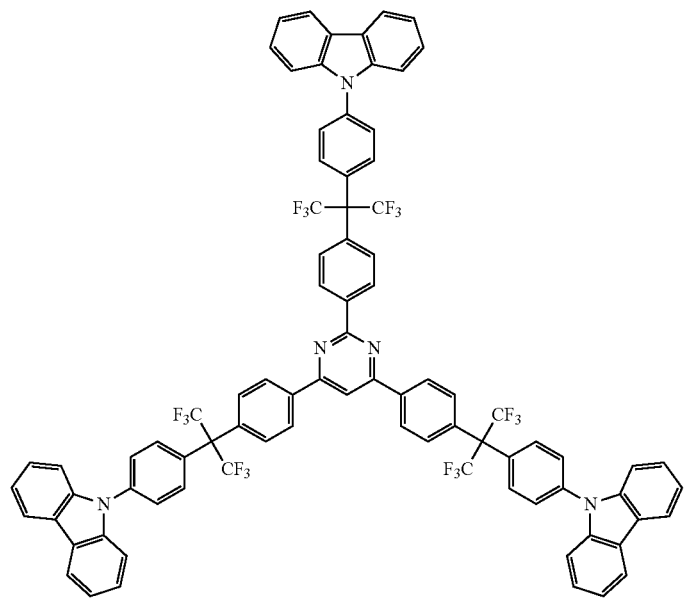
COMPOUND 56
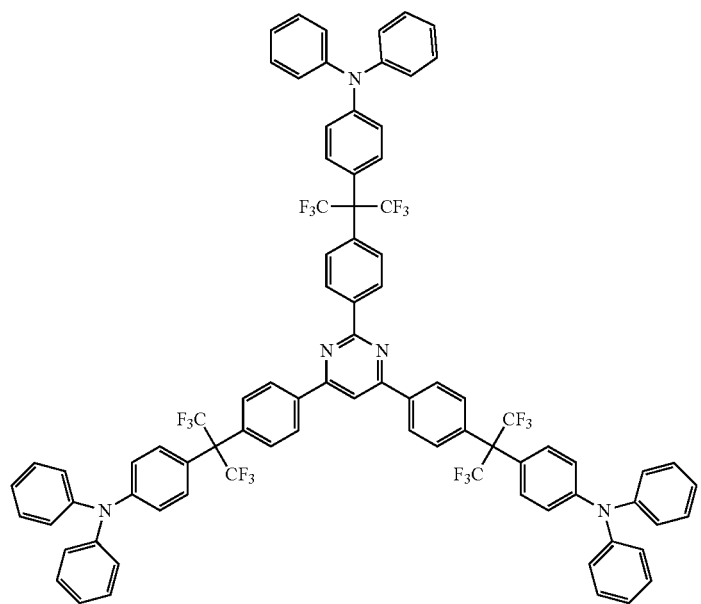

COMPOUND 57
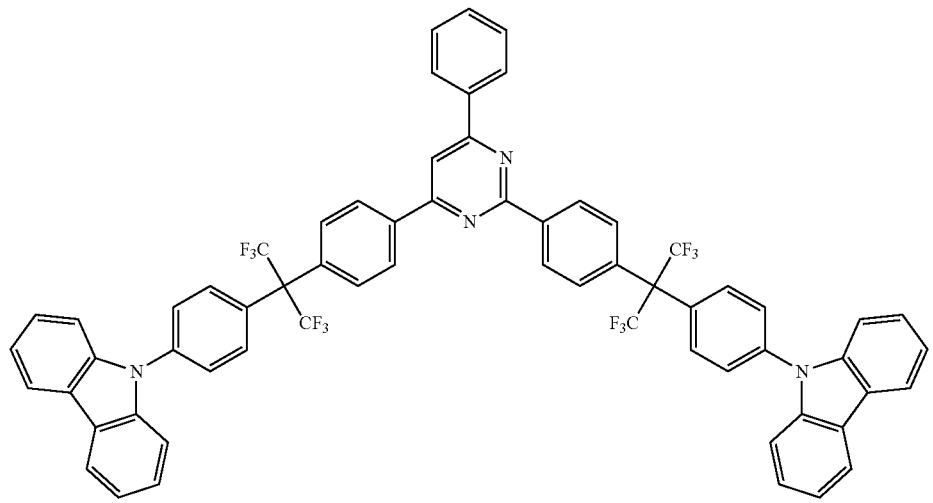
COMPOUND 58
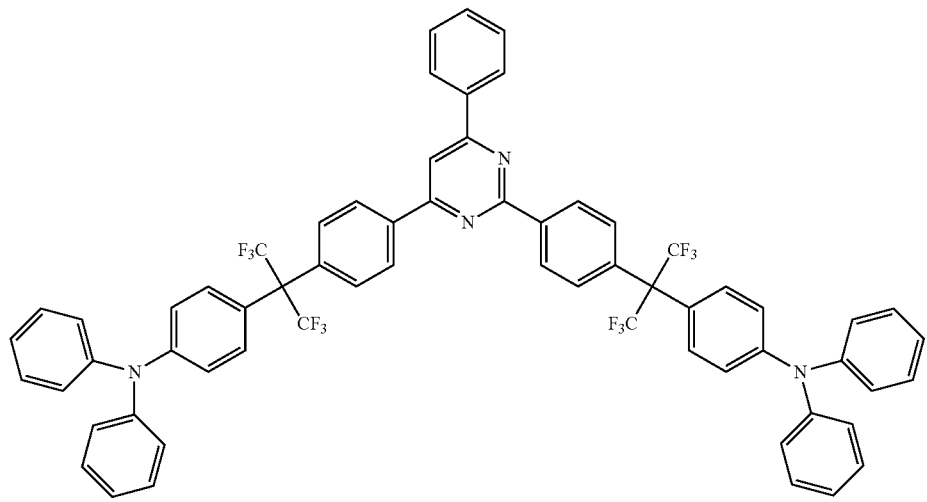
COMPOUND 59
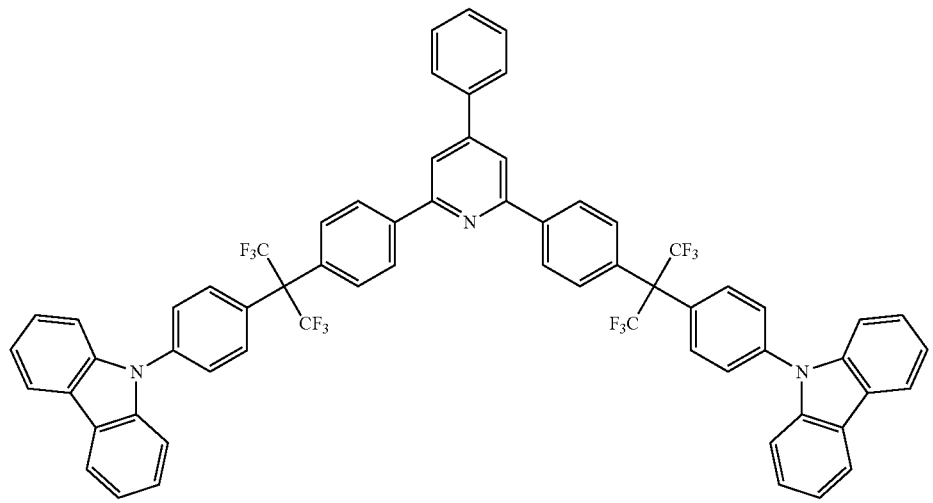

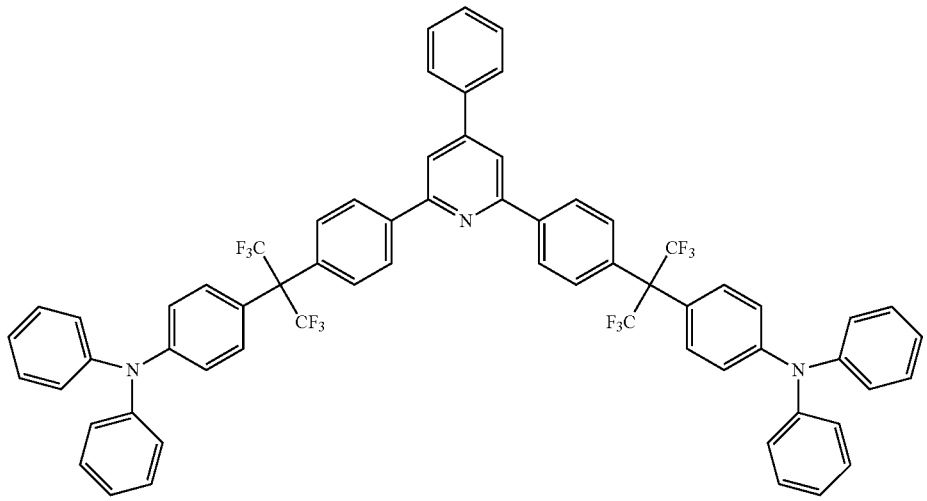

COMPOUND 60

Next, the compounds represented by the general formula (F) are described below.

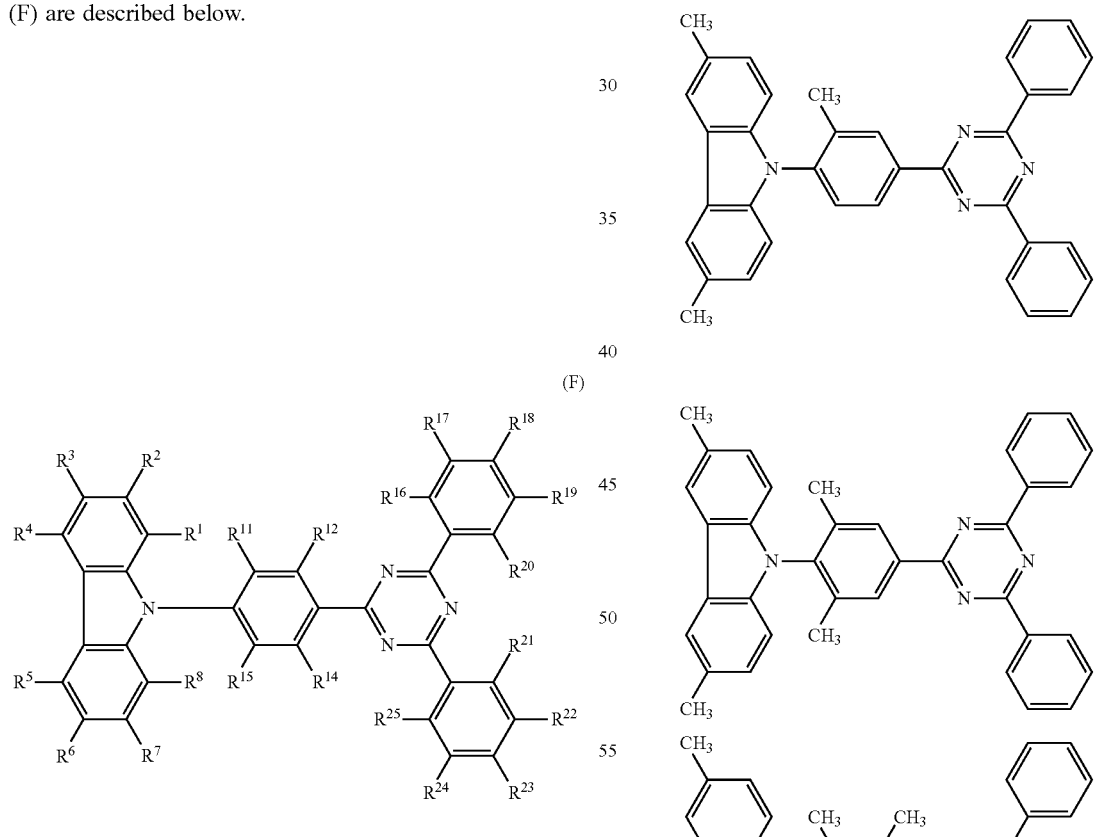

(F)

In the general formula (F), $R^1$ to $R^8$, $R^{12}$ and $R^{14}$ to $R^{25}$ each independently represent a hydrogen atom or a substituent, $R^{11}$ represents a substituted or unsubstituted alkyl group. However, at least one of $R^2$ to $R^4$ is a substituted or unsubstituted alkyl group, and at least one of $R^5$ to $R^7$ is a substituted or unsubstituted alkyl group.

Specific examples of the compounds represented by the general formula (F) are shown below.

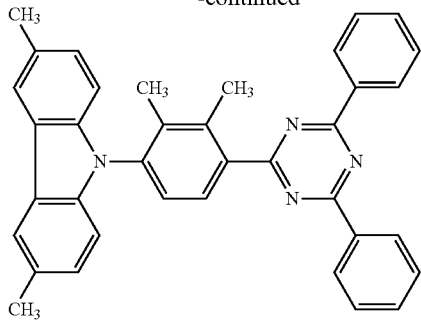
Next, as examples of the light-emitting material for use in the light-emitting layer, exemplary compounds of a phosphorescent material are shown below.
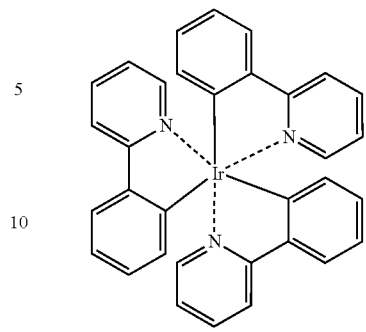
Next, preferred compounds for use as a host material in the light-emitting layer are shown below.
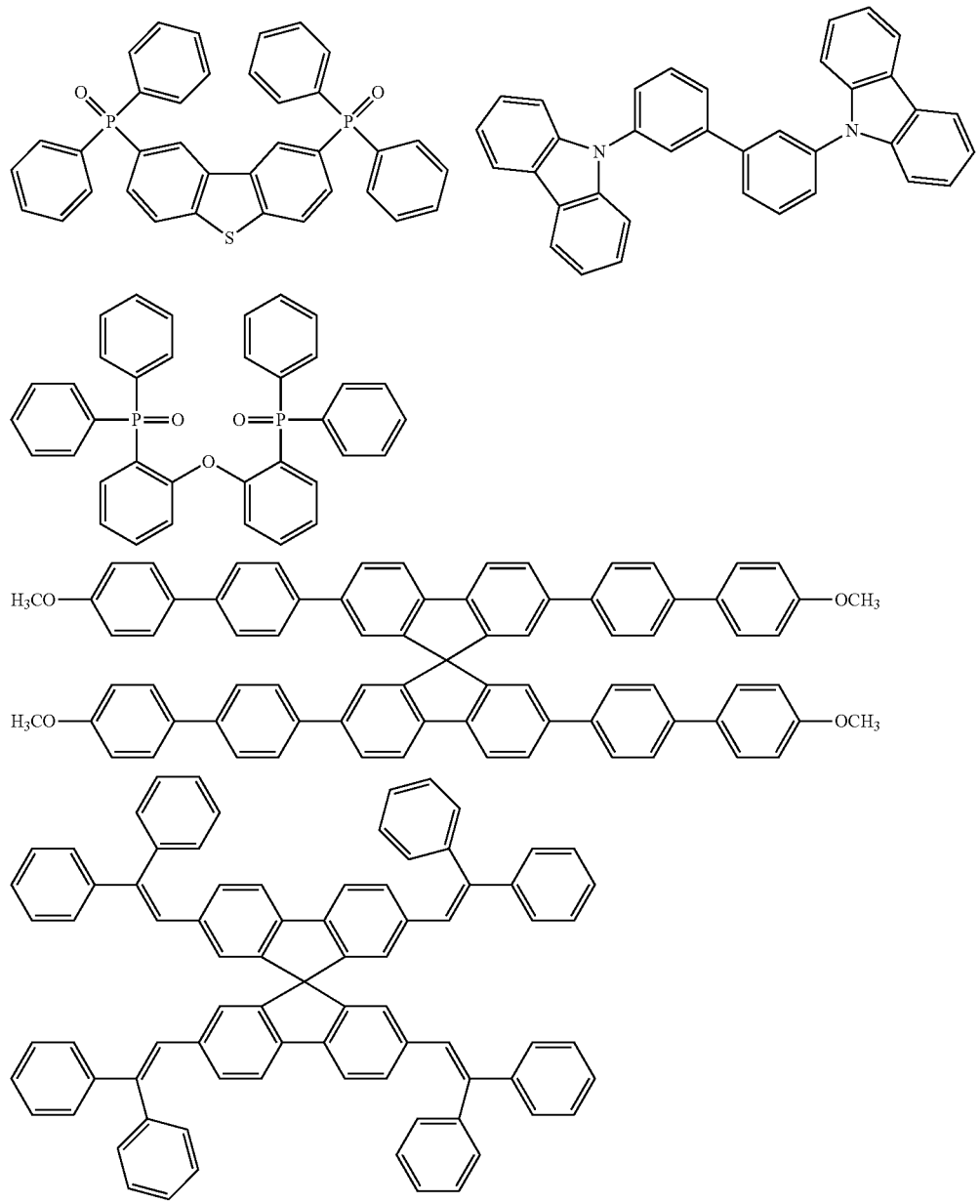

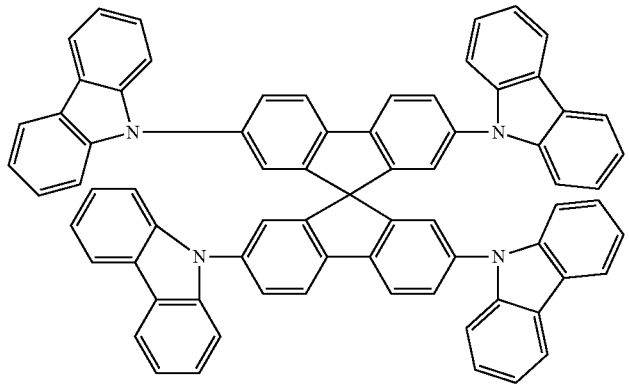
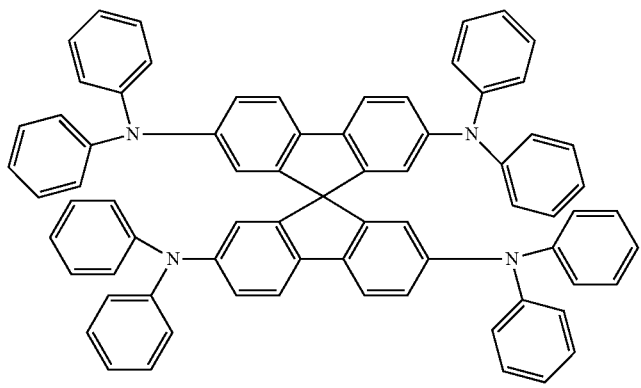
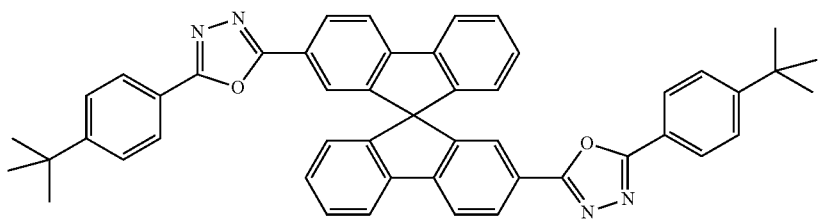
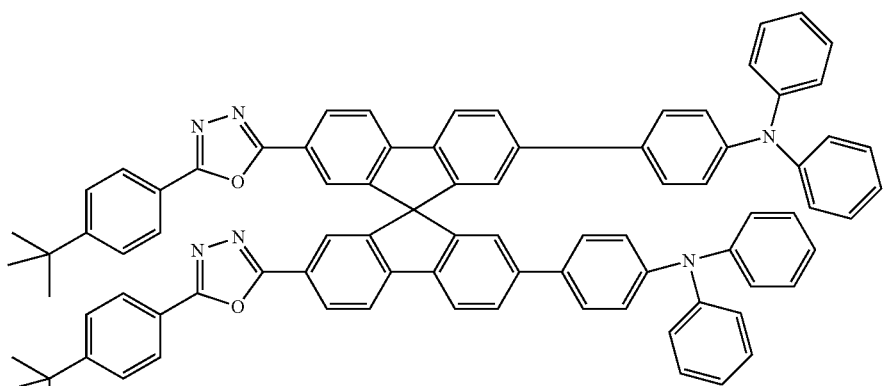
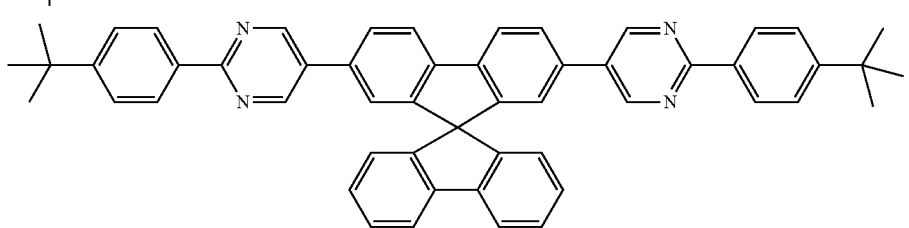

-continued
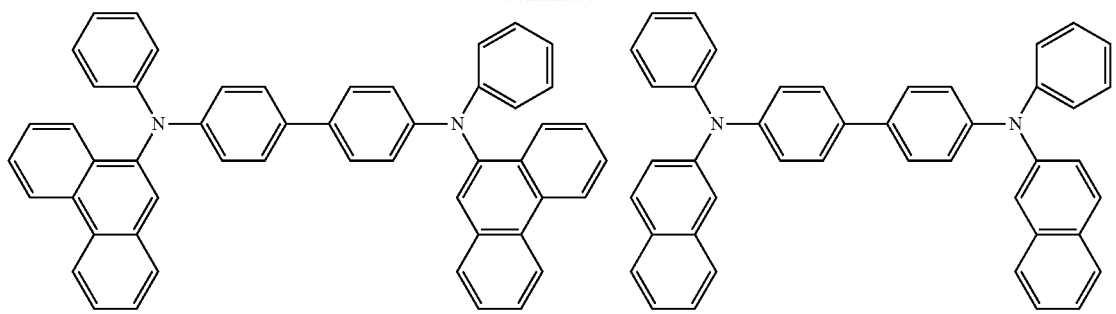
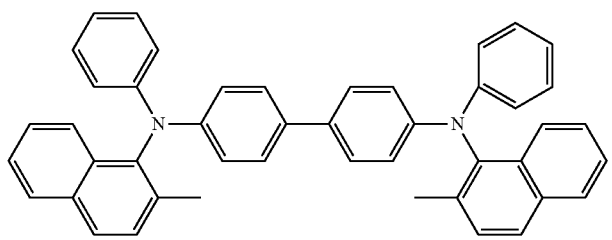
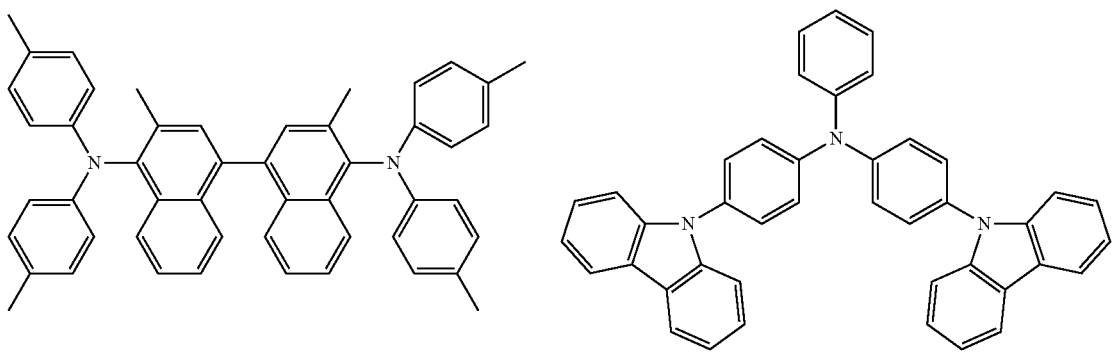
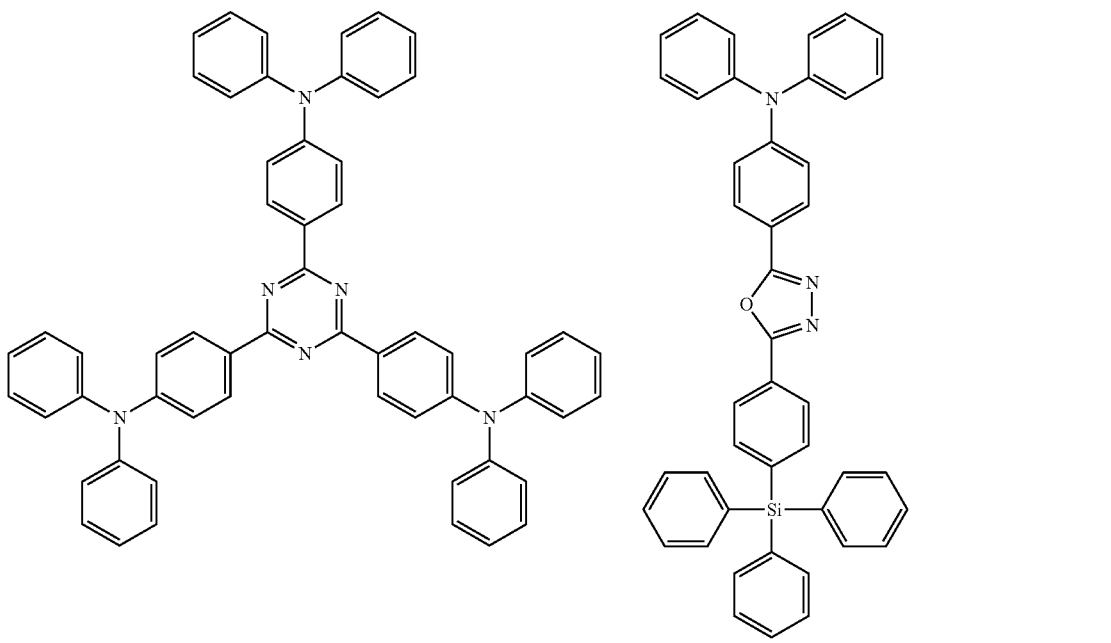

-continued
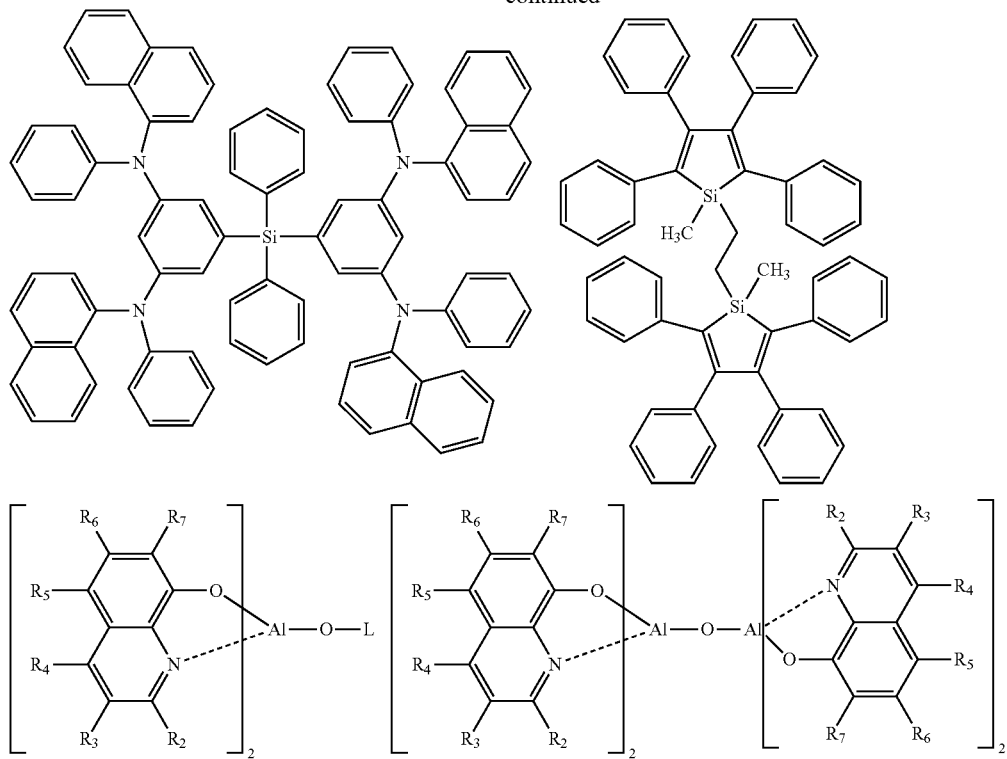
R₂ - R₇ = H or substituent
L = Ligand
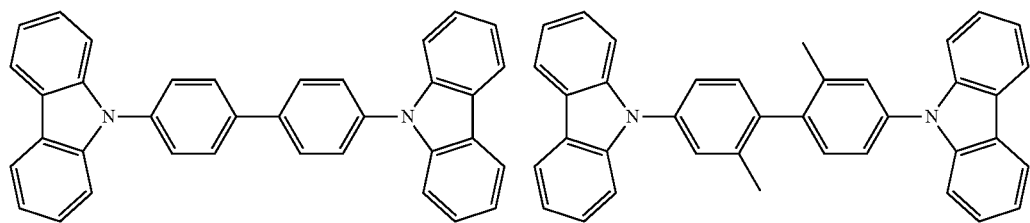
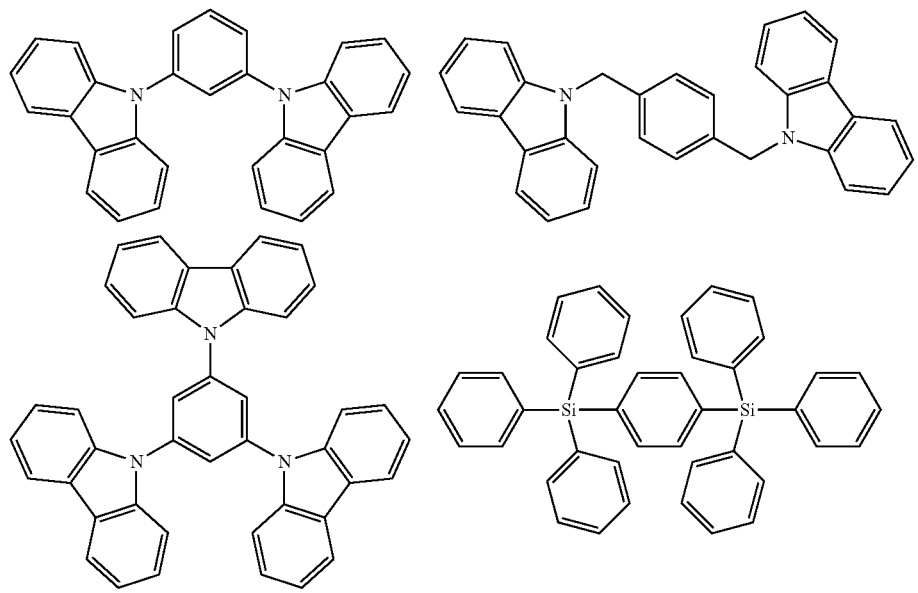

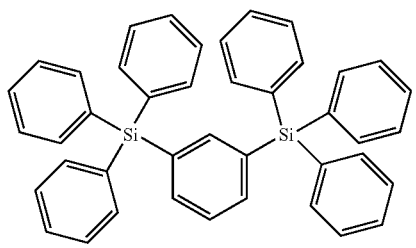 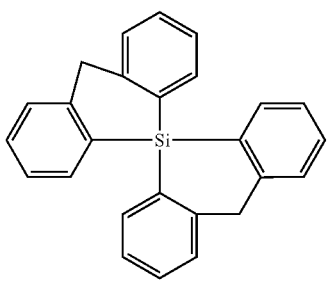
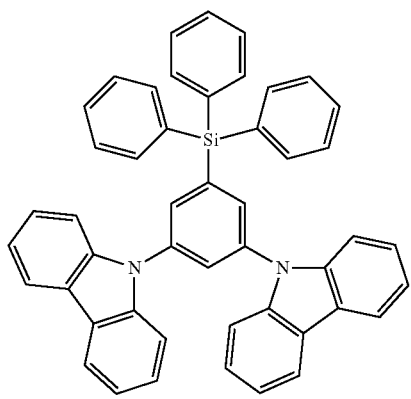 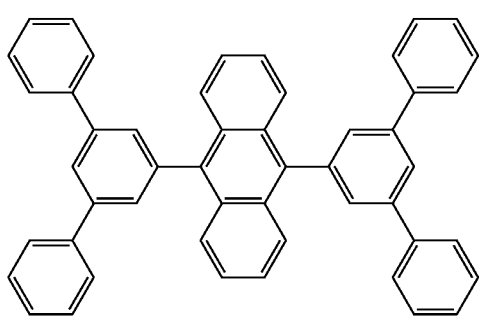
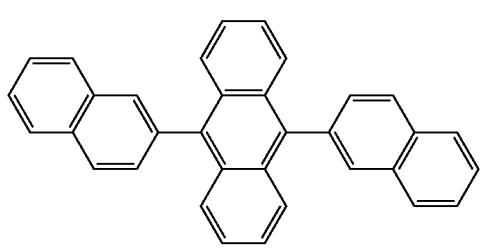 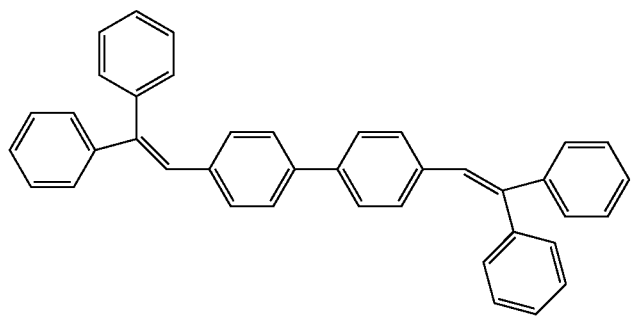
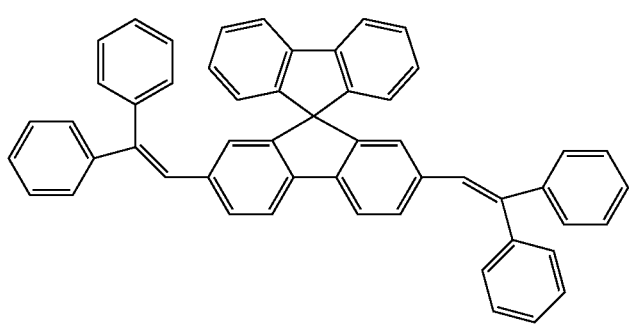 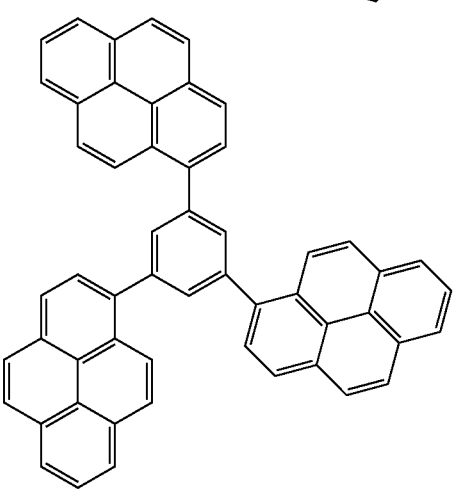

-continued
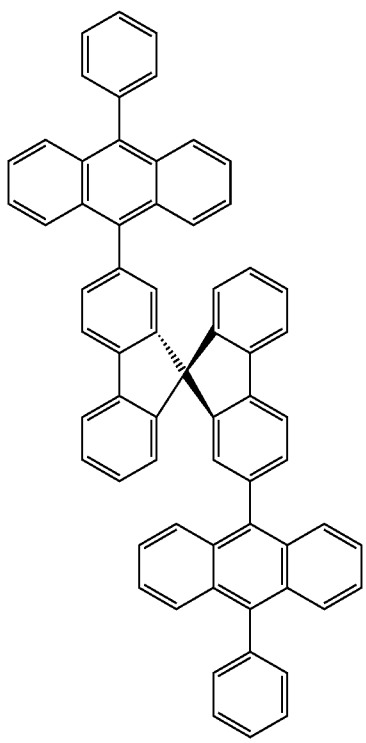
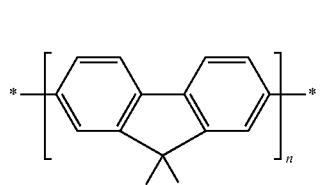
R = alkyl, aryl
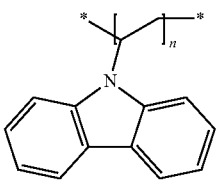
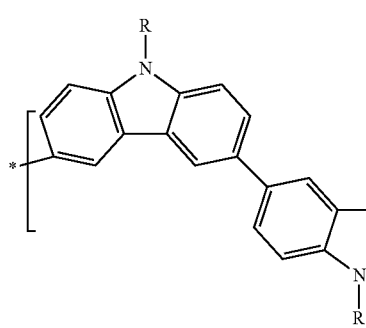
R = alkyl, aryl
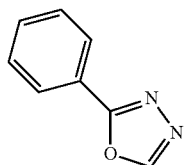
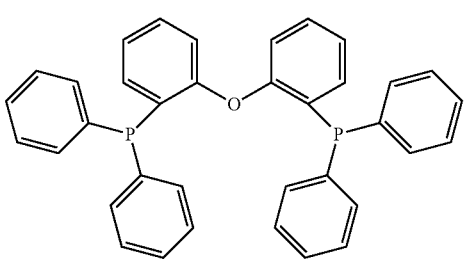
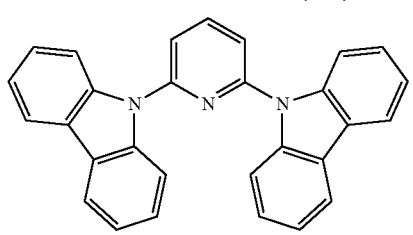
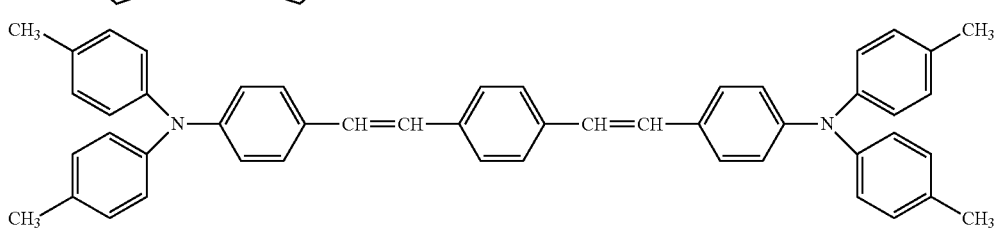

Next, preferred compounds for use as a hole injection material are shown below.
MoO$_x$ (x is 1.5 to 3.0.)
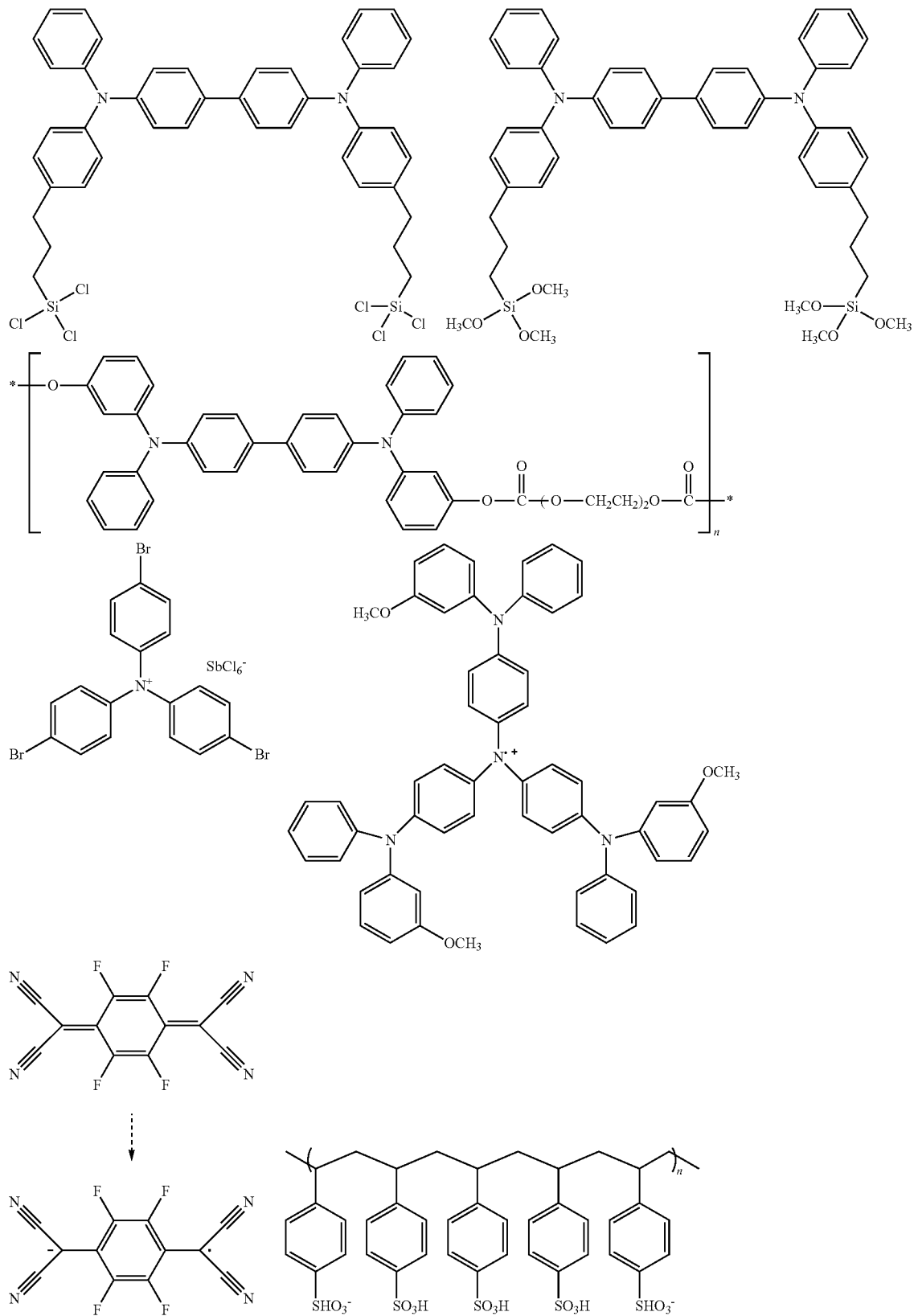

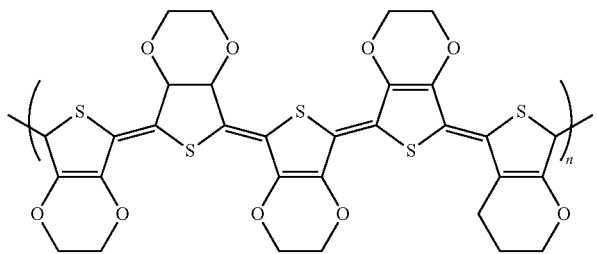
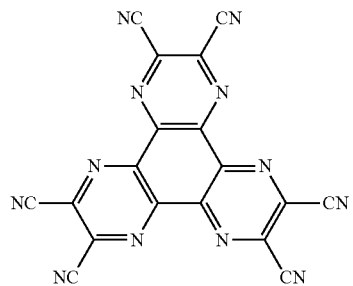

Most preferably, the hole transport layer is formed of a perovskite layer having a thickness of 50 nm or more, and in the case where a perovskite layer having a thickness of 50 nm or more is used as any other layer than a hole transport layer, any other material than a perovskite layer can be used as a hole transport material. Exemplary compounds usable as a hole transport material in such a case are shown below.

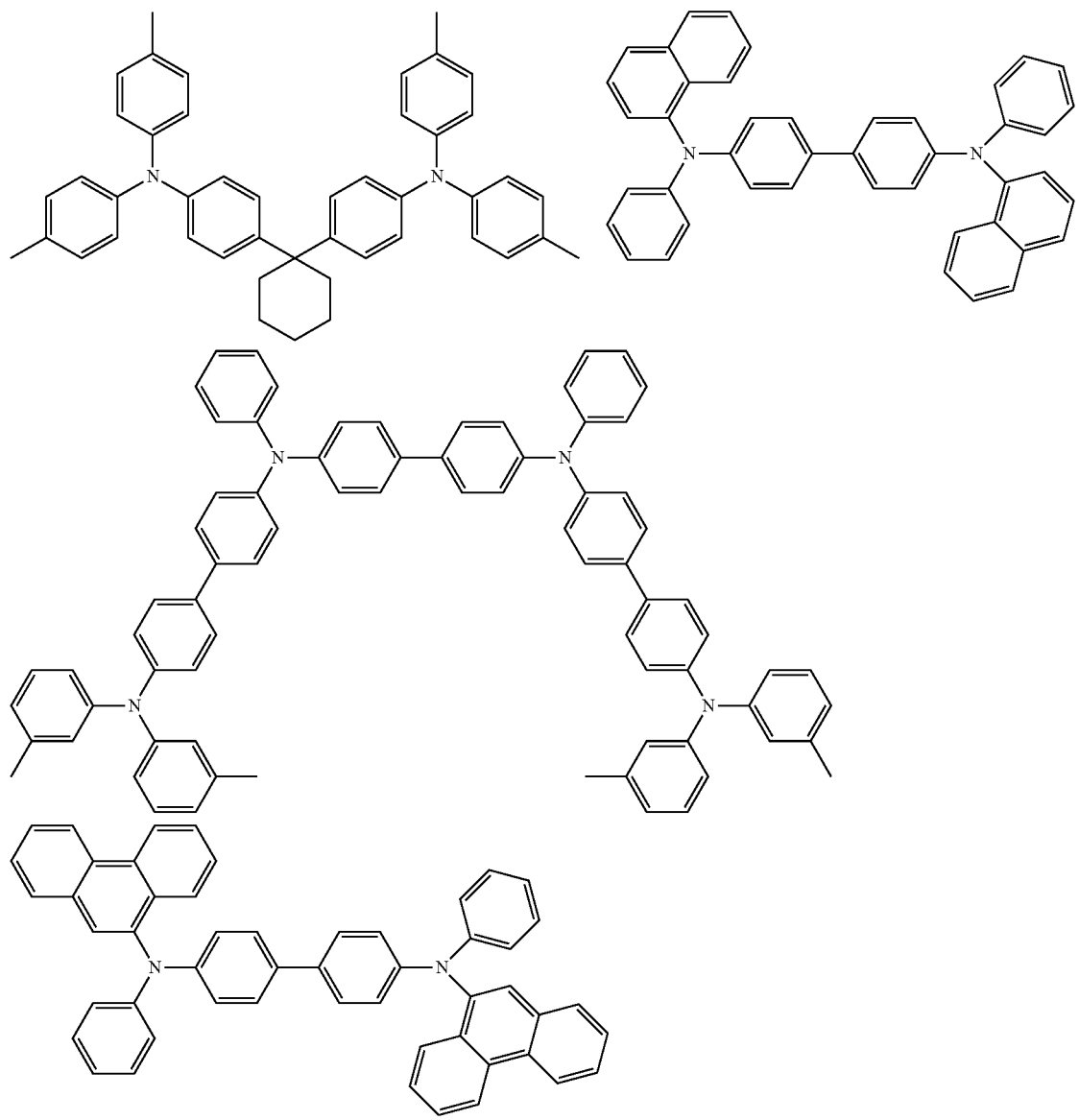

-continued
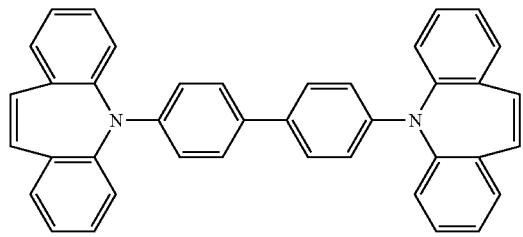
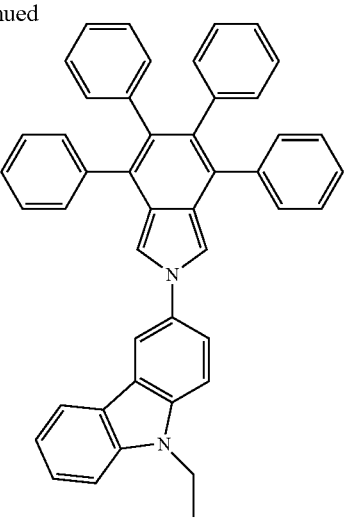
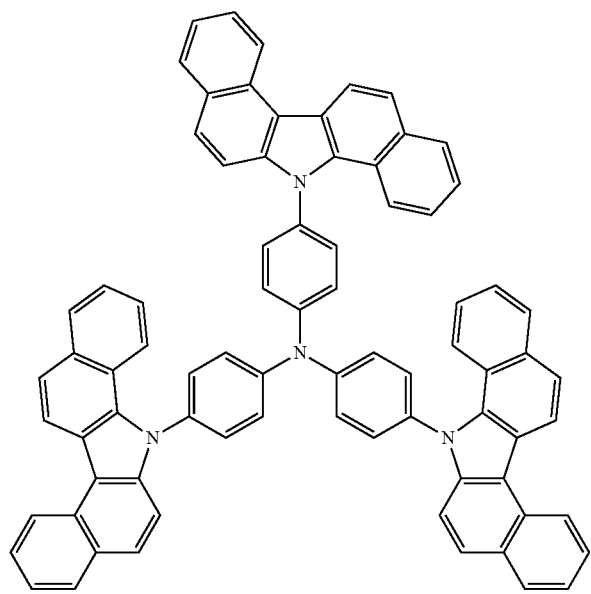
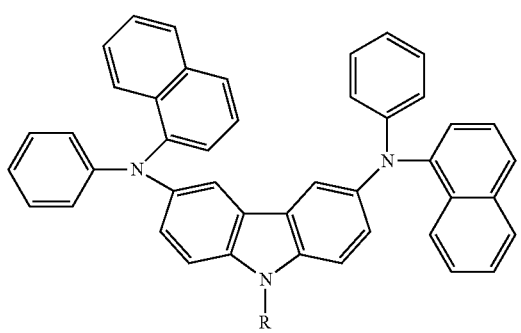
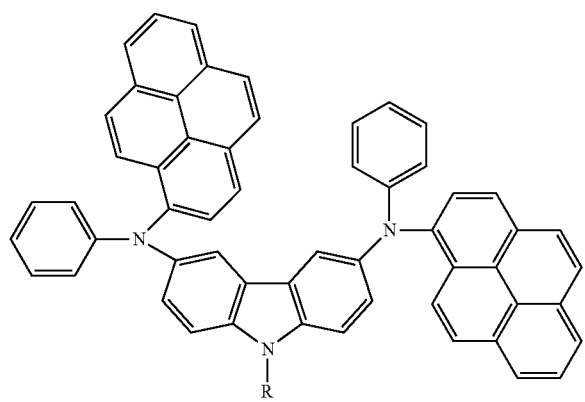
R = alkyl, aryl, alkoxy, aryloxy,
9,9'-dialkylfluorene -continued
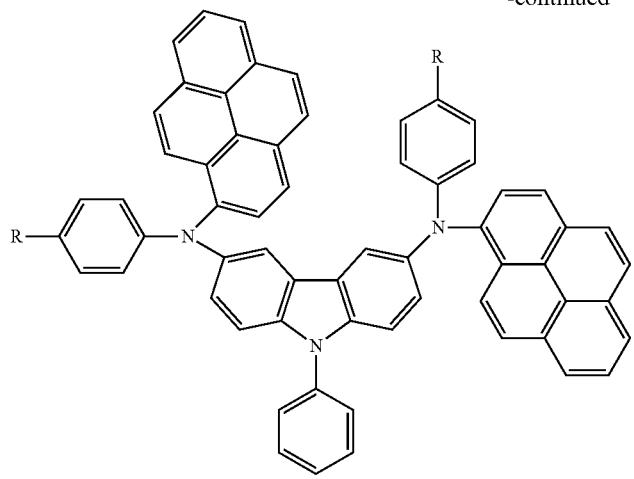
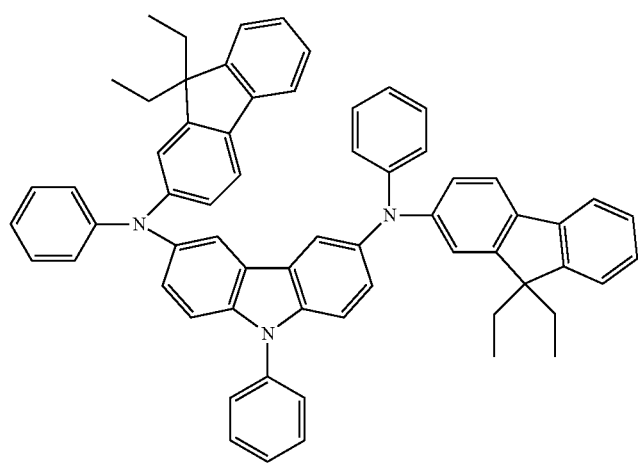
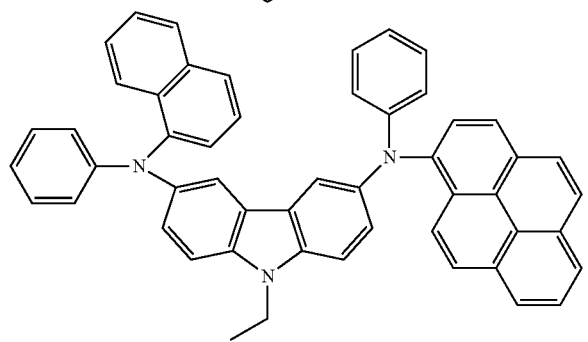
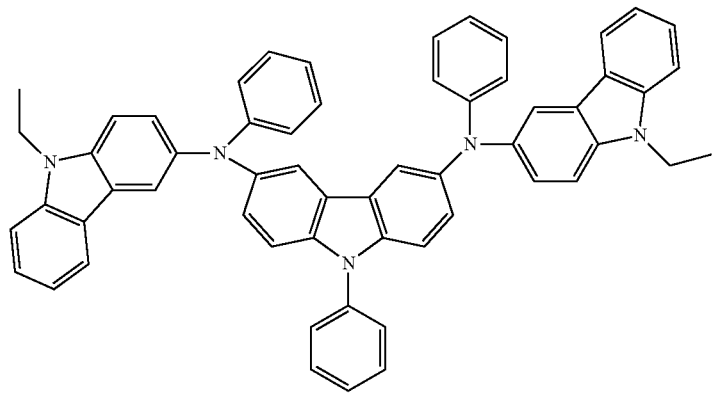

-continued
115 116
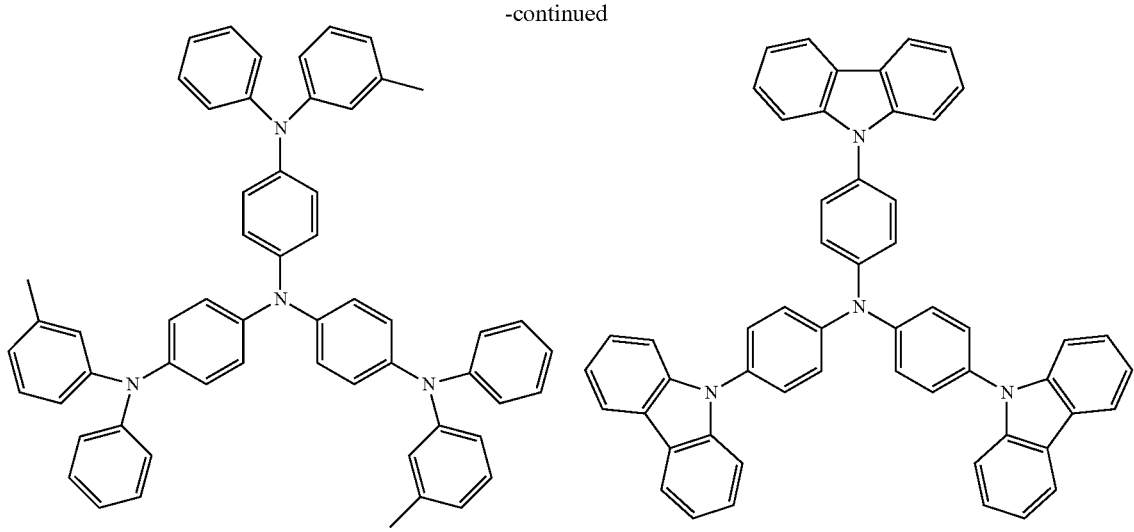
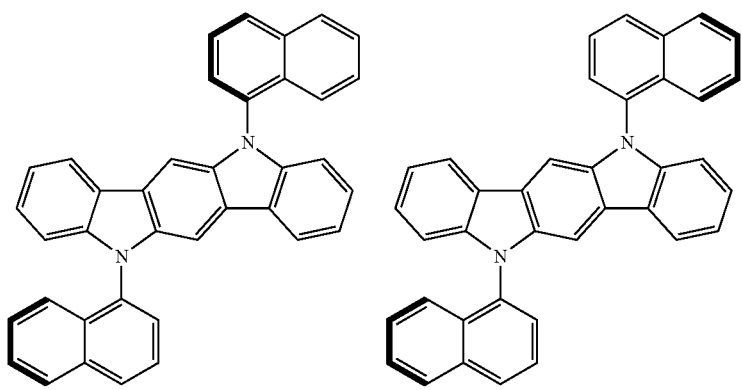
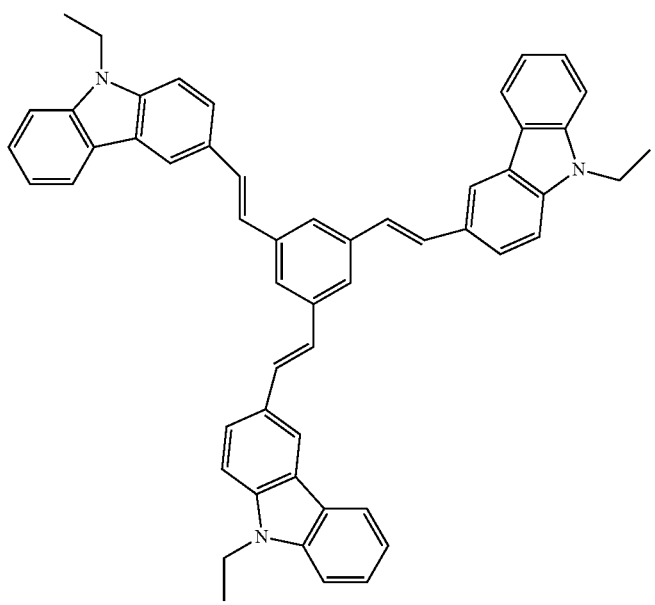

-continued
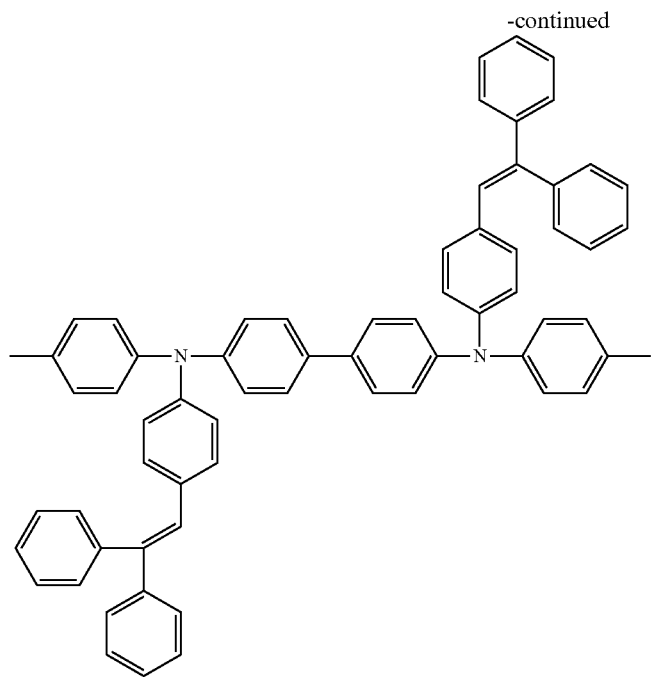
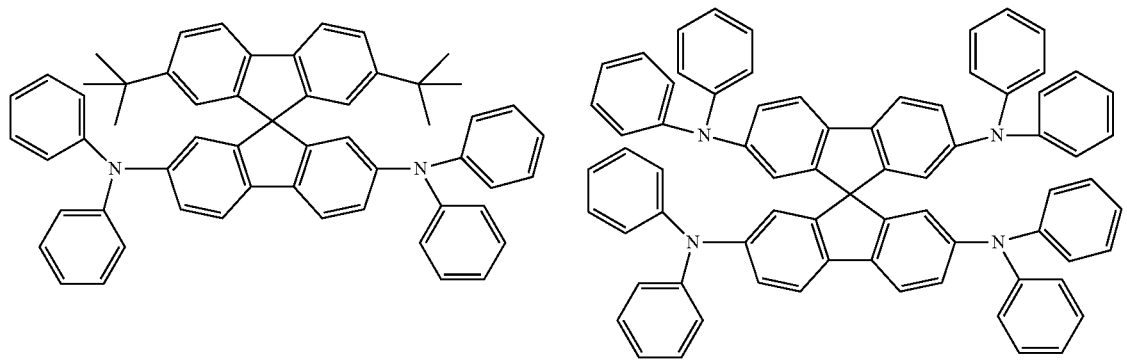
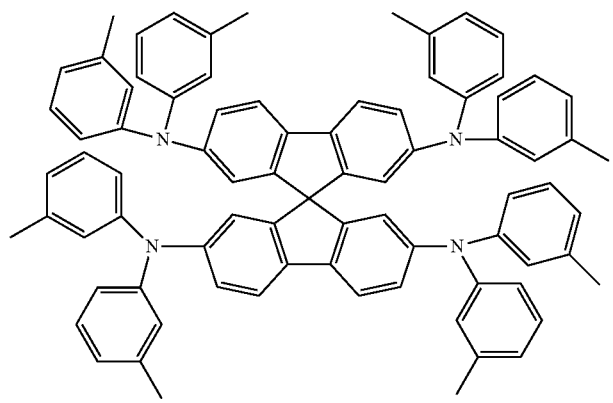

119
120
-continued
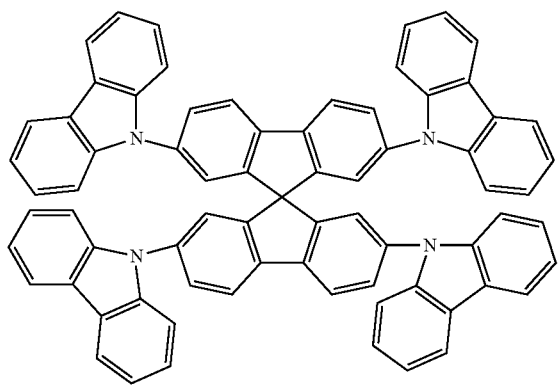
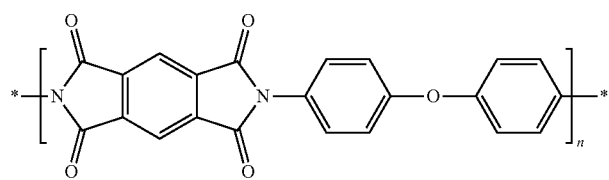
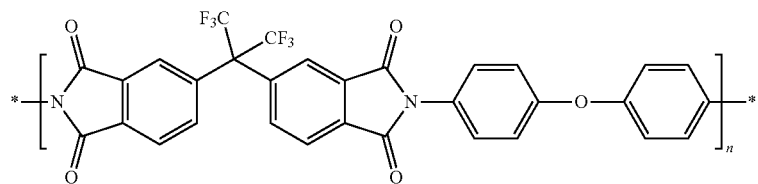
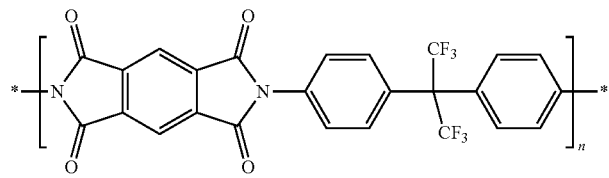
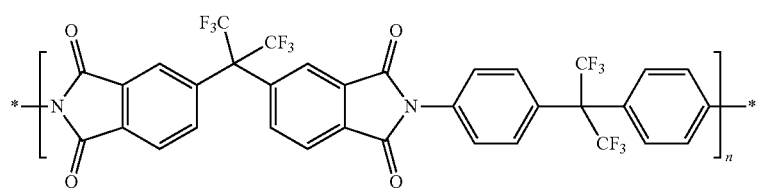
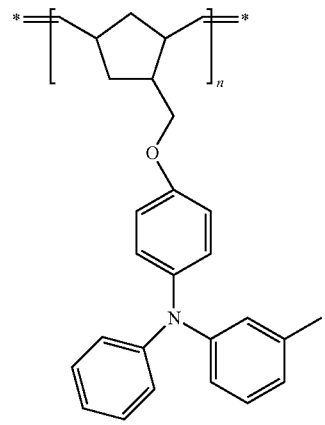

121 122
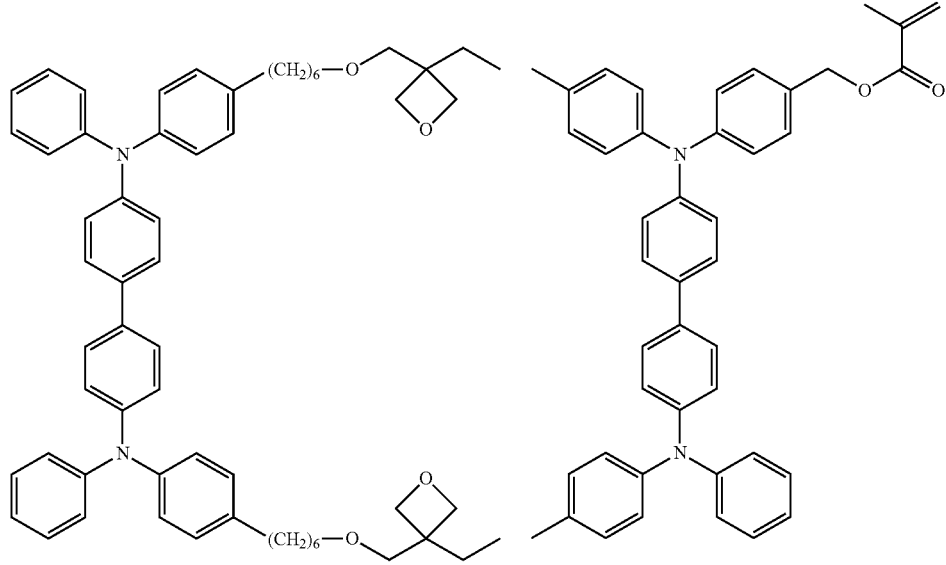
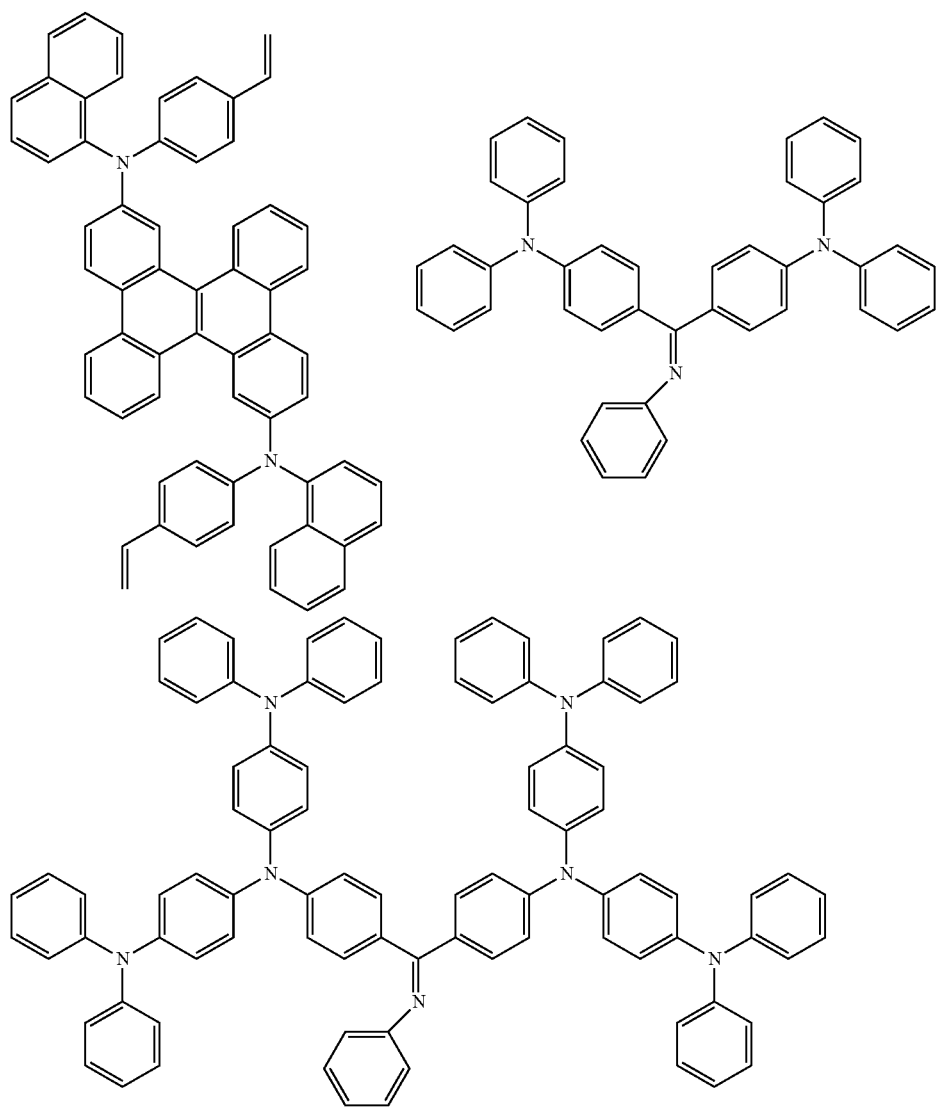

-continued
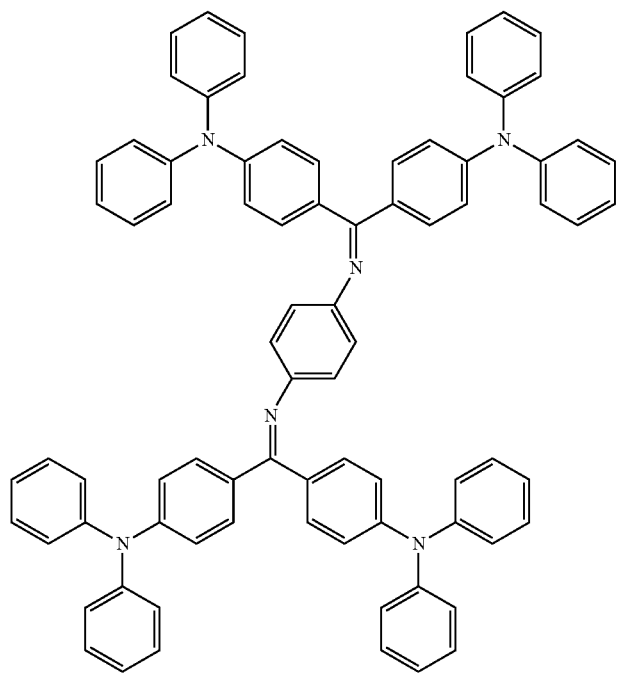
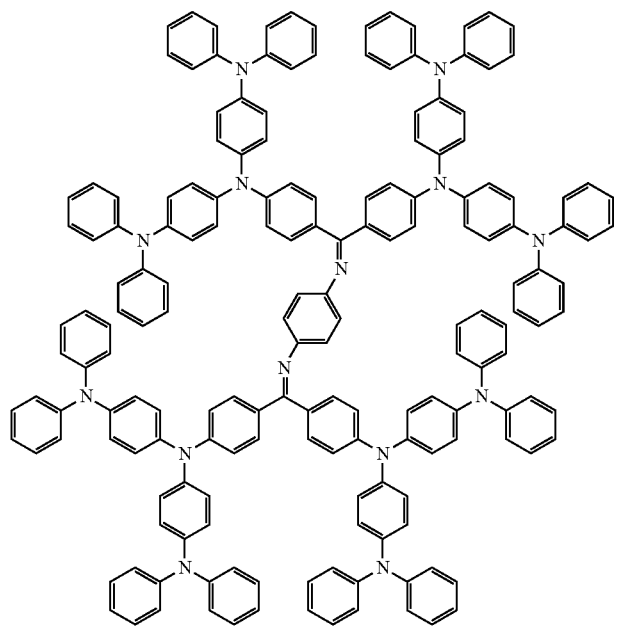

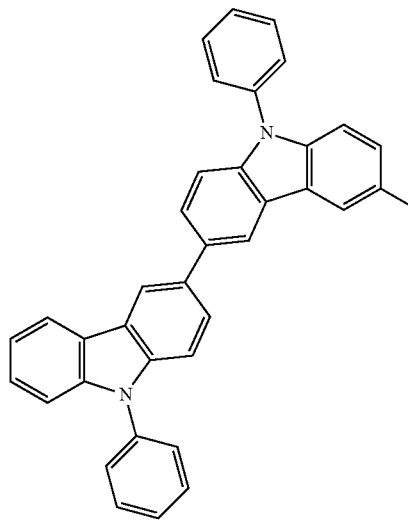
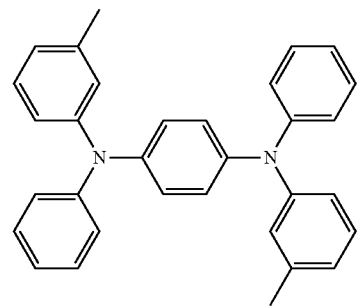
Next, preferred compounds for use as an electron blocking material are shown below.
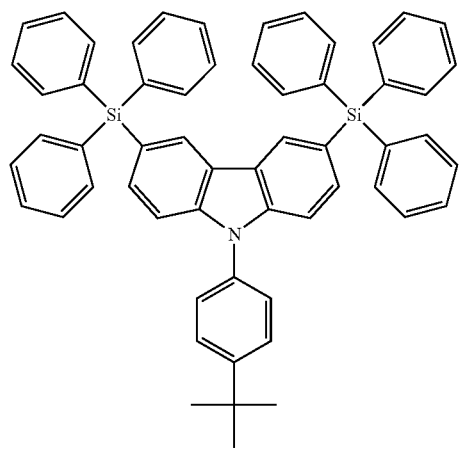
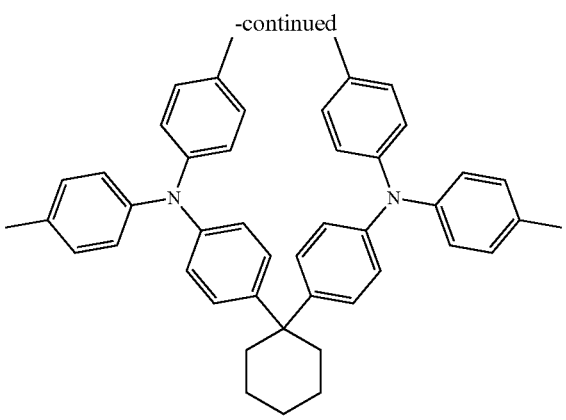
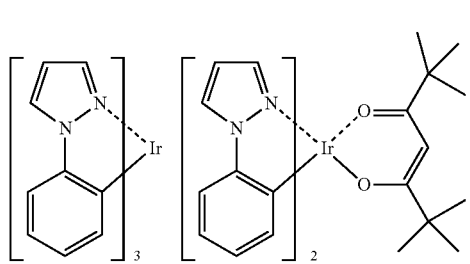
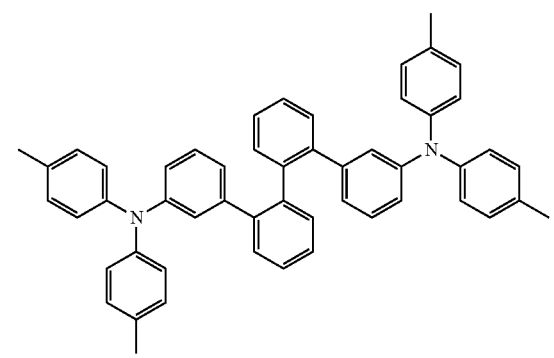

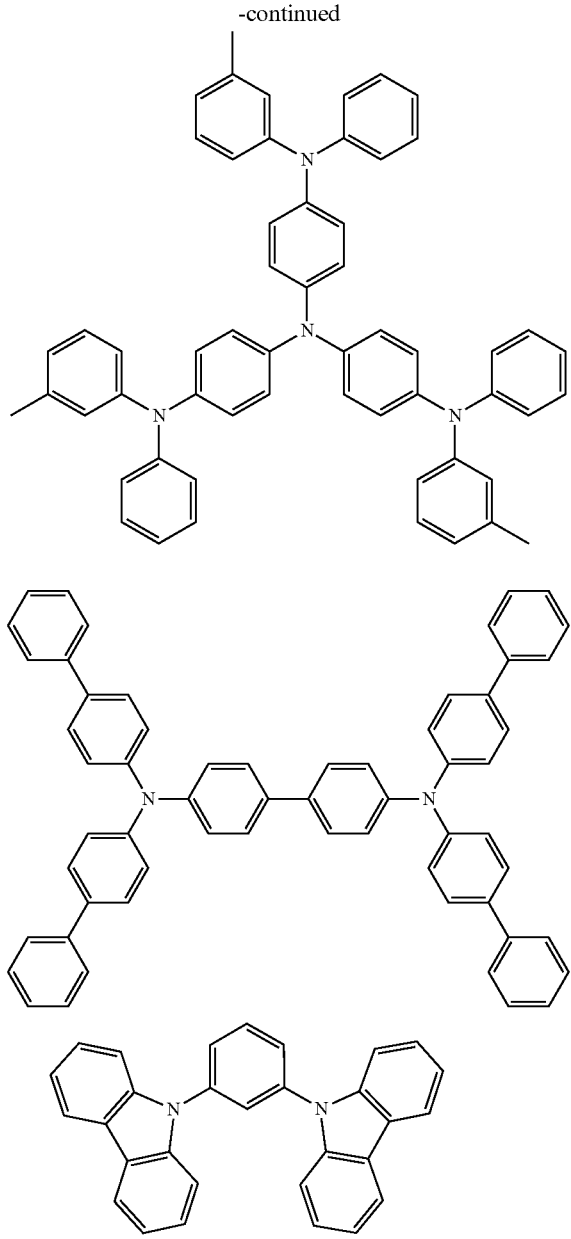
Next, preferred compounds for use as a hole blocking material are shown below.
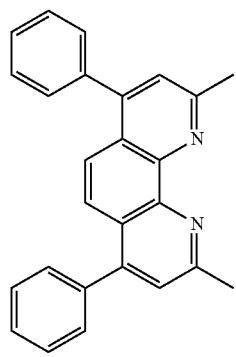
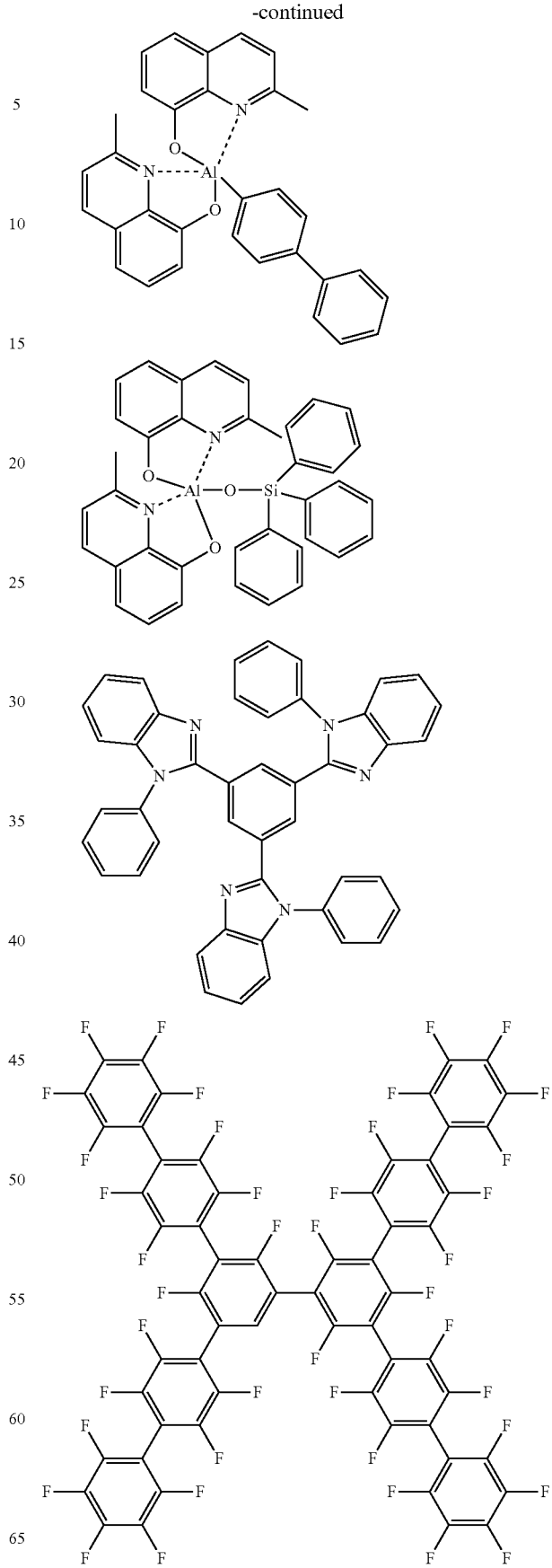

129
-continued

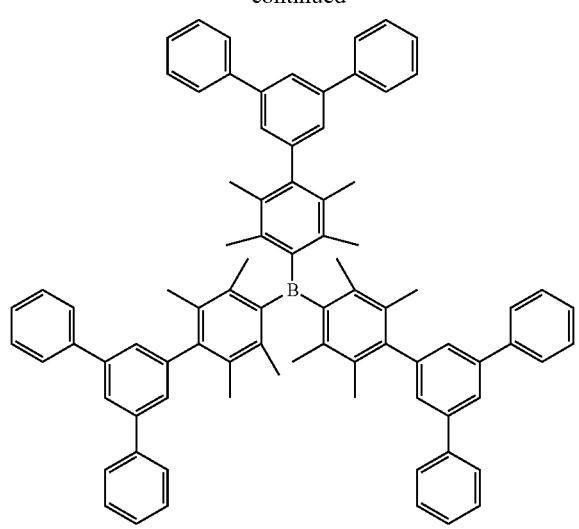

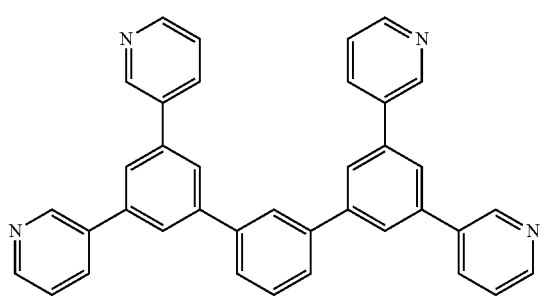

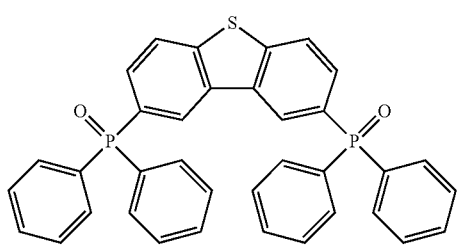

130
-continued

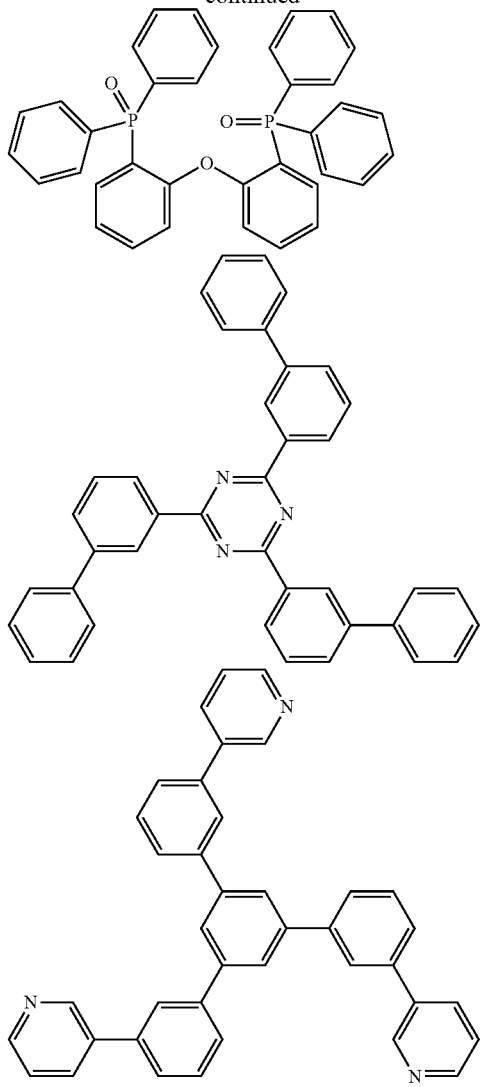

Most preferably, the electron transport layer is formed of a perovskite layer having a thickness of 50 nm or more, and in the case where a perovskite layer having a thickness of 50 nm or more is used as any other layer than an electron transport layer, any other material than a perovskite layer can be used as an electron transport material. Exemplary compounds usable as an electron transport material in such a case are shown below.

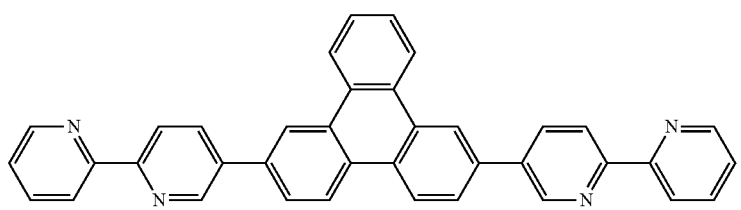

-continued
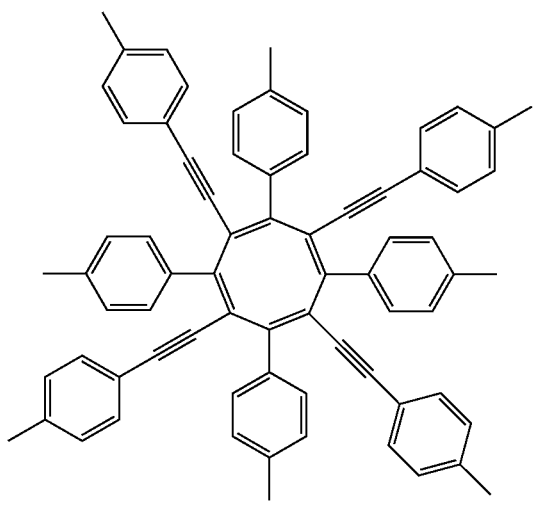
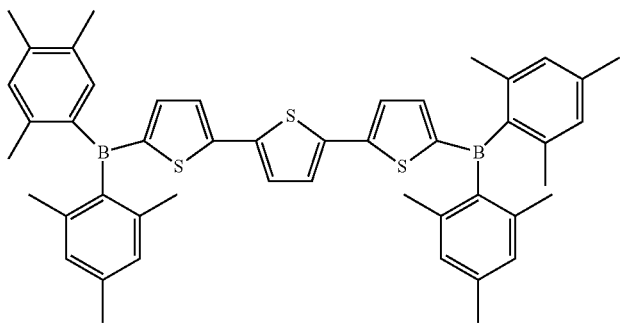
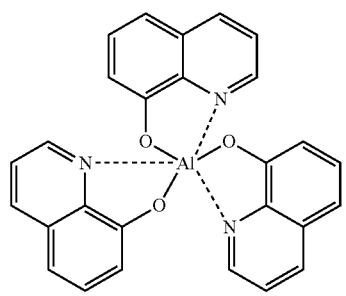
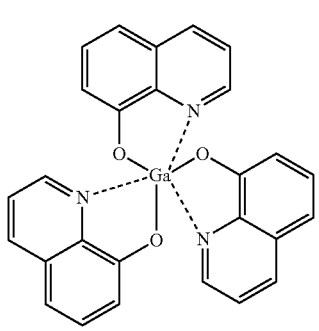
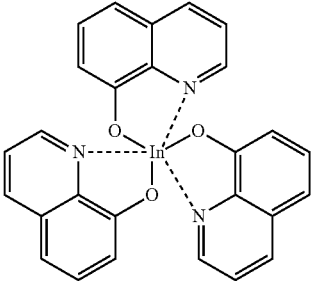
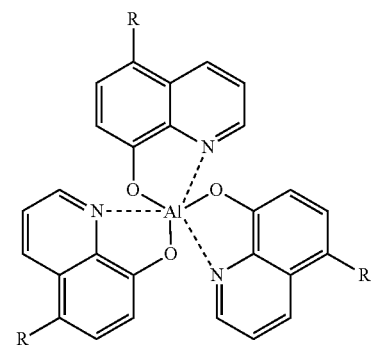
R = H, alkyl, aryl, heteroaryl
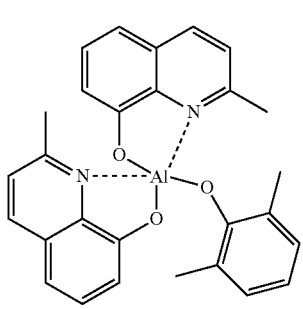
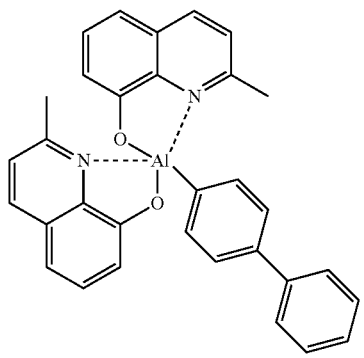

-continued
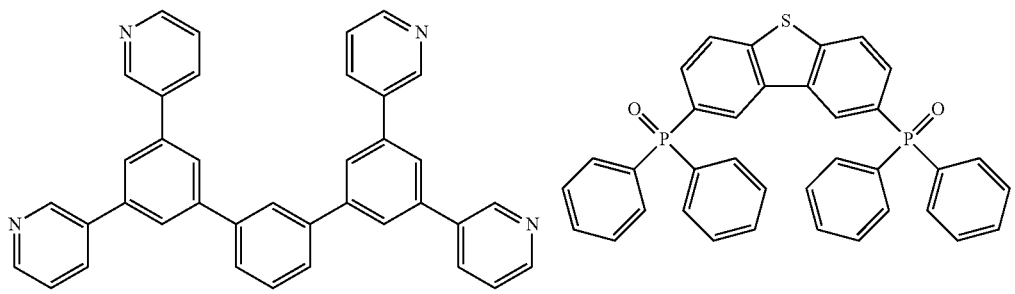
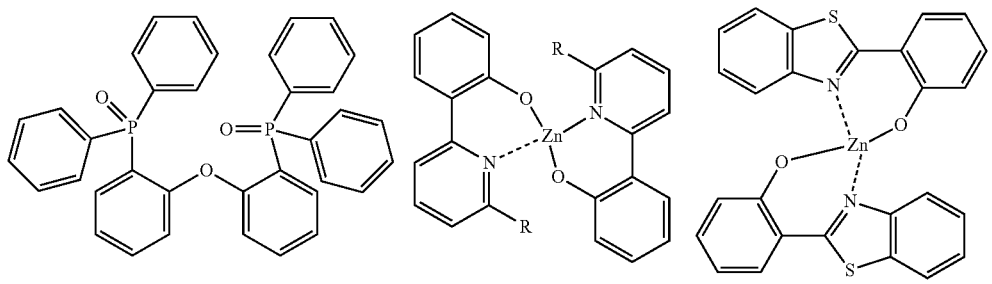
R = H
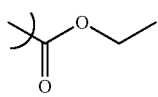
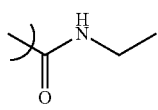
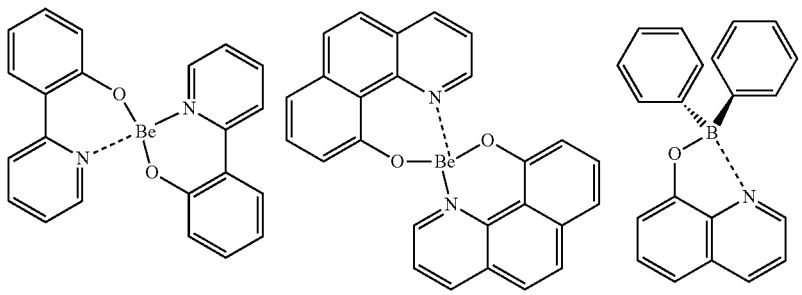
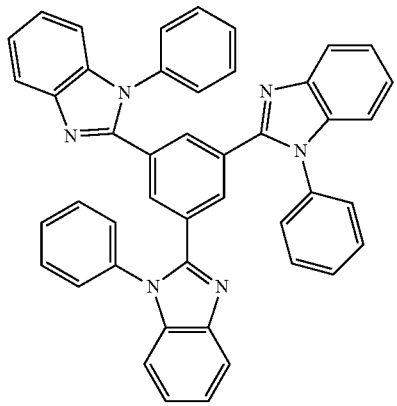

-continued
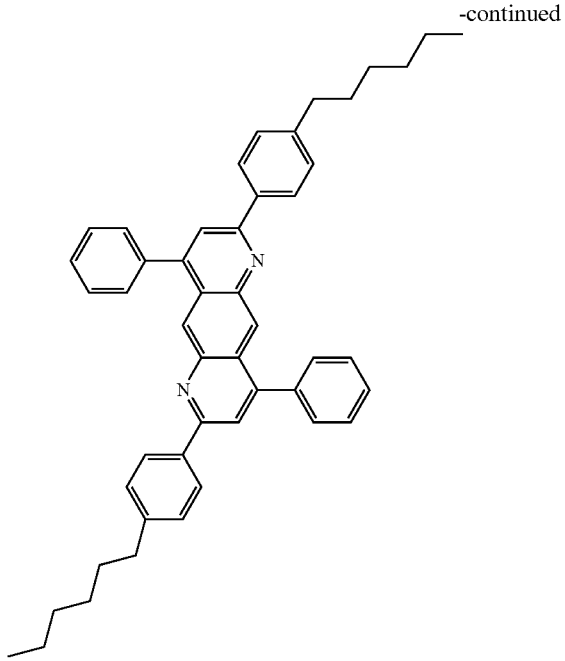
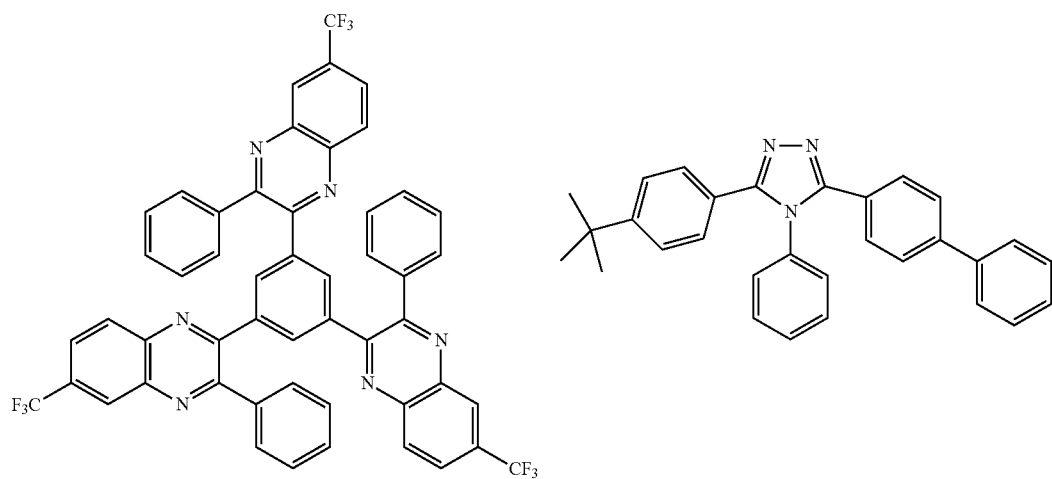
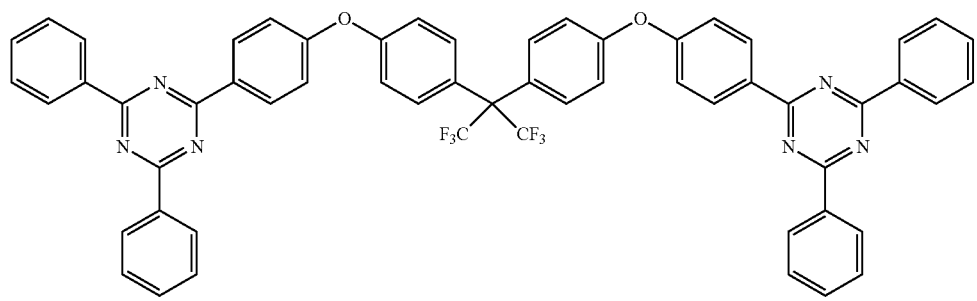
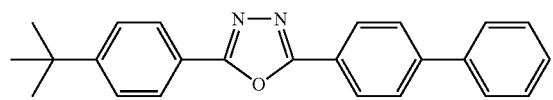

-continued
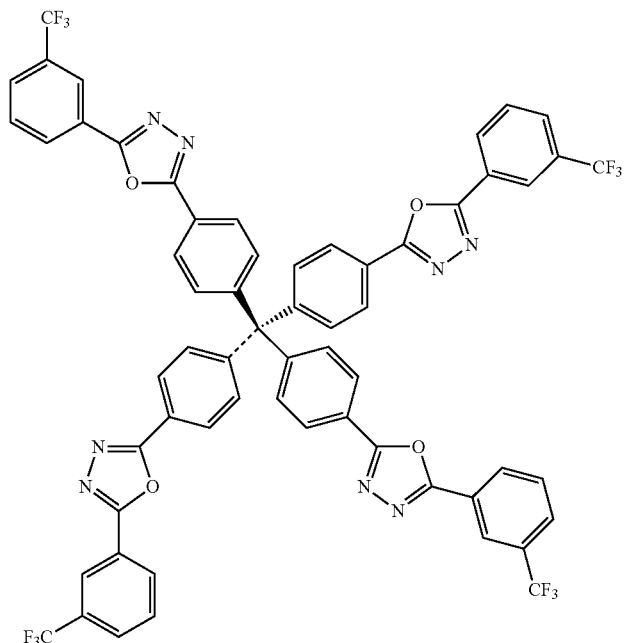
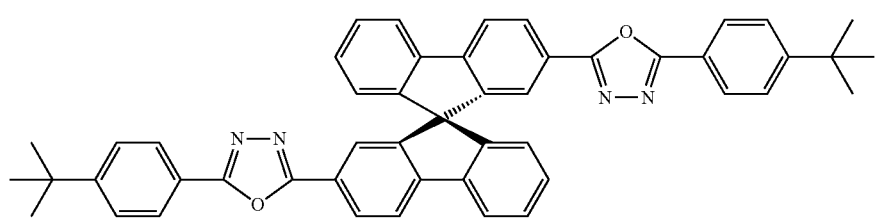
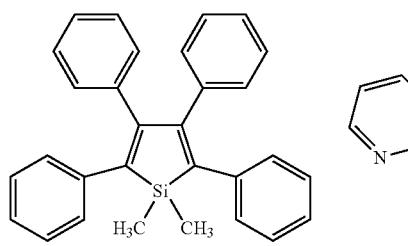
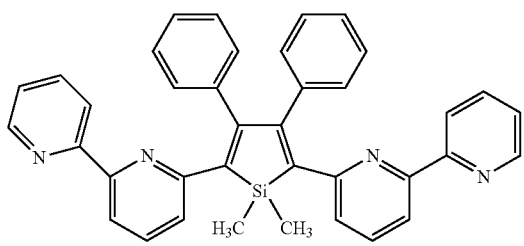
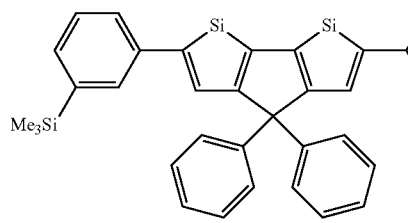
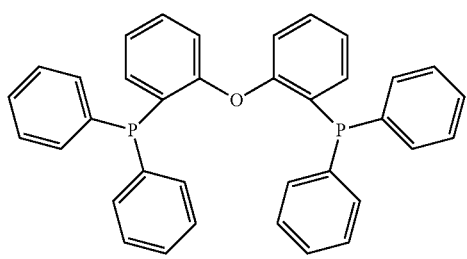
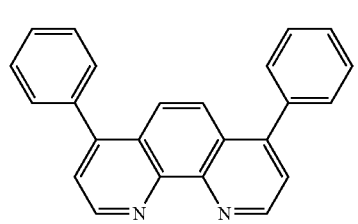
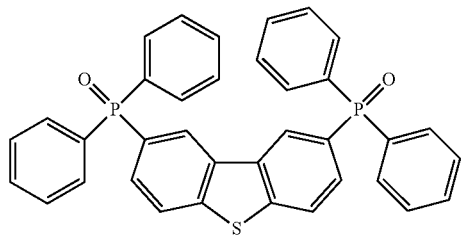

Next, preferred compounds for use as an electron injection material are shown below.

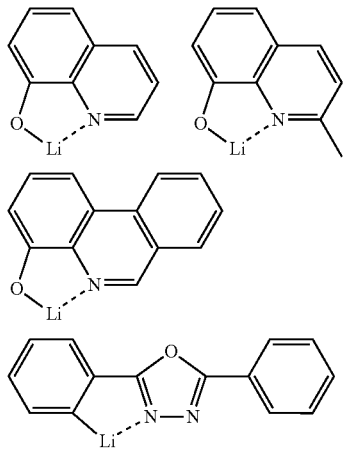

Further, preferred compounds for use as additional materials are mentioned below. For example, these are considered to be added as a stabilization material.

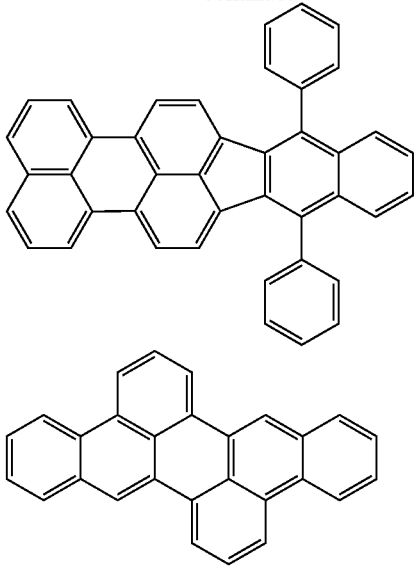

The organic electroluminescent device thus produced by the aforementioned method emits light on application of an electric field between the anode and the cathode of the device. In this case, when the light emission is caused by the excited singlet energy, light having a wavelength that corresponds to the energy level thereof may be confirmed as fluorescent light and delayed fluorescent light. When the light emission is caused by the excited triplet energy, light having a wavelength that corresponds to the energy level thereof may be confirmed as phosphorescent light. The normal fluorescent light has a shorter light emission lifetime than the delayed fluorescent light, and thus the light emission lifetime may be distinguished between the fluorescent light and the delayed fluorescent light.

On the other hand, the phosphorescent light may substantially not be observed with a normal organic compound such as the compound of the present invention at room temperature since the excited triplet energy is converted to heat or the like due to the instability thereof, and is immediately deactivated with a short lifetime. The excited triplet energy of the normal organic compound may be measured by observing light emission under an extremely low temperature condition.

The organic electroluminescent device of the invention may be applied to any of a single device, a structure with plural devices disposed in an array, and a structure having anodes and cathodes disposed in an X-Y matrix. According to the present invention in which the hole transport layer or the electron transport layer is composed of a perovskite layer having a thickness of 50 nm or more, there can be provided an organic light-emitting device having a low drive voltage and having a high power efficiency, and capable of evading interelectrode short-circuiting and current leakage. The organic light-emitting device such as the organic electroluminescent device of the present invention may be applied to a further wide range of purposes. For example, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLES

Hereafter, with reference to Examples, features of the present invention are more specifically described. Materials, details of processes, process steps, and the like as shown below can be changed as appropriate without departing from the spirit of the present invention. Accordingly, the scope of the present invention should not be construed as limited by specific examples as shown below. X-ray diffraction analyses were performed using X-ray diffractometer (Ultima IV, Rigaku), absorption spectroscopy was performed using a UV-Vis-NIR spectrometer (LAMBDA950, Perkin Elmer), emission characteristics were evaluated using a fluorospectrophotometer (FluoroMax-4, Horiba), and organic EL characteristics were evaluated using an external quantum efficiency measuring device (C9920-12, Hamamatsu Photonics) and an organic EL durability evaluation system (EAS-26B, System Engineer). Molecular orientation was evaluated using a molecular orientation measuring system (C14234-01, Hamamatsu Photonics), and an energy level was measured using a photoelectronic spectrometer (AC-3, Riken Keiki) and a low-energy inverse photoemission spectroscope (LE-1, ALS technology).

In these Examples, the vacuum degree in film formation according to a vacuum evaporation method was set at $10^{-4}$ Pa. For evading contamination of an organic film and a metal film with a perovskite-type compound, different vacuum chambers were used in forming a perovskite layer, an organic layer and a metal layer through vapor deposition, and for substrate transfer between vacuum chambers, substrates were transferred therebetween via a passageway kept in vacuum or substrates were kept in individual chambers each filled with nitrogen.

[1] Preliminary Experiment (Experimental Example 1) Evaluation of Crystal Structure and Photoabsorption Characteristic of Perovskite Layer On a quartz substrate, a perovskite layer of $CH_3NH_3PbCl_3$ having a thickness of 50 nm was formed through co-evaporation of methylammonium chloride ($CH_3NH_3Cl$) and lead(II) ($PbCl_2$) chloride from different evaporation sources. At this time, the molar ratio of ammonium chloride and lead(II) chloride was 1/1.

An X-ray diffraction pattern of the formed perovskite layer is shown in FIG. 2, and an absorption spectrum and an emission spectrum thereof are in FIG. 3. The substrate having the perovskite layer formed thereon was left in air at a temperature of 24° C. and at a relative humidity of 50% for 11 days, and the X-ray diffraction pattern and the absorption spectrum of the perovskite layer were measured on day 0, day 1, day 3, day 5, day 7, day 9 and day 11 after the start of leaving it. Thus measured, the X-ray diffraction patterns were drawn on the same scale in FIG. 4, and the absorption spectra were on the same scale in FIG. 5.

The X-ray diffraction pattern of FIG. 2 gives a diffraction peak at a position of 2θ of 15.4°, 31.3° and 47.9°. These diffraction peaks can be attributed to the (100), (200) and (300) lattice planes of the perovskite structure of a cubic crystal system $CH_3NH_3PbCl_3$. Accordingly, it is known that the formed perovskite layer has a good perovskite crystal structure. In addition, as shown in FIG. 3, the formed perovskite layer does not have any substantial absorption in an emission wavelength region of a light-emitting material and is therefore known to be suitable as a layer to be combined with the light-emitting material. Further, alternate-days diffraction patterns shown in FIG. 4 and alternate-days absorption spectra shown in FIG. 5 each are almost the same, from which it is known that the formed perovskite layer has excellent stability in air. Accordingly, it is suggested that, by combining an electrode of, for example, an oxide or a metal and a carrier transport layer formed of perovskite, an organic light-emitting device excellent in air stability can be realized.

(Experimental Example 2) Evaluation of Surface Profile of Perovskite Layer

On a glass substrate with an anode of indium tin oxide (ITO) having a thickness of 100 nm formed thereon, thin films were layered according to a vacuum vapor deposition method to prepare laminate samples 1 to 4.

The laminate sample 1 was prepared by first forming a layer of molybdenum oxide ($MoO_x$: x is an atomic ratio of an oxygen atom, and is 1.5 to 3.0) in a thickness of 10 nm, and then forming thereon a perovskite layer of $CH_3NH_3PbCl_3$ having a thickness of 50 nm by co-evaporation of methylammonium chloride and lead(II) chloride; the laminate sample 2 was prepared by forming, on a laminate prepared in the same manner as that for the laminate sample 1, α-NPD in a thickness of 50 nm; the laminate sample 3 was prepared by forming, on a laminate prepared in the same manner as that for the laminate sample 2, $Alq_3$ in a thickness of 50 nm; the laminate sample 4 was prepared by forming, on a laminate prepared in the same manner as that for the laminate sample 3, a perovskite layer of $CH_3NH_3PbCl_3$ having a thickness of 50 nm by co-evaporation of methylammonium chloride and lead(II) chloride.

The surface of the outermost layer (surface opposite to the glass substrate) of the thus-produced laminate samples 1 to 4 was observed with an atomic force microscope to measure an arithmetic mean roughness $R^a$ and a root mean square roughness $R_q$ thereof, and the data are shown in Table 1.

TABLE 1

| Laminate Sample No. | Layer Configuration | Arithmetic Mean Roughness $R_a$ | Root Mean Square Roughness $R_q$ |
|---|---|---|---|
| Laminate Sample 1 | ITO (100 nm)/$MoO_x$ (10 nm)/ $CH_3NH_3PbCl_3$ (50 nm) | 2.34 nm | 2.20 nm |
| Laminate Sample 2 | ITO (100 nm)/$MoO_x$ (10 nm)/$CH_3NH_3PbCl_3$ (50 nm)/α-NPD (50 nm) | 1.24 nm | 1.59 nm |
| Laminate Sample 3 | ITO (100 nm)/$MoO_x$ (10 nm)/$CH_3NH_3PbCl_3$ (50 nm)/α-NPD (50 nm)/$Alq_3$ (50 nm) | 1.21 nm | 1.61 nm |
| Laminate Sample 4 | ITO (100 nm)/$MoO_x$ (10 nm)/$CH_3NH_3PbCl_3$ (50 nm)/α-NPD (50 nm)/$Alq_3$ (50 nm)/ $CH_3NH_3PbCl_3$ (50 nm) | 2.11 nm | 2.72 nm |

All the laminate samples 1 to 4 did not have any pinhole and had a smooth surface.

Apart from the above-mentioned laminate sample 1, a laminate sample 1a was produced to have the same layer configuration as that of the laminate sample 1, and a laminate sample 1b was produced in the same manner as that for the laminate sample 1a except that the thickness of the perovskite layer was changed to 1000 nm. These laminate samples 1a and 1b were analyzed to measure the root mean square roughness $R_q$ of the perovskite layer thereof. The laminate sample 1a had $R_q$ of 2.2 nm and the laminate sample 1b had $R_q$ of 2.9 nm, from which it is known that the surface smoothness of the samples did not change even though the thickness of the perovskite layer was increased from 50 nm to 1000 nm.

(Experimental Example 3) Evaluation of Carrier Mobility of Perovskite Layer

In the manner mentioned below, a hole transport device to operate for hole transport alone from anode to cathode of carrier transport, and an electron transport device to operate for electron transport alone from cathode to anode were produced.

Production of Hole Transport Device:

First, on a glass substrate with an anode of indium tin oxide (ITO) having a thickness of 100 nm formed thereon, molybdenum oxide ($MoO_x$) was formed in a thickness of 10 nm, and then a perovskite layer of $CH_3NH_3PbCl_3$ having a thickness of 1000 nm was formed by co-evaporation of methylammonium chloride and lead(II) chloride. Next, molybdenum oxide was formed in a thickness of 10 nm, and on this, Al was formed in a thickness of 100 nm to be a cathode. According to the process, a hole transport device 1 was produced.

A hole transport device 2 was produced in the same manner as that for the hole transport device 1 except that the thickness of the perovskite layer was changed to 2000 nm; and a hole transport device 3 was produced in the same manner as that for the hole transport device 1 except that the thickness of the perovskite layer was changed to 3000 nm.

Production of Electron Transport Device:

An electron transport device 1 was produced according to the same production process as that for the hole transport devices, except that cesium (Cs) was formed in a thickness of 0.5 nm between the anode and the perovskite layer and between the perovskite layer and the cathode, in place of forming molybdenum oxide ($MoO_x$).

In addition, an electron transport device 2 was produced in the same manner as that for the electron transport device 1 except that the thickness of the perovskite layer was changed to 2000 nm; and an electron transport device 3 was produced in the same manner as that for the electron transport device 1 except that the thickness of the perovskite layer was changed to 3000 nm.

The materials constituting the hole transport devices and the electron transport devices were analyzed according to photoelectronic spectrometry and low-energy inverse photoemission spectroscopy, and the energy level diagraph thereof is shown in FIGS. 6A and 6B. In FIGS. 6A and 6B, the numerical value for ITO, $MoO_x$, Al, and Cs is a Fermi level; the lower numerical value for $CH_3NH_3PbCl_3$ is an energy level at the valence band end, and the upper numerical value is an energy level at the conduction band end. As shown in FIG. 6A, in the hole transport device, the Fermi level of $MoO_x$ (−5.92 eV) is lower than the valence band end of $CH_3NH_3PbCl_3$ (−5.89 eV), and therefore the molybdenum oxide layer on the anode side functions as a hole injection layer and the molybdenum oxide layer on the cathode side functions as a hole blocking layer, and consequently, holes alone are transported through the device. On the other hand, in the electron transfer device shown in FIG. 6B, the Fermi level of Cs (−1.70 eV) is higher than the conduction band end of $CH_3NH_3PbCl_3$ (−2.71 eV), and therefore the cesium layer on the cathode side functions as an electron injection layer and the cesium layer on the anode side functions as a hole blocking layer, and consequently, electrons alone are transported through the device.

The produced hole transport devices 1 to 3 and the electron transport devices 1 to 3 were driven to measure the current density-voltage characteristic thereof on a double logarithmic chart, and from the current density and the voltage read on the chart and according to the space-charge-limited current equation shown below, the hole mobility pn and the electron mobility p, of the perovskite layer were determined. The results are shown in Tables 2 and 3. In Tables 2 and 3, the hole mobility ph of α-NPD described in Synth. Met. 111-112, 331 (2000) and the electron mobility $\mu_h$ of $Alq_3$ described in Appl. Phys. Lett. 79, 2582 (2001) are shown for reference.

$$J = \frac{9}{8}\varepsilon_r\varepsilon_0\mu\frac{V^2}{L^3}$$

In the equation, J represents a current density, $\varepsilon_r$ represents a dielectric constant of the material, $\varepsilon_0$ represents a dielectric constant in vacuum (8.854×10⁻¹² Fm⁻¹), μ represents a carrier mobility, L represents a thickness of the perovskite layer, V represents an applied voltage. For the dielectric constant $\varepsilon_r$, a literature value of $CH_3NH_3PbCl_3$, 23.9 was used.

TABLE 2

| Hole Transport Device No. | Thickness of Perovskite Layer, L (nm) | Hole Mobility, $\mu_h$ (cm²V⁻¹s⁻¹) |
| --- | --- | --- |
| Hole Transport Device 1 | 1000 | 0.9 |
| Hole Transport Device 2 | 2000 | 1.1 |
| Hole Transport Device 3 | 3000 | 1.3 |
| α-NPD | — | 8.7 × 10⁻⁴ |

TABLE 3

| Electron Transport Device No. | Thickness of L Perovskite Layer, (nm) | Electron Mobility, $\mu_e$ (cm²V⁻¹s⁻¹) |
| --- | --- | --- |
| Electron Transport Device 1 | 1000 | 2.1 |
| Electron Transport Device 2 | 2000 | 2.5 |
| Electron Transport Device 3 | 3000 | 2.9 |
| $Alq_3$ | — | 5.1 × 10⁻⁷ |

As shown in Tables 2 and 3, the hole mobility and the electron mobility of the perovskite layer were dramatically higher than those of α-NPD and Alq$_3$. These data had little dependence on the thickness of the perovskite layer.

The produced hole transport device 1 and the electron transport device 1 were continuously driven at a current density of 50 mA/cm$^2$, and the drive voltage was stable for a long period of time over 1000 hours. Also in continuous driving of the hole transport device 3 and the electron transport device 3 at a current density of 100 mA/cm$^2$, the drive voltage was stable for a long period of time over 1000 hours. This confirms excellent electrochemical stability of the perovskite layer.

(Experimental Example 4) Evaluation of Molecular Orientation of 4CzIPN, and Ir(ppy)$_3$ Here, the molecular orientation of 4CzIPN used as a delayed fluorescent material in the section [2] production and evaluation of organic light-emitting device and Ir(ppy)$_3$ used as a phosphorescent material therein was evaluated.

Specifically, on a quartz substrate, thin films of 4CzIPN and mCBP were co-deposited to prepare a 4CzIPN evaluation sample. In the thin film, the concentration of 4CzIPN was 5% by weight. In addition, on a quartz substrate, thin films of Ir(ppy)$_3$ and mCBP were co-deposited to prepare an Ir(ppy)$_3$ evaluation sample. The concentration of Ir(ppy)$_3$ in the thin film was 8% by weight.

Emission by 365 nm excitation light from the produced evaluation samples was observed at different angles in a range of 0 to 90° to check the angle dependence of emission intensity. The results are shown in FIG. 7. Here, for example, 0° means observation of emission from the vertical direction relative to the substrate surface, and 90° means observation of emission in the in-plane direction of the substrate surface. Under presumption that dipoles are in random orientation, simulation results of angle dependence of emission intensity thereof are shown in FIG. 7.

As shown in FIG. 7, the angle dependence curve of emission intensity from the 4CzIPN evaluation sample and the Ir(ppy)$_3$ evaluation sample well correspond to the simulation curve of the case of random orientation of dipoles. This confirm complete random orientation of 4CzIPN and Ir(ppy)$_3$ in mCBP.

[2] Production and Evaluation of Organic Light-Emitting Device

Example 1

On a glass substrate with an anode of indium tin oxide (ITO) having a thickness of 100 nm formed thereon, thin films were layered according to a vacuum vapor deposition method. First, on ITO, molybdenum oxide (MoO$_x$) was formed in a thickness of 10 nm. Subsequently, methylammonium chloride (CH$_3$NH$_3$Cl) and lead(II) chloride (PbCl$_2$) were co-evaporated from different evaporation sources to form a first perovskite layer of CH$_3$NH$_3$PbCl$_3$ having a thickness of 50 nm as a hole transport layer. At this time, the molar ratio of ammonium chloride and the lead(II) chloride was 1/1. Next, α-NPD was formed in a thickness of 50 nm, and on this, Alq$_3$ was formed in a thickness of 50 nm to be a light-emitting layer. Subsequently, in the same manner as that for the step of forming the first perovskite layer, a second perovskite layer having a thickness of 50 nm was formed as an electron transport layer. Further, cesium (Cs) was formed in a thickness of 0.5 nm, and then aluminum (Al) was formed in a thickness of 100 nm to be a cathode. According to the process, an organic light-emitting device was produced.

Examples 2, 3

Organic light-emitting devices were produced in the same manner as in Example 1 except that the thickness to form the first perovskite layer and the second perovskite layer was changed to 250 nm or 1000 nm.

Comparative Example 1

On the same glass substrate with ITO as that used in Example 1, molybdenum oxide (MoO$_x$) was formed in a thickness of 10 nm, and on this, α-NPD was formed in a thickness 100 nm. Next, Alq$_3$ was formed in a thickness of 100 nm to be an electron transport and light-emitting layer serving both as a light-emitting layer and as an electron transport layer. Next, cesium (Cs) was formed in a thickness of 0.5 nm, and on this, aluminum (Al) was formed in a thickness of 100 nm to be a cathode. According to the process, an organic light-emitting device was produced. Here, of α-NPD formed in a thickness of 100 nm, 50 nm of the part on the side of molybdenum oxide (MoO$_x$) is a layer formed to correspond to the first perovskite layer in Example 1, and of Alq$_3$ formed in a thickness of 100 nm, 50 nm of the part on the side of cesium (Cs) is a layer formed to correspond to the second perovskite layer in Example 1.

Comparative Example 2

An organic light-emitting device was produced in the same manner as in Comparative Example 1 except that the thickness to form α-NPD and Alq$_3$ was changed to 1050 nm. Here, of α-NPD formed in a thickness of 1050 nm, 1000 nm of the part on the side of molybdenum oxide (MoO$_x$) is a layer formed to correspond to the first perovskite layer in Example 2, and of Alq$_3$ formed in a thickness of 1050 nm, 1000 nm of the part on the side of cesium (Cs) is a layer formed to correspond to the second perovskite layer in Example 2.

The layer configurations of the organic light-emitting devices produced in Examples 1 to 3 and Comparative Examples 1 and 2 are shown in Table 4. In Table 4, "/" represents a boundary between neighboring layers, and the parenthesized numerical value is a thickness of each layer. The same shall apply to the following Tables 5 to 7.

TABLE 4

| Example No. | Layer Configuration |
| --- | --- |
| Example 1 | ITO(100 nm)/MoO$_x$(10 nm)/CH$_3$NH$_3$PbCl$_3$(50 nm)/α-NPD(50 nm)/Alq$_3$(50 nm)/CH$_3$NH$_3$PbCl$_3$(50 nm)/Cs(0.5 nm)/Al(100 nm) |
| Example 2 | ITO(100 nm)/MoO$_x$(10 nm)/CH$_3$NH$_3$PbCl$_3$(250 nm)/α-NPD(50 nm)/Alq$_3$(50 nm)/CH$_3$NH$_3$PbCl$_3$(250 nm)/Cs(0.5 nm)/Al(100 nm) |
| Example 3 | ITO(100 nm)/MoO$_x$(10 nm)/CH$_3$NH$_3$PbCl$_3$(1000 nm)/α-NPD(50 nm)/Alq$_3$(50 nm)/CH$_3$NH$_3$PbCl$_3$(1000 nm)/Cs(0.5 nm)/Al(100 nm) |
| Comparative Example 1 | ITO(100 nm)/MoO$_x$(10 nm)/α-NPD(100 nm)/Alq$_3$(100 nm)/Cs(0.5 nm)/Al(100 nm) |
| Comparative Example 2 | ITO(100 nm)/MoO$_x$(10 nm)/α-NPD(1050 nm)/Alq$_3$(1050 nm)/Cs(0.5 nm)/Al(100 nm) |

FIG. 8 shows an energy level diagram of the material of each layer formed in Examples 1 to 3, as measured through photoelectronic spectrometry and low-energy inverse photoemission spectroscopy. In FIG. 8, the numerical value for ITO, MoO$_x$, Al, and Cs is a Fermi level; the lower numerical value for CH$_3$NH$_3$PbCl$_3$ (perovskite) is an energy level at the valence band end, and the upper numerical value is an energy level at the conduction band end; the lower numerical value for α-NPD and Alq$_3$ is an energy level of HOMO (Highest Occupied Molecular Orbital), and the upper numerical value is an energy level of LUMO (Lowest Unoccupied Molecular Orbital).

FIG. 9 shows a current-density-voltage characteristic of the organic light-emitting device produced in Examples 1 to 3 and Comparative Examples 1 and 2. FIG. 10 shows an external quantum efficiency-current density characteristic of the organic light-emitting device produced in Examples 1 to 3 and Comparative Example 1, and FIG. 11 shows a power efficiency-current density characteristic thereof. FIG. 12 shows a brightness change with time in continuous driving at 50 mA/cm$^2$ of the organic light-emitting device produced in Examples 1 to 3 and Comparative Example 1, and FIG. 13 shows a drive voltage change with time thereof. The organic light-emitting devices of Examples 1 to 3 provided green emission derived from Alq$_3$, but the organic light-emitting device of Comparative Example 2 provided no emission, and therefore failed in measurement of the characteristics for FIG. 10 to FIG. 13.

Regarding device characteristics, the organic light-emitting device of Example 2 had a drive voltage at 50 mA/cm$^2$ of 7.3 f 0.2 V and a maximum external quantum efficiency of 0.89 f 0.03%, and took a time of 487 f 47 hours until the brightness reduced to 50% of the initial brightness (50% lifetime). These values each are an average value f standard deviation of the measured values of 39 to 44 devices produced in the same method.

As shown in FIGS. 8, 11 and 13, the organic light-emitting devices of Examples 2 and 3 each having a first perovskite layer and a second perovskite layer exhibited an unexpected effect of attaining a low drive voltage and a high power efficiency though the thickness of each perovskite layer therein was 250 nm or 1000 nm and the layer was thin as compared with that in the organic light-emitting device of Comparative Example 1 where the thickness of α-NPD and Alq$_3$ was 100 nm each.

Before and after continuous driving, the emitted image from each organic light-emitting device was observed with a microscope, and all the devices were free from formation of dark spots and contraction of emitted images in continuous driving and maintained their initial emission characteristics.

The organic light-emitting device produced in Examples 1 and 3 and Comparative Example 1 (FIG. 14A) was driven to measure the emission spectra thereof at different angles with varying the direction at intervals of 5° in a range of 0 to 80°. Here, for example, 0° means that the emission spectrum was measured in the vertical direction relative to the substrate surface, and 80° means that the emission spectrum was measured in a direction tilted by 80° from the vertical direction. FIGS. 14A-14C show emission spectrum of each organic light-emitting device, as measured at different angles and superimposed.

As shown in FIG. 14B, the organic light-emitting device of Example 1 having a first perovskite layer and a second perovskite layer each having a thickness of 50 nm, and the organic light-emitting device of Comparative Example 1 where the thickness of the part corresponding to the first perovskite layer of the α-NPD layer and the thickness of the part corresponding to the second perovskite layer of the Alq$_3$ layer each was 50 nm had angle dependence such that the emission spectra thereof shifted depending on the viewing angle. This is considered to be because, as compared with the light coherent length, the device is thin therefore causing light interference. As opposed to this, from the organic light-emitting device of Example 3 shown in FIG. 14C where the thickness of the first perovskite layer and the second perovskite layer was 1000 nm each, the emission spectra measured at different angles completely overlap with each other, that is, the emission spectrum of the device was free from angle dependence. On the other hand, from the organic light-emitting device of Comparative Example 2 where the thickness of the part corresponding to the first perovskite layer of the α-NPD layer and the thickness of the part corresponding to the second perovskite layer of the Alq$_3$ layer was 1000 nm each, no emission was observed as mentioned above From this, it is known that, when a perovskite layer is used as a hole transport layer or an electron transport layer, angle dependence of emission wavelength can be suppressed by increasing the thickness of the layer, and a highly-practicable organic light-emitting device can be realized from which the same emission color can be visualized at any direction Specifically, the overall thickness of the entire device including a perovskite layer is preferably so selected as not to cause light interference inside the device in consideration of the coherence length of light that depends on the device configuration.

Further, the organic light-emitting device of Example 3 was driven to measure the current-density-voltage characteristic and the emission intensity-voltage characteristic thereof with continuously varying the voltage in the forward direction and the reverse direction. As a result, the device gave the same characteristic curves in the two directions and had little hysteresis.

Example 4

In the same manner as in Example 1, a layer of molybdenum oxide (MoO$_x$) having a thickness of 10 nm and a first perovskite layer having a thickness of 1000 nm were formed in that order on ITO formed on a glass substrate. On the first perovskite layer, Tris-PCz was formed in a thickness of 20 nm to be an electron blocking layer. Next, 4CzIPN and mCBP were co-deposited from different evaporation sources to form a layer having a thickness of 30 nm to be a light-emitting layer. At this time, the concentration of 4CzIPN was 5.0% by weight. Next, T2T was formed in a thickness of 20 nm to be a hole blocking layer, and on this, a second perovskite layer having a thickness of 1000 nm was formed according to the same step of forming the first perovskite layer. Further, cesium (Cs) was formed in a thickness of 0.5 nm, and then aluminum (Al) was formed in a thickness of 100 nm to be a cathode. According to the process, an organic light-emitting device was produced.

Example 5

An organic light-emitting device was produced in the same manner as in Example 4 except that Ir(ppy)$_3$ was used in place of 4CzIPN and the Ir(ppy)$_3$ concentration in the light-emitting layer was 8.0% by weight.

Layer configurations of the organic light-emitting devices produced in Examples 4 and 5 are shown in Table 5.

TABLE 5

| Example No. | Layer Configuration |
|---|---|
| Example 4 | ITO(100 nm)/MoO$_x$(10 nm)/CH$_3$NH$_3$PbCl$_3$(1000 nm)/Tris-PCz(20 nm)/5 wt % 4CzIPN:mCBP(30 nm)/T2T (20 nm)/CH$_3$NH$_3$PbCl$_3$(1000 nm)/Cs(0.5 nm)/Al(100 nm) |
| Example 5 | ITO(100 nm)/MoO$_x$(10 nm)/CH$_3$NH$_3$PbCl$_3$(1000 nm)/Tris-PCz(20 nm)/8 wt % Ir(ppy)$_3$:mCBP(30 nm)/T2T (20 nm)/CH$_3$NH$_3$PbCl$_3$(1000 nm)/Cs(0.5 nm)/Al(100 nm) |

FIG. 15 shows an energy level diagram of the materials constituting the layers formed in Examples 4 and 5, as measured through photoelectronic spectrometry and low-energy inverse photoemission spectroscopy. In FIG. 15, the numerical value for ITO, MoO$_x$, Al, and Cs is a Fermi level; the lower numerical value for CH$_3$NH$_3$PbCl$_3$ is an energy level at the valence band end, and the upper numerical value is an energy level at the conduction band end; the lower numerical value for the other materials is an energy level of HOMO (Highest Occupied Molecular Orbital), and the upper numerical value is an energy level of LUMO (Lowest Unoccupied Molecular Orbital).

FIG. 16 shows a current-density-voltage characteristic of the organic light-emitting devices produced in Examples, and FIG. 17 shows an external quantum efficiency-current density characteristic thereof.

4CzIPN used in Example 4 is a delayed fluorescent material, and Ir(ppy)$_3$ used in Example is a phosphorescent material. As shown in FIGS. 16 and 17, the organic light-emitting devices of Examples 4 and 5 have comparable device characteristics and both have a maximum external quantum efficiency of about 14%. This conforms that a perovskite layer can exert the effect thereof irrespective of the type of the light-emitting material in a light-emitting layer, and that the present invention is therefore applicable to various types of organic light-emitting devices.

FIG. 18A shows an emission spectrum of the organic light-emitting device produced in Example 4, as measured with varying the viewing angle at intervals of 5° between 0 and 80°; and FIG. 18B shows results of an angle dependence of the maximum emission wavelength and an angle dependence of the emission intensity. FIG. 19A shows an emission spectrum of the organic light-emitting device produced in Example 5, as measured with varying the viewing angle at intervals of 5° between 0 and 80°; and FIG. 19B shows results of an angle dependence of the maximum emission wavelength and an angle dependence of the emission intensity. The angle in FIG. 18A and FIG. 19B is an angle to the y-axis in an x-y coordinate where the y-axis is a vertical direction relative to the substrate surface. Specifically, 0° means a vertical direction relative to the substrate surface, and 90° means an in-plane direction of the substrate surface.

In FIG. 18A and FIG. 19A, the emission spectra measured at different angles are superimposed, and in these, the emission spectra completely overlap with each other, and also as shown in FIG. 18B and FIG. 19B, there is no change in the emission wavelength (no change in the emitted color) depending on the angle. On the other hand, it is confirmed that an already-existing light-emitting device formed of thin layers has angle dependence such that the emitted color changes depending on the viewing angle owing to the light interference effect of the layered structure of the device. As opposed to this, the emission wavelength of the organic light-emitting devices of Examples 4 and 5 has no angle dependence, and this means that these light-emitting devices are excellent in practical use, and therefore confirms an additional effect of the present invention.

The organic light-emitting devices of Examples 4 and 5 were driven to measure the time taken until the brightness thereof reached 50% of the initial brightness (drive lifetime) and, as a result, both the two had a practically sufficient drive lifetime, and the drive lifetime thereof was on the same level as that of the organic light-emitting device produced to have a carrier transport material in a thickness of 50 nm. Further, in the system using 4CzIPN (Example 4), the concentration of 4CzIPN in the light-emitting layer was increased up to 15% by weight, and the derive lifetime of the resultant light-emitting device greatly improved.

Comparative Example 3

On the same ITO-having glass substrate as that used in Example 1, thin films were layered according to a vacuum evaporation method. First, on ITO, HAT-CN was formed in a thickness of 50 nm to be a hole transport layer, and on this, α-NPD was formed in a thickness of 50 nm. Next, Alq$_3$ was formed in a thickness of 100 nm to be an electron transport and light-emitting layer serving both as a light-emitting layer and an electron transport layer. Next, cerium (Cs) was formed in a thickness of 0.5 nm, and on this, aluminum (Al) was formed in a thickness of 100 nm to be a cathode. According to the process, an organic light-emitting device was produced.

Comparative Examples 4 and 5

Organic light-emitting devices were produced in the same manner as in Comparative Example 3 except that HAT-CN was formed in a thickness of 250 nm or 1000 nm.

Comparative Example 6

On the same ITO-having glass substrate as that used in Example 1, thin films were layered according to a vacuum evaporation method. First, on ITO, molybdenum oxide (MoO$_x$) was formed in a thickness of 10 nm and on this, α-NPD was formed in a thickness of 100 nm to be a hole transport layer. Next, Alq$_3$ was formed in a thickness of 50 nm to be a light-emitting layer and on this, a benzimidazolyl anthracene compound added with 50% by weight of Liq was formed in a thickness of 50 nm to be an electron transport layer. In this description, the layer of the benzimidazolyl anthracene compound added with 50% by weight of Liq is referred to as ETL. Subsequently, cesium (Cs) was formed in a thickness of 0.5 nm, and on this, aluminum (Al) was formed in a thickness of 100 nm to be a cathode. According to the process, an organic light-emitting device was produced. Here, of α-NPD formed in a thickness of 100 nm, 50 nm of the part on the side of molybdenum oxide (MoO$_x$) is a layer formed to correspond to the first perovskite layer in Example 1.

Comparative Examples 7 and 8

Organic light-emitting devices were produced in the same manner as in Comparative Example 6 except that ETL was formed in a thickness of 250 nm or 1000 nm.

Layer configurations of the organic light-emitting devices produced in Comparative Examples 3 to 8 are shown in Table 6.

TABLE 6

| Comparative Example No. | Layer Configuration |
|---|---|
| Comparative Example 3 | ITO(100 nm)/HAT-CN(50 nm)/α-NPD(50 nm)/Alq$_3$(100 nm)/Cs(0.5 nm)/Al(100 nm) |
| Comparative Example 4 | ITO(100 nm)/HAT-CN(250 nm)/α-NPD(50 nm)/Alq$_3$(100 nm)/Cs(0.5 nm)/Al(100 nm) |
| Comparative Example 5 | ITO(100 nm)/HAT-CN(1000 nm)/α-NPD(50 nm)/Alq$_3$(100 nm)/Cs(0.5 nm)/Al(100 nm) |
| Comparative Example 6 | ITO(100 nm)/MoO$_x$(10 nm)/α-NPD(100 nm)/Alq$_3$(50 nm)/Liq-added LG201(50 nm)/Cs(0.5 nm)/Al(100 nm) |
| Comparative Example 7 | ITO(100 nm)/MoO$_x$(10 nm)/α-NPD(100 nm)/Alq$_3$(50 nm)/Liq-added LG201(250 nm)/Cs(0.5 nm)/Al(100 nm) |
| Comparative Example 8 | ITO(100 nm)/MoO$_x$(10 nm)/α-NPD(100 nm)/Alq$_3$(50 nm)/Liq-added LG201(1000 nm)/Cs(0.5 nm)/Al(100 nm) |

FIG. 20 shows absorption spectra of a HAT-CN layer vapor-deposited in a thickness of 50 nm on a quartz substrate and ETL vapor-deposited in a thickness of 50 nm on a quartz substrate. FIG. 21 shows a current density-voltage characteristic of organic light-emitting devices produced in Comparative Examples 3 to 5, and FIG. 22 shows an external quantum efficiency-current density characteristic thereof. FIG. 23 shows a current density-voltage characteristic of organic light-emitting devices produced in Comparative Examples 6 to 8, and FIG. 24 shows an external quantum efficiency-current density characteristic thereof. In FIGS. 21 and 22, "50", "250" and "1000" each are a thickness of the HAT-CN layer formed in Comparative Examples 3, 4 and 5, and mean the organic light-emitting devices having a HAT-CN layer with the indicated thickness. In FIGS. 23 and 24, "50", "250" and "1000" each are a thickness of ETL formed in Comparative Examples 6, 7 and 8, and mean the organic light-emitting devices having ETL with the indicated thickness. FIG. 25 shows results drawn by plotting a voltage at 50 mA-cm$^2$ of organic light-emitting devices produced in Examples 1 to 3 and Comparative Examples 3 to 8, relative to the total thickness of the first perovskite layer and the second perovskite layer, the thickness of the HAT-CN layer or the thickness of ETL, and FIG. 26 shows results drawn by plotting a maximum external quantum efficiency thereof relative to the total thickness of the first perovskite layer and the second perovskite layer, the thickness of the HAT-CN layer or the thickness of ETL. In FIGS. 25 and 26, the plotted chart shown by "CH$_3$NH$_3$C$_1$" is a chart drawn by plotting the measured values of the organic light-emitting devices of Examples 1 to 3; the plotted chart shown by "HAT-CN" is a chart drawn by plotting the measured values of the organic light-emitting devices of Comparative Examples 3 to 5; and the plotted chart shown by "ETL" is a chart drawn by plotting the measured values of the organic light-emitting devices of Comparative Examples 6 to 8.

As shown by FIGS. 25 and 26, the organic light-emitting devices having a CH$_3$NH$_3$PbCl$_3$ layer as a hole transport layer and an electron transport layer can maintain a low drive voltage and a high external quantum efficiency even though the thickness of the CH$_3$NH$_3$PbCl$_3$ layer is increased from 50 nm to 1000 nm (from 100 nm to 2000 nm in total), and were almost free from change in device performance depending on the thickness of the layer. As opposed to these, the organic light-emitting device having a HAT-CN layer as a hole transport layer can emit light when the thickness of the HAT-CN layer is 1000 nm, but increase in the drive voltage and decrease in the external quantum efficiency depending on the thickness of the HAT-CN layer of the device was larger than that of the devices having a CH$_3$NH$_3$PbCl$_3$ layer. Of the organic light-emitting device having ETL as an electron transport layer, the drive voltage greatly increased depending on the thickness of ETL therein and the external quantum efficiency thereof greatly decreased, and when the thickness of ETL is 1000 nm therein, the device could no more emit light. From the results, it is known that using a perovskite layer provides a possibility of mass-producing a large amount of organic light-emitting devices with little performance fluctuation on an industrial scale, and in this point, a perovskite layer is far advantageous than any other carrier transport materials. Organic light-emitting devices having a HAT-CN layer as a hole transport layer were investigated in more detail and, as a result, it was confirmed that organic light-emitting devices having a HAT-CN layer with a thickness of 10 nm or more, preferably 20 nm or more, more preferably 50 nm or more can emit light. The upper limit of the thickness of the HAT-CN layer is not specifically limited, but is preferably 2000 nm.

Example 6

An organic light-emitting device having a thickness of the first perovskite layer and the second perovskite layer of 1000 nm was produced in the same manner as in Example 3 except that the film forming speed for CH$_3$NH$_3$PbCl$_3$ was changed to 0.2 nm/s or 1.0 nm/s.

Example 7

An organic light-emitting device was produced in the same manner as in Example 3 except that, in place of the CH$_3$NH$_3$PbCl$_3$ layer, a CsSnCl$_3$ layer having a thickness of 1000 nm was formed as the first perovskite layer (hole transport layer) and the second perovskite layer (electron transport layer). Here, the CsSnCl$_3$ layer was formed through co-evaporation of cesium chloride CsCl and tin chloride SnCl$_2$ from different evaporation sources. The molar ratio of cesium chloride and tin chloride was 1/1, and the film forming speed was 0.2 nm/s.

Layer configurations of the organic light-emitting devices produced in Examples 6 and 7 are shown in Table 7.

TABLE 7

| Example No. | Layer Configuration |
|---|---|
| Example 6 | ITO(100 nm)/MoO$_x$(10 nm)/CH$_3$NH$_3$PbCl$_3$(1000 nm)/α-NPD(50 nm)/Alq$_3$(50 nm)/CH$_3$NH$_3$PbCl$_3$(1000 nm)/Cs(0.5 nm)/Al(100 nm) |
| Example 7 | ITO(100 nm)/MoO$_x$(10 nm)/CsSnCl$_3$(1000 nm)/α-NPD(50 nm)/Alq$_3$(50 nm)/CsSnCl$_3$(1000 nm)/Cs(0.5 nm)/Al(100 nm) |

First, as a preliminary experiment for Example 7, a CsSnCl$_3$ layer formed in a thickness of 50 nm through vapor deposition on a quartz substrate was analyzed to measure the X-ray diffraction pattern and the absorption spectrum thereof. FIG. 27 shows the X-ray diffraction pattern, and FIG. 28 shows the absorption spectrum. The X-ray diffraction pattern of FIG. 27 showed diffraction peaks at a position 2θ of 14.8° and 29.6°. These diffraction peaks attribute to the lattice planes (002) and (004) of a monoclinic CsSnCl$_3$ perovskite structure. Accordingly, it is known that the formed CsSnCl$_3$ layer had a good perovskite crystal structure. As in FIG. 28, the formed CsSnCl$_3$ layer had little absorption in a visible region, and is known to be favorable as a layer to be combined with a light-emitting layer. On an ITO layer formed in a thickness of 100 nm on a glass substrate, a molybdenum oxide layer having a thickness of 10 nm and a CsSnCl$_3$ layer having a thickness of 1000 nm were formed, and a root mean square roughness of the surface thereof was measured, and was about 3.3 nm, that is, the surface was smooth.

Next, FIG. 29 shows a current density-voltage characteristic of the organic light-emitting devices produced in Examples 6 and 8; and FIG. 30 shows an external quantum efficiency-current density characteristic thereof.

As in FIGS. 29 and 30, the organic light-emitting device having, as formed therein, a CH$_3$NH$_3$PbCl$_3$ layer at 1.0 nm/s had device characteristics comparable to those of the organic light-emitting device having, as formed therein, a CH$_3$NH$_3$PbCl$_3$ layer at 0.2 nm/s. From this, it is known that the film forming speed for a CH$_3$NH$_3$PbCl$_3$ layer can be increased up to 1.0 nm/s for reduction in production time and cost. The organic light-emitting device having a CsSnCl$_3$ layer in a thickness of 1000 nm also had device characteristics comparable to those of the organic light-emitting device having, as formed therein, a CH$_3$NH$_3$PbCl$_3$ layer in a thickness of 1000 nm. From this, it is known that a CsSnCl$_3$ layer also has a carrier transport performance comparable to that of a CH$_3$NH$_3$PbCl$_3$ layer, and therefore can realize a lead-free perovskite-type organic light-emitting device. CH$_3$NH$_3$Cl used as an evaporation source of the CH$_3$NH$_3$PbCl$_3$ layer is highly volatile and evaporation control thereof is difficult, but CsCl for use for the CsSnCl$_3$ layer is relatively poorly volatile, and evaporation control thereof is easy. This confirms that using a CsSnCl$_3$ layer as a carrier transport layer has another advantage of simplifying the vapor deposition step for the layer.

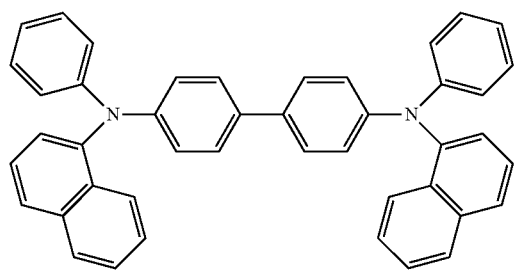

α-NPD

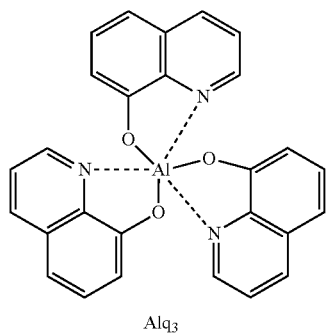

Alq$_3$

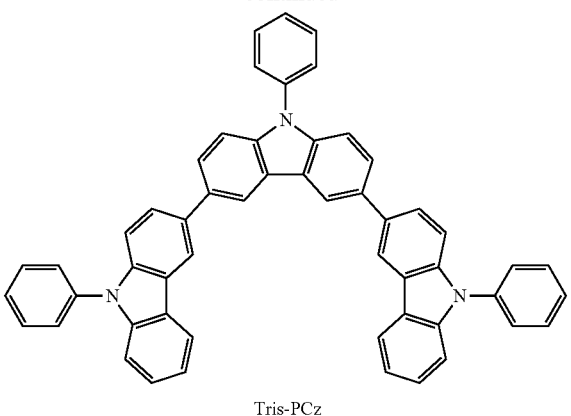

Tris-PCz

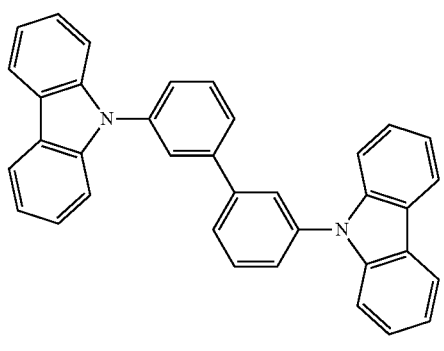

mCBP

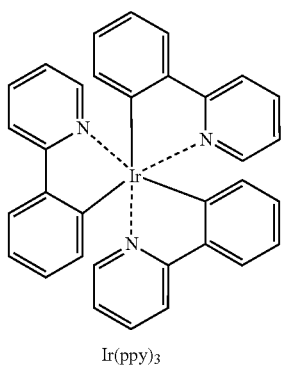

Ir(ppy)$_3$

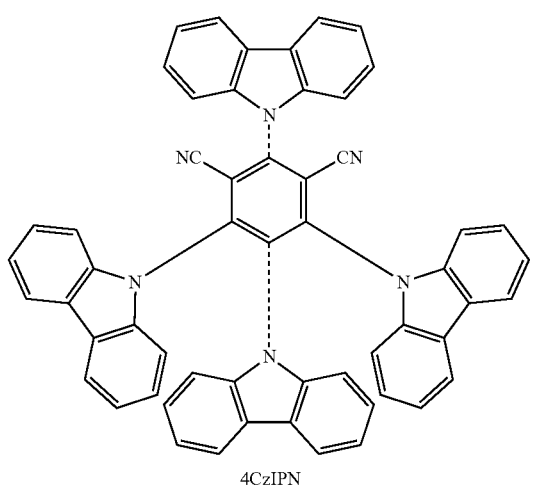

4CzIPN

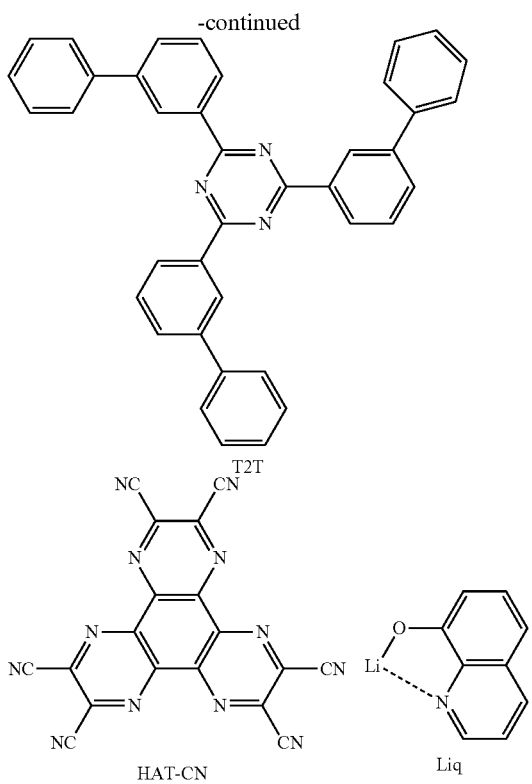

INDUSTRIAL APPLICABILITY

The organic light-emitting device of the present invention has a low drive voltage and a high power efficiency, and while securing such characteristics, can suppress interelectrode short-circuiting and current leakage by thickening the perovskite layer therein. Therefore according to the present invention, a highly-practicable organic light-emitting device can be produced at a high production yield, and the present invention greatly contributes toward reduction in the production cost of organic light-emitting devices. Accordingly, the industrial applicability of the present invention is high.

REFERENCE SIGNS LIST

1 Substrate
2 Anode
3 Hole Injection Layer
4 First Perovskite Layer
5 Light-Emitting Layer
6 Second Perovskite Layer
7 Electron Injection Layer
8 Cathode

The invention claimed is:

1. A method for improving light-emission from an organic light-emitting device having at least one perovskite layer, comprising:
    forming an anode,
    forming a light-emitting layer,
    forming the at least one perovskite layer so that a total thickness of the at least one perovskite layer is 3000 nm or more, the layer comprising a perovskite-type compound represented by the following general formula (4):

$$A^3BX_3 \qquad (4)$$

wherein $A^3$ represents an organic cation, B represents a divalent metal ion, X represents a halogen ion, and three X's may be the same as or different from each other, and
    forming a cathode,
    wherein the method suppresses angle dependency of the organic light-emitting device.

2. The method for improving light-emission according to claim 1, wherein the at least one perovskite layer has carrier mobility of from $10^{-2}$ to $10^3$ $cm^2V^{-1}s^{-1}$.

3. The method for improving light-emission according to claim 1, wherein the at least one perovskite layer does not have a maximum absorption wavelength in an emission wavelength range of the light-emitting layer.

4. The method for improving light-emission according to claim 1, wherein the at least one perovskite layer comprises a perovskite layer between the anode and the light-emitting layer.

5. The method for improving light-emission according to claim 1, wherein the at least one perovskite layer comprises a perovskite layer between the light-emitting layer and the cathode.

6. The method for improving light-emission according to claim 1, wherein the at least one perovskite layer consists of a first perovskite layer and a second perovskite layer, and the organic light-emitting device has the anode, the light-emitting layer, the cathode, the first perovskite layer between the anode and the light-emitting layer, and the second perovskite layer between the light-emitting layer and the cathode, and the method comprises:
    forming an anode,
    forming the first perovskite layer so that a thickness of the first perovskite layer is 1000 nm or more, the layer comprising a perovskite-type compound represented by the following general formula (4):

$$A^3BX_3 \qquad (4)$$

wherein $A^3$ represents an organic cation, B represents a divalent metal ion, X represents a halogen ion, and three X's may be the same as or different from each other, and
    forming a light-emitting layer,
    forming the second perovskite layer so that a thickness of the second perovskite layer is 1000 nm or more and the total thickness of the first perovskite layer and the second perovskite layer is 3000 nm or more, the layer comprising a perovskite-type compound represented by the following general formula (4):

$$A^3BX_3 \qquad (4)$$

wherein $A^3$ represents an organic cation, B represents a divalent metal ion, X represents a halogen ion, and three X's may be the same as or different from each other, and
    forming a cathode.

7. The method for improving light-emission according to claim 6, further comprising:
    forming a hole injection layer between the anode and the first perovskite layer, and
    forming an electron injection layer between the second perovskite layer and the cathode.

8. The method for improving light-emission according to claim 7, further comprising:
    forming an electron blocking layer between the first perovskite layer and the light-emitting layer.

9. The method for improving light-emission according to claim 8, further comprising:
forming a hole blocking layer between the light-emitting layer and the second perovskite layer.

10. The method for improving light-emission according to claim 1, wherein the total thickness of the at least one perovskite layer is 3000 nm.

11. A method for improving light-emission from an organic light-emitting device having an anode, a light-emitting layer, at least one perovskite layer and a cathode, wherein:
all of the at least one perovskite layer comprise a perovskite-type compound represented by the following general formula (4):

$$A^3BX_3 \qquad (4)$$

wherein $A^3$ represents an organic cation, B represents a divalent metal ion, X represents a halogen ion, and three X's may be the same as or different from each other, and
the method comprises forming the at least one perovskite layer so that a total thickness of the at least one perovskite layer is 3000 nm or more whereby angle dependency of the organic light-emitting device is suppressed.

12. The method for improving light-emission according to claim 11, wherein:
the organic light-emitting device has the anode, a hole injection layer, the light-emitting layer, an electron injection layer, the cathode, and the at least one perovskite layer comprising at least one of a perovskite layer between the hole injection layer and the light-emitting layer and a perovskite layer between the light-emitting layer and the electron injection layer.

13. The method for improving light-emission according to claim 11, wherein:
the at least one perovskite layer consists of a first perovskite layer between the anode and the light-emitting layer, and a second perovskite layer between the light-emitting layer and the cathode, each comprising a perovskite-type compound represented by the general formula (4), and
the method comprises forming the first perovskite layer so that a thickness of the first perovskite layer is 1000 nm or more and forming the second perovskite layer so that a thickness of the second perovskite layer is 1000 nm or more, and the total thickness of the first perovskite layer and the second perovskite layer is 3000 nm or more.

14. The method for improving light-emission according to claim 13, wherein:
the organic light-emitting device has the anode, a hole injection layer, the light-emitting layer, an electron injection layer, the cathode, the first perovskite layer between the hole injection layer and the light-emitting layer, and the second perovskite layer between the light-emitting layer and the electron injection layer.

15. The method for improving light-emission according to claim 14, wherein:
the organic light-emitting device has the anode, the hole injection layer, an electron blocking layer, the light-emitting layer, the electron injection layer, the cathode, the first perovskite layer between the hole injection layer and the electron blocking layer, and the second perovskite layer between the light-emitting layer and the electron injection layer.

16. The method for improving light-emission according to claim 15, wherein:
the organic light-emitting device has the anode, the hole injection layer, the electron blocking layer, the light-emitting layer, a hole blocking layer, the electron injection layer, the cathode, the first perovskite layer between the hole injection layer and the electron blocking layer, and the second perovskite layer between the hole blocking layer and the electron injection layer.

* * * * *